US010136090B2

(12) United States Patent
Vogelsang et al.

(10) Patent No.: US 10,136,090 B2
(45) Date of Patent: Nov. 20, 2018

(54) THRESHOLD-MONITORING, CONDITIONAL-RESET IMAGE SENSOR

(71) Applicant: Rambus Inc., Sunnyvale, CA (US)

(72) Inventors: Thomas Vogelsang, Mountain View, CA (US); Michael Guidash, Rochester, NY (US); Song Xue, San Jose, CA (US); Maxim Smirnov, Wilsonville, OR (US); Craig M. Smith, Spencerport, NY (US); Jay Endsley, San Jose, CA (US); James E. Harris, San Jose, CA (US)

(73) Assignee: Rambus Inc., Sunnyvale, CA (US)

(*) Notice: Subject to any disclaimer, the term of this patent is extended or adjusted under 35 U.S.C. 154(b) by 165 days.

(21) Appl. No.: 14/772,311

(22) PCT Filed: Mar. 14, 2014

(86) PCT No.: PCT/US2014/028780
§ 371 (c)(1),
(2) Date: Sep. 2, 2015

(87) PCT Pub. No.: WO2014/144391
PCT Pub. Date: Sep. 18, 2014

(65) Prior Publication Data
US 2016/0028985 A1  Jan. 28, 2016

Related U.S. Application Data

(60) Provisional application No. 61/790,368, filed on Mar. 15, 2013.

(51) Int. Cl.
*H04N 5/225* (2006.01)
*H04N 5/3745* (2011.01)
(Continued)

(52) U.S. Cl.
CPC ..... *H04N 5/3745* (2013.01); *H01L 27/14634* (2013.01); *H01L 27/14641* (2013.01); *H04N 5/347* (2013.01); *H04N 5/376* (2013.01)

(58) Field of Classification Search
CPC .................................................. H04N 5/3745
See application file for complete search history.

(56) References Cited

U.S. PATENT DOCUMENTS 7,616,243 B2  11/2009  Kozlowski
8,134,624 B2   3/2012  Solhusvik et al.
(Continued)

FOREIGN PATENT DOCUMENTS

EP   0856989 A2    8/1998
GB   2454744 A     5/2009
JP   2005-175517 A 6/2005

OTHER PUBLICATIONS

PCT International Search Report and Written Opinion dated Sep. 1, 2014 in International Application No. PCT/US2014/028780. 14 pages.
(Continued)

Primary Examiner — Twyler L Haskins
Assistant Examiner — Dwight Alex C Tejano
(74) Attorney, Agent, or Firm — Charles Shemwell

(57) ABSTRACT

An image sensor architecture with multi-bit sampling is implemented within an image sensor system. A pixel signal produced in response to light incident upon a photosensitive element is converted to a multiple-bit digital value representative of the pixel signal. If the pixel signal exceeds a sampling threshold, the photosensitive element is reset. During an image capture period, digital values associated with pixel signals that exceed a sampling threshold are accumulated into image data.

17 Claims, 30 Drawing Sheets

(51) Int. Cl.
*H01L 27/146* (2006.01)
*H04N 5/347* (2011.01)
*H04N 5/376* (2011.01)

(56) References Cited

U.S. PATENT DOCUMENTS

| | | | |
|---|---|---|---|
| 8,144,215 B2 | 3/2012 | Lin | |
| 8,159,587 B2 | 4/2012 | Deschamps et al. | |
| 8,179,460 B2 | 5/2012 | Huggett et al. | |
| 8,179,464 B2 | 5/2012 | Schemmann et al. | |
| 9,426,395 B2* | 8/2016 | Jakobson | H04N 5/3651 |
| 2007/0064129 A1 | 3/2007 | Suzuki | |
| 2009/0059044 A1 | 3/2009 | Tay | |
| 2009/0101796 A1* | 4/2009 | Ladd | H04N 5/235 |
| | | | 250/206 |
| 2009/0174799 A1* | 7/2009 | Lee | H04N 5/3594 |
| | | | 348/294 |
| 2010/0002094 A1* | 1/2010 | Solhusvik | H04N 5/2355 |
| | | | 348/230.1 |
| 2010/0177226 A1 | 7/2010 | Itonaga et al. | |
| 2010/0188540 A1 | 7/2010 | Bechtel et al. | |
| 2011/0013040 A1 | 1/2011 | Han et al. | |
| 2011/0316839 A1* | 12/2011 | Minowa | H01L 27/14609 |
| | | | 345/211 |
| 2012/0235021 A1* | 9/2012 | Kasai | H04N 5/35527 |
| | | | 250/208.1 |
| 2012/0307121 A1 | 12/2012 | Lu et al. | |
| 2014/0002705 A1* | 1/2014 | Deschamps | H04N 5/335 |
| | | | 348/308 |

OTHER PUBLICATIONS

PCT invitation to Pay and Partial Search Report dated Jun. 30, 2014 in International Application No. PCT/US14/028780. 5 pages.
PCT IPRP dated Sep. 24, 2015 Application No. PCT/US2014/028780. 10 Pages.
CN Office Action dated Jan. 12, 2018 re: CN Appln. No. 201480015633.8. 20 Pages. (With Translation).
EP Response Filed Feb. 2, 2018 in Response to the Official Communication Pursuant to Article 94(3) EPC dated Jul. 25, 2017 re: EP Appln. No. 14726239.8. 24 Pages.
Bogaerts, Jan et al., "High speed 36 Gbps 12Mpixel global pipelined shutter CMOS image sensor with CDS," 2011 International Image Sensor Workshop, Jun. 8-11, 2011, Paper No. R60. Available for download at: http://www.imagesensors.org/Past%20Workshops/2011%20Workshop/2011%20Papers/R60_Bogaerts_36Gbps.pdf 4 pages.
EP Communication Pursuant to Article 94(3) EPC dated Jul. 25, 2017 re: EP Appln. No. 14726239.8. 8 Pages.
JP Office Action dated Dec. 11, 2017 re: JP Appln. No. 2016-502895. 11 Pages. (With Translation).

* cited by examiner

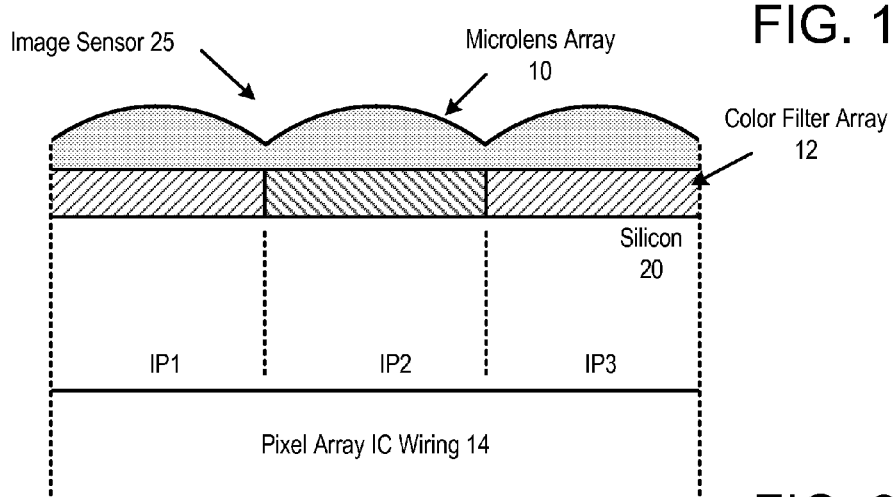
FIG. 1
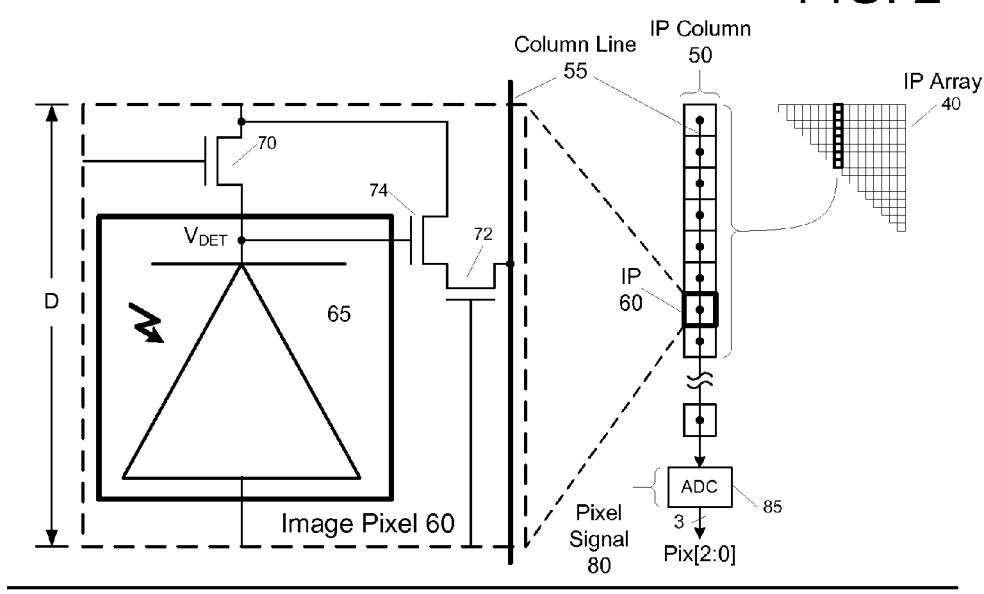
FIG. 2
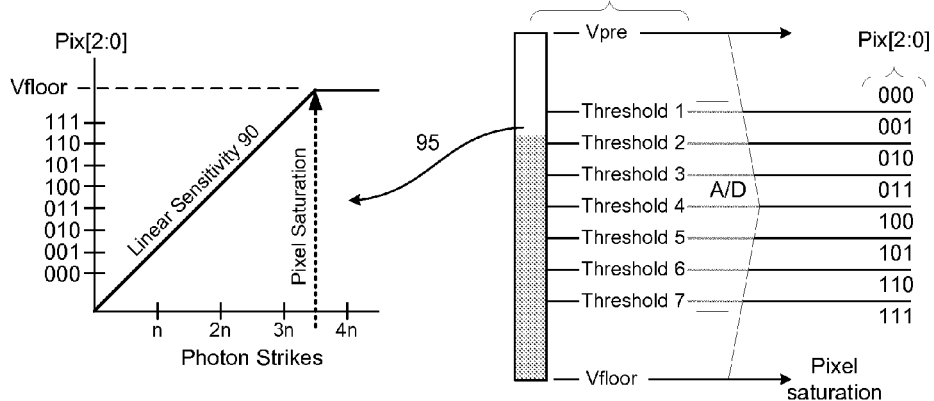

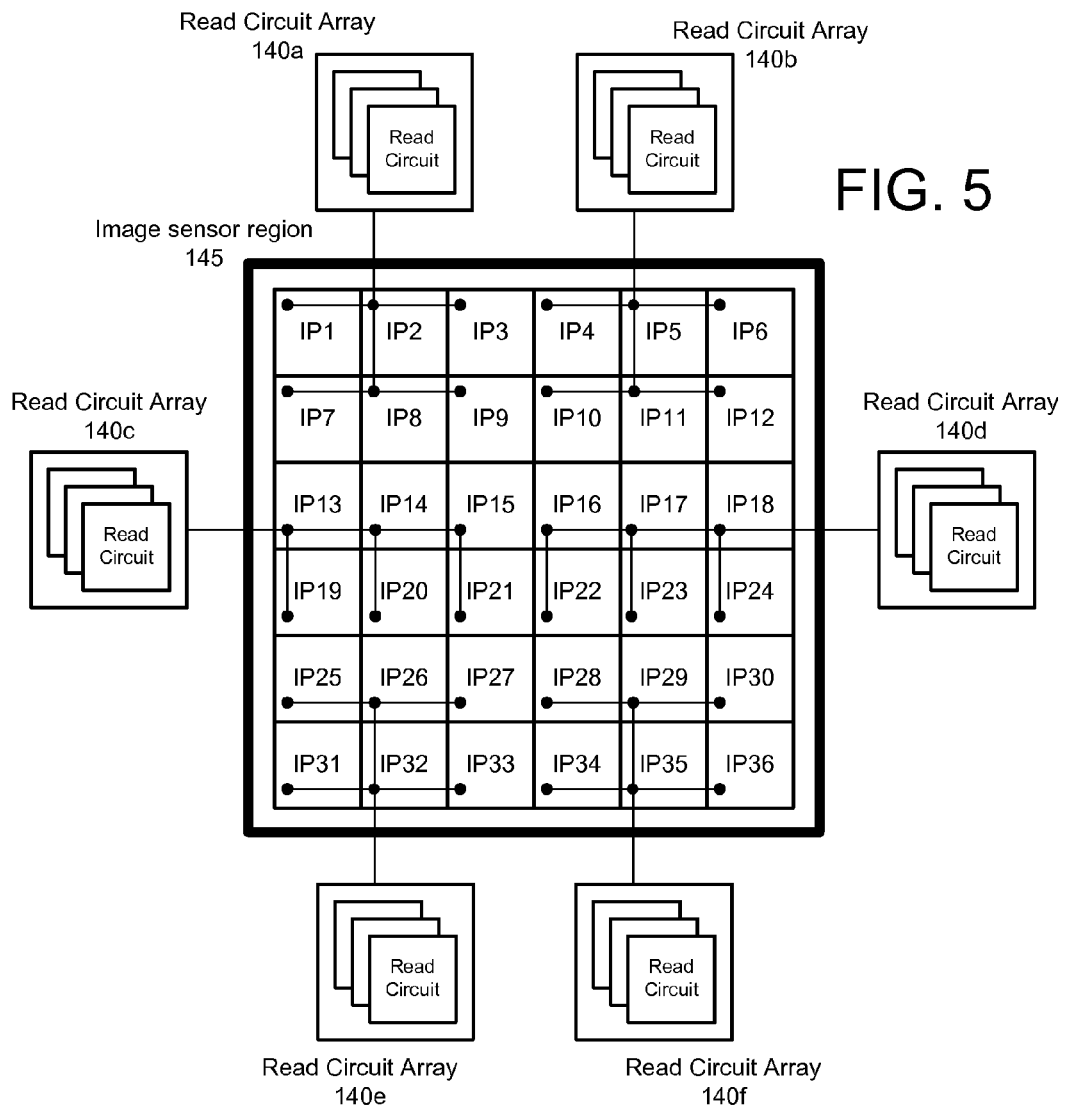

| Control | Sampling interval | Photons (det. - accum.) | Threshold met? | ADC value | Memory Element |
|---|---|---|---|---|---|
| Begin exposure, Threshold = 20 | 0 | N/A | N/A | X X X X X | X X X X X X X X X |
| | 1 | 4 - 4 | n | 0 0 1 0 0 | 0 0 0 0 0 0 0 0 0 |
| | 2 | 7 - 11 | n | 0 1 0 1 1 | 0 0 0 0 0 0 0 0 0 |
| | 3 | 2 - 13 | n | 0 1 1 0 1 | 0 0 0 0 0 0 0 0 0 |
| | 4 | 11 - 24 | y | 1 1 0 0 0 →| 0 0 0 0 1 1 0 0 0 |
| | 5 | 14 - 14 | n | 0 1 1 1 0 | 0 0 0 0 1 1 0 0 0 |
| | 6 | 8 - 22 | y | 1 0 1 1 0 →| 0 0 0 1 0 1 1 1 0 |
| | 7 | 4 - 4 | n | 0 0 1 0 0 | 0 0 0 1 0 1 1 1 0 |
| | 8 | 0 - 4 | n | 0 0 1 0 0 | 0 0 0 1 0 1 1 1 0 |
| | 9 | 6 - 10 | n | 0 1 0 1 0 | 0 0 0 1 0 1 1 1 0 |
| | 10 | 13 - 23 | y | 1 0 1 1 1 →| 0 0 1 0 0 0 1 0 1 |
| | 11 | 1 - 1 | n | 0 0 0 0 1 | 0 0 1 0 0 0 1 0 1 |
| | 12 | 2 - 3 | n | 0 0 0 1 1 | 0 0 1 0 0 0 1 0 1 |
| | 13 | 12 - 15 | n | 0 1 1 1 1 | 0 0 1 0 0 0 1 0 1 |
| | 14 | 13 - 28 | y | 1 1 1 0 0 →| 0 0 1 1 0 0 0 0 1 |
| | 15 | 26 - 26 | y | 1 1 0 1 0 →| 0 0 1 1 1 1 0 1 1 |
| Reset, Residue | 16 | 19 - 19 | n | 1 0 0 1 1,→| 0 1 0 0 0 1 1 1 0 |

Residue 190    Image data 195

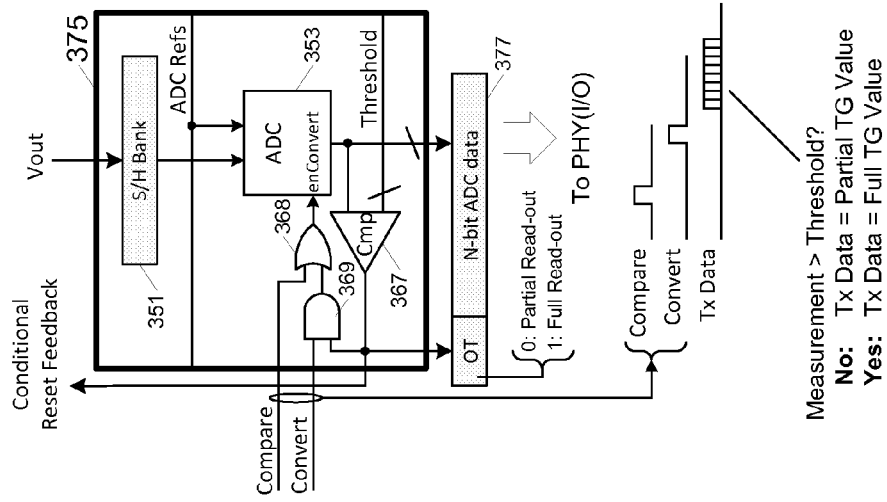
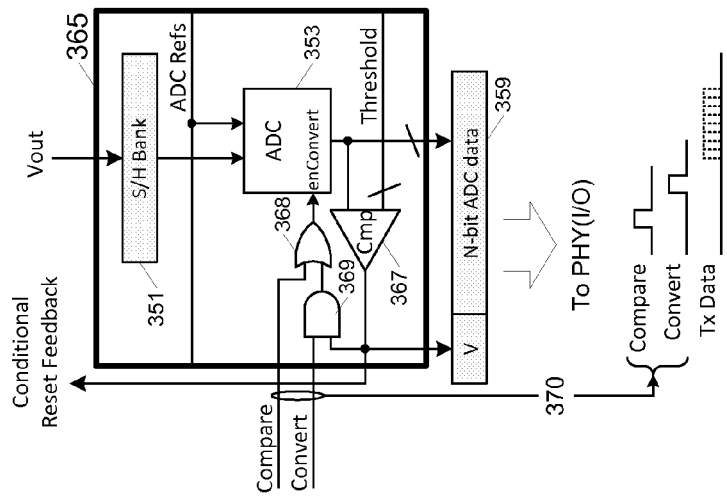
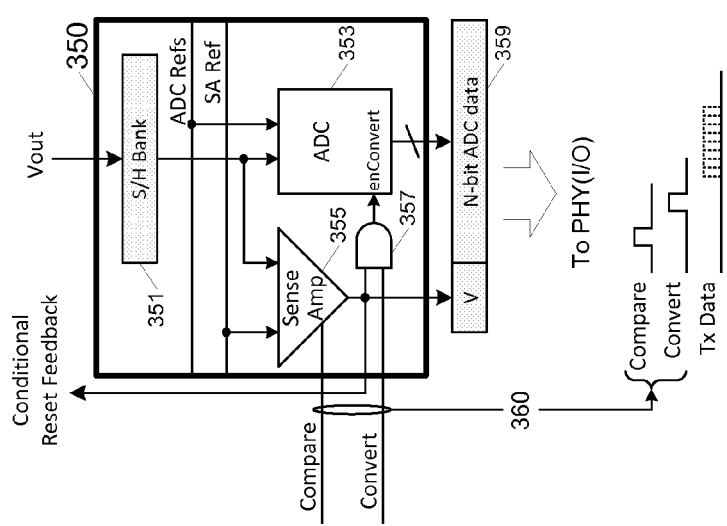

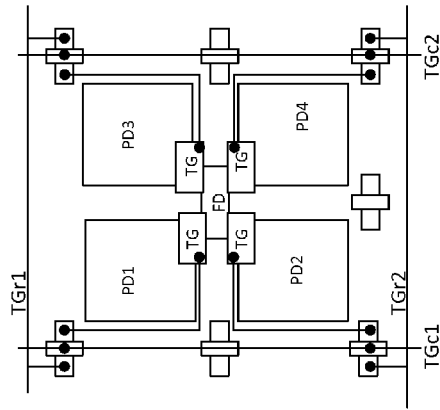
FIG. 17
FIG. 18A
FIG. 18B
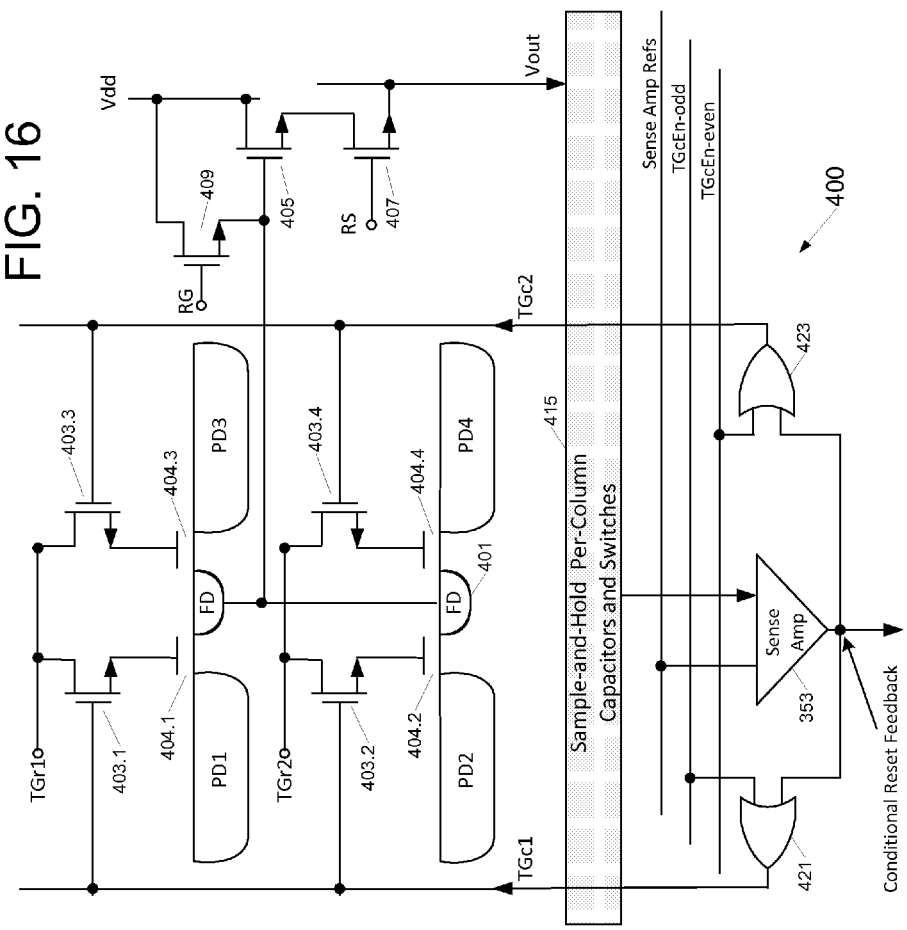
FIG. 16

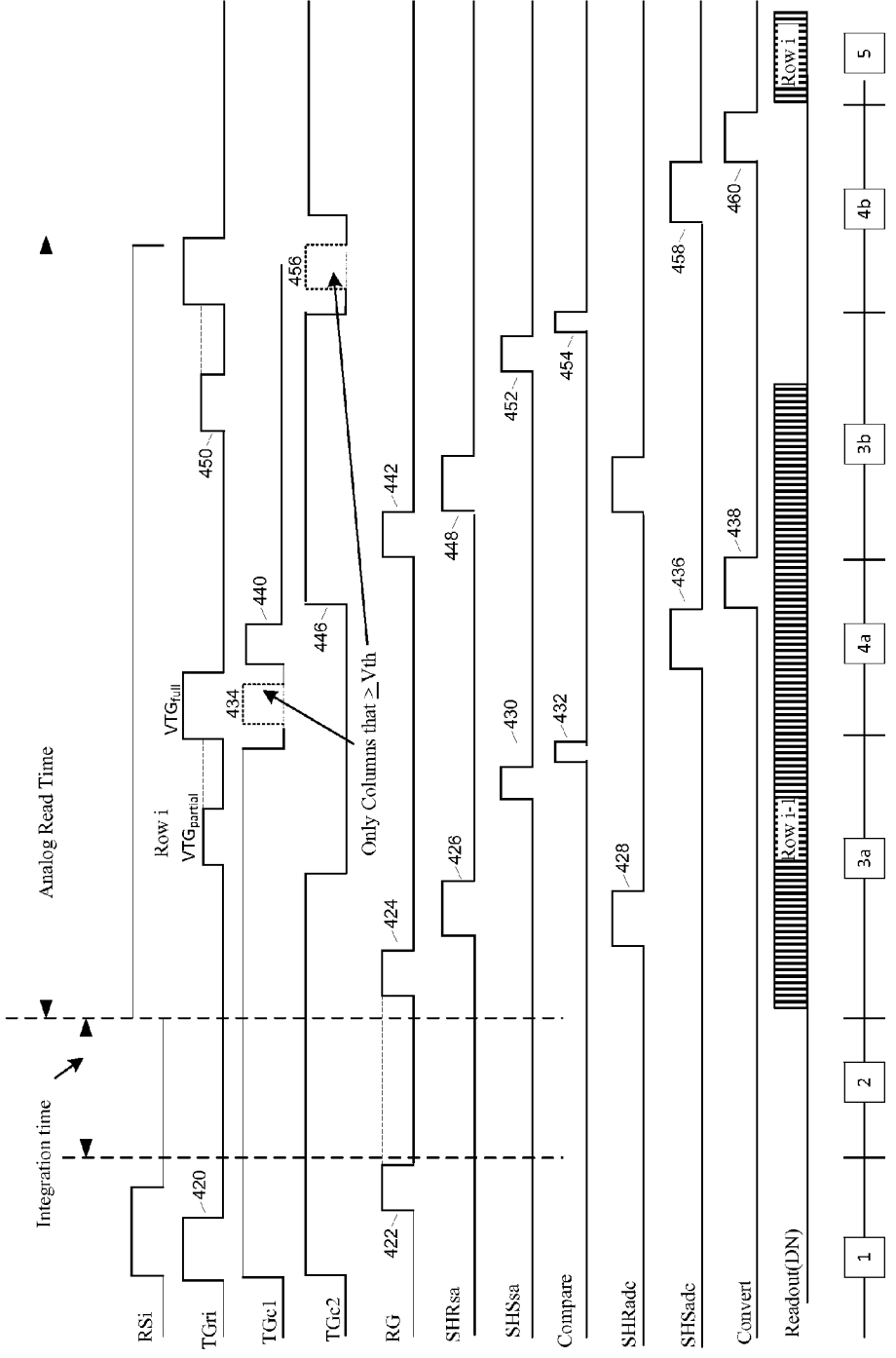

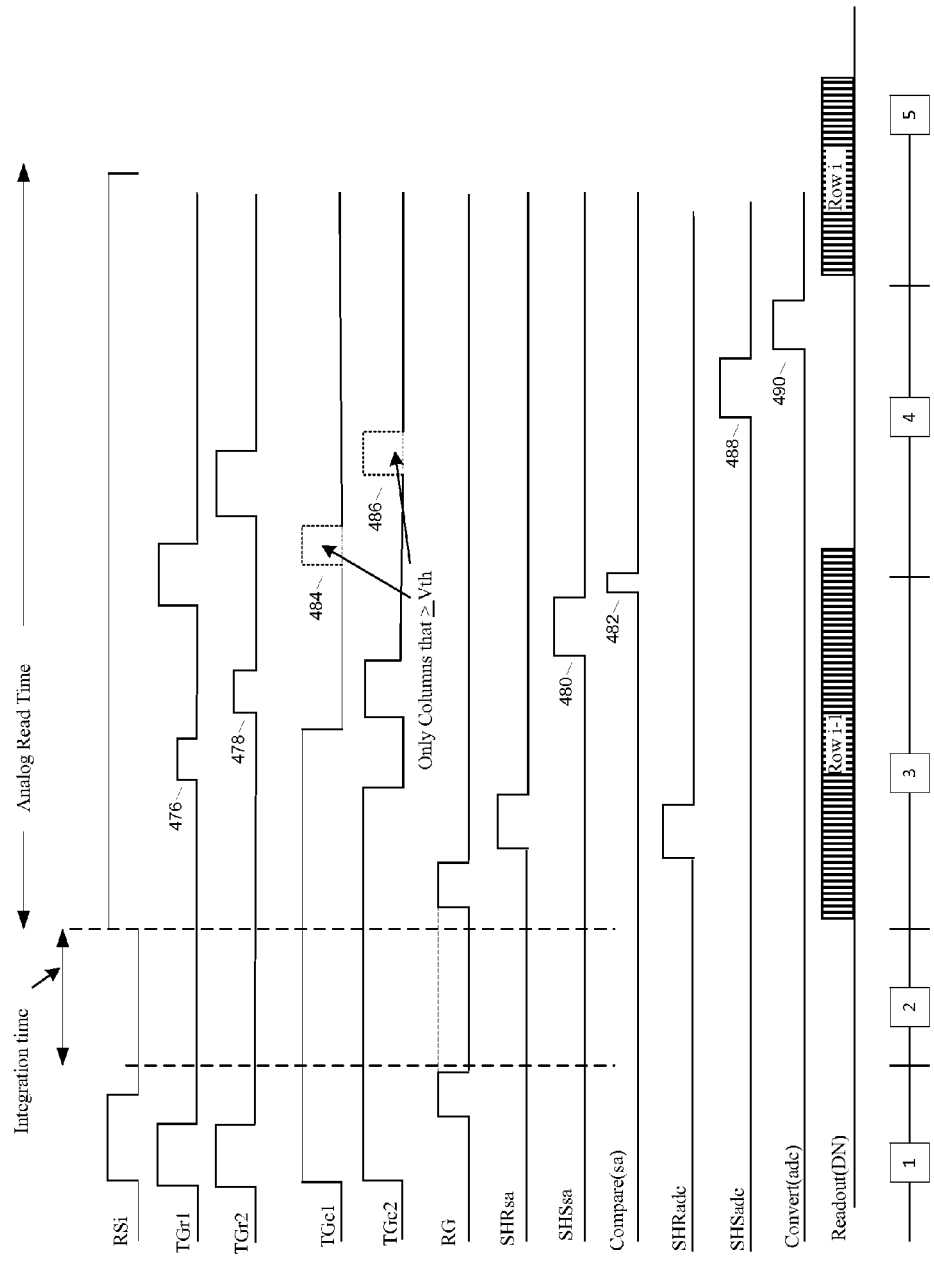
FIG. 20 Decimated (Binned) Read-Out

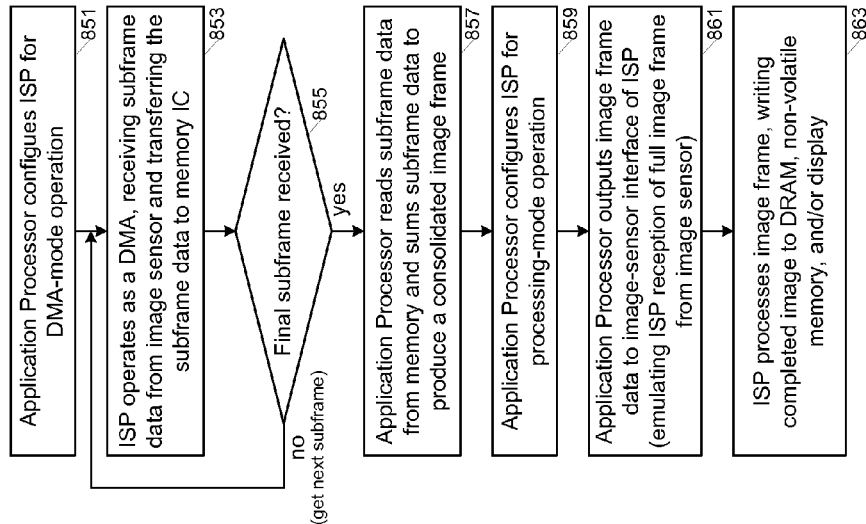
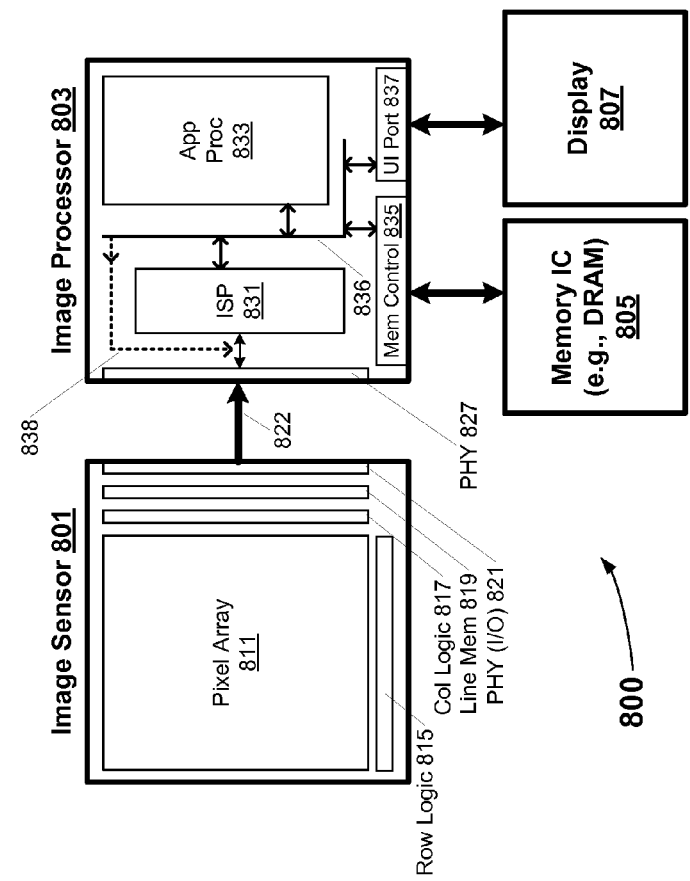

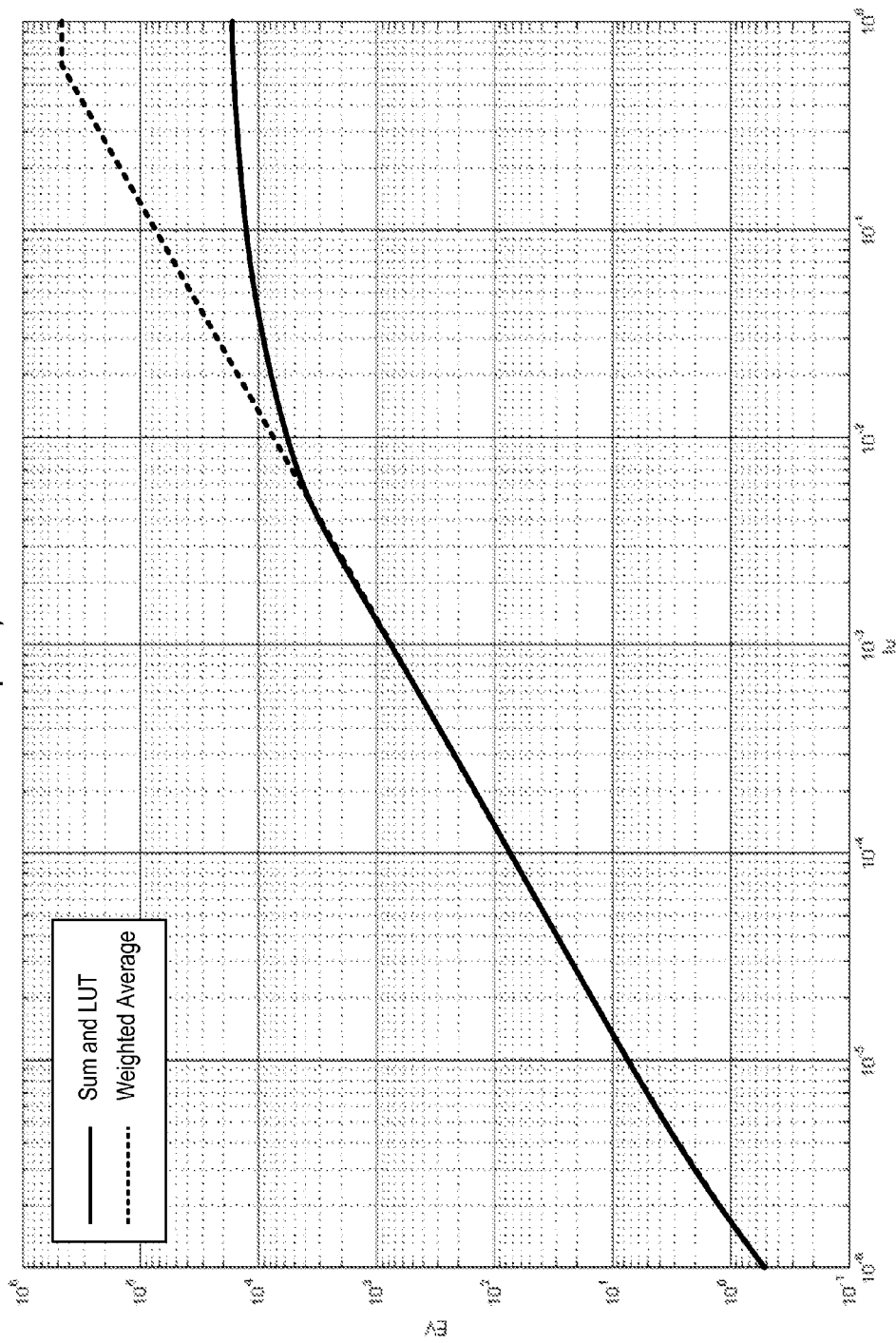
FIG. 31 (Reconstructed Light Response)

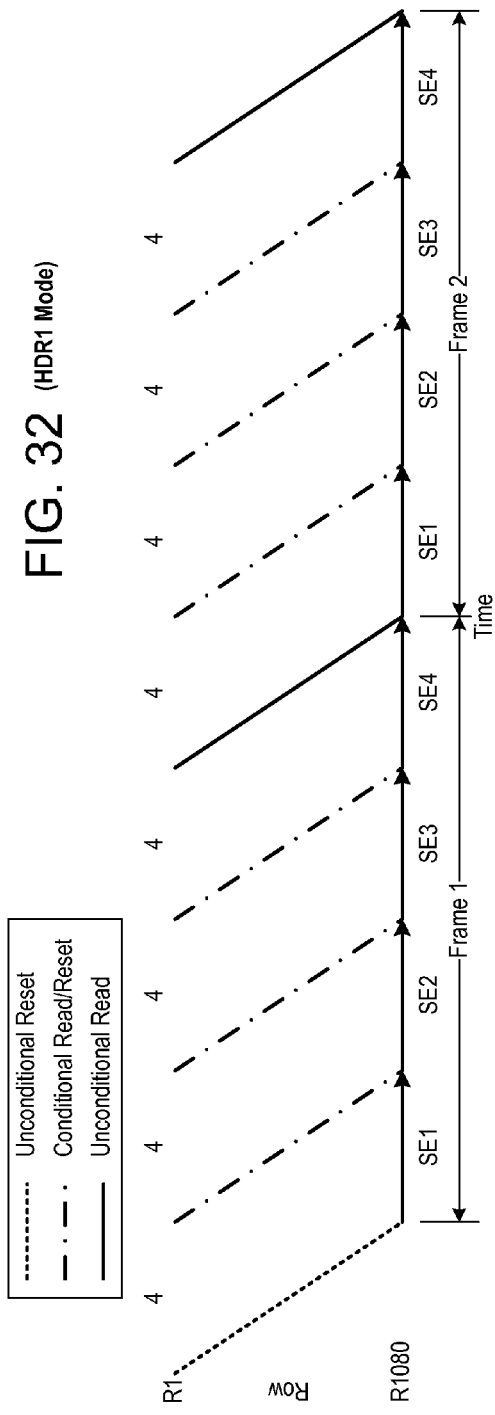
FIG. 32 (HDR1 Mode)
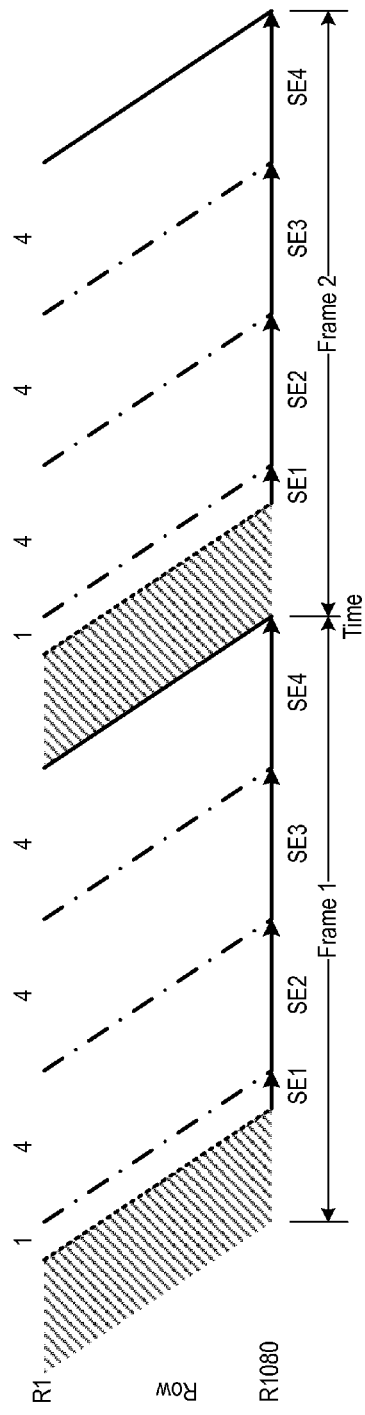
FIG. 33 (HDR2 Mode)

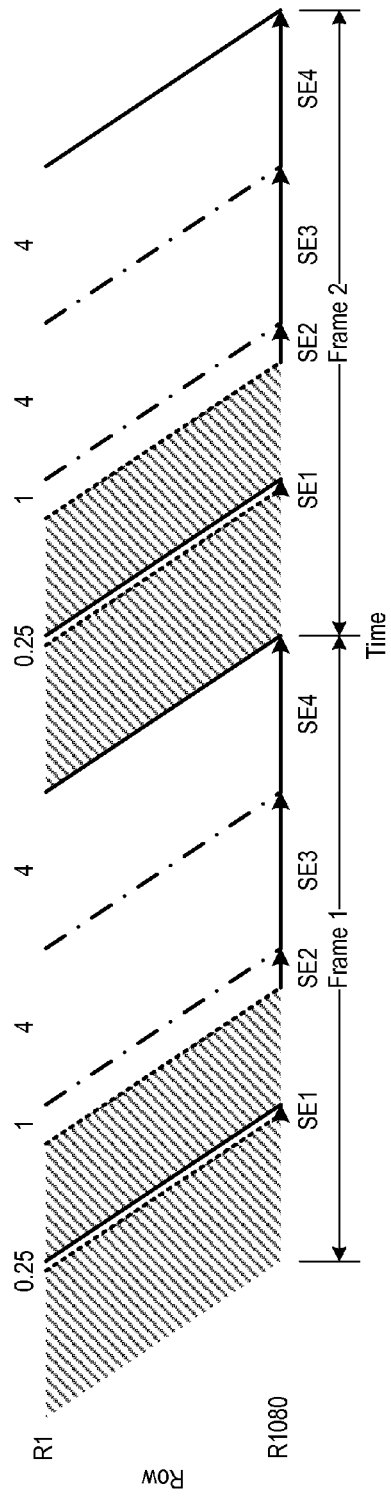
FIG. 34 (HDR3 Mode)
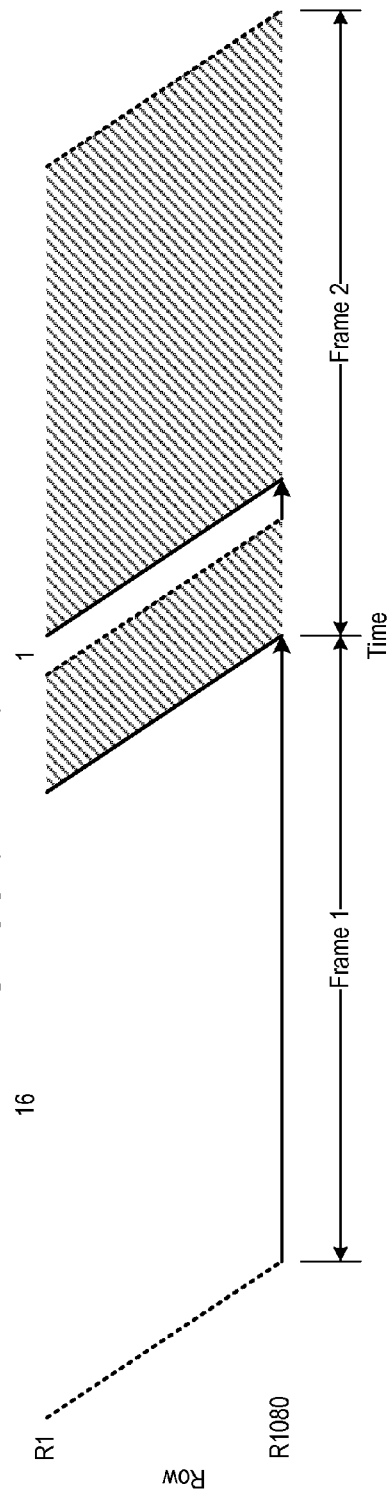
FIG. 35 (Preview Mode)

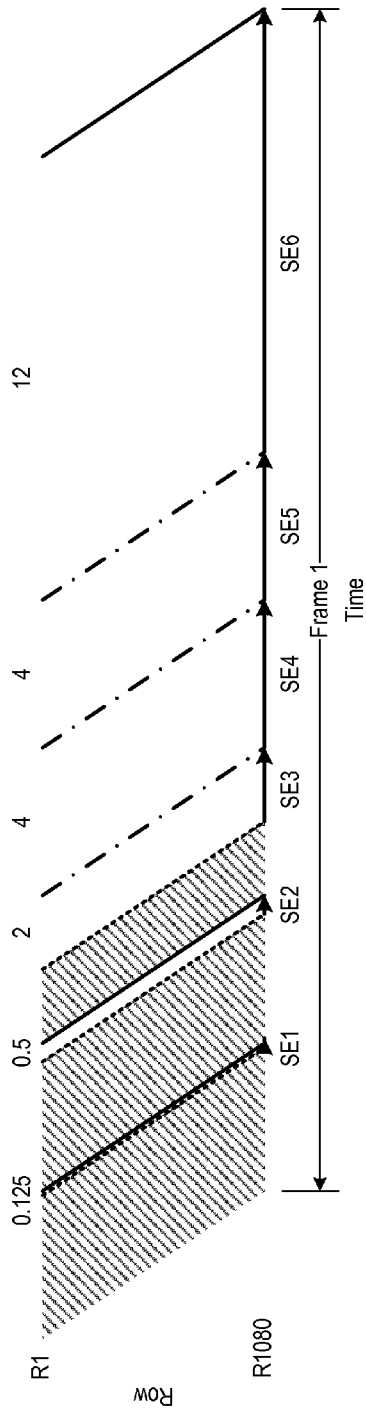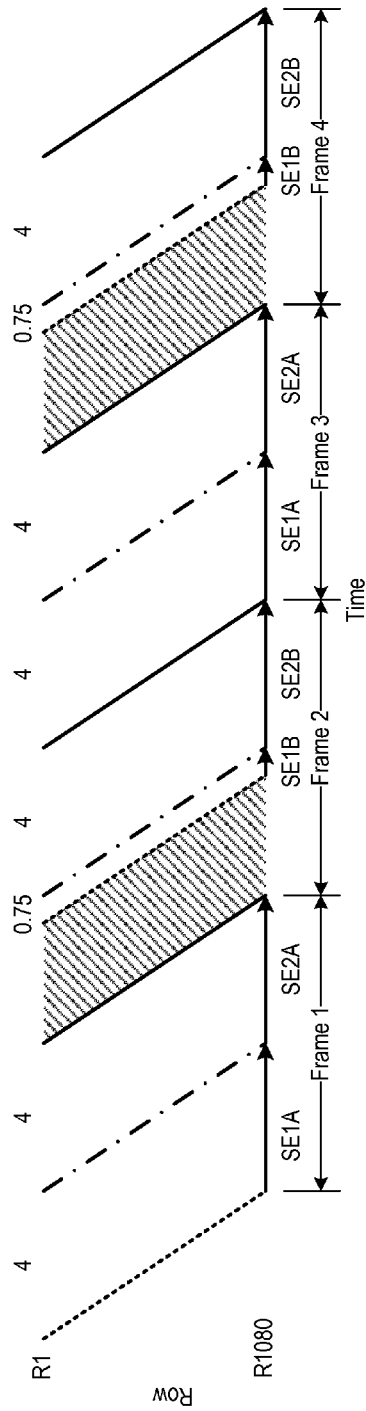

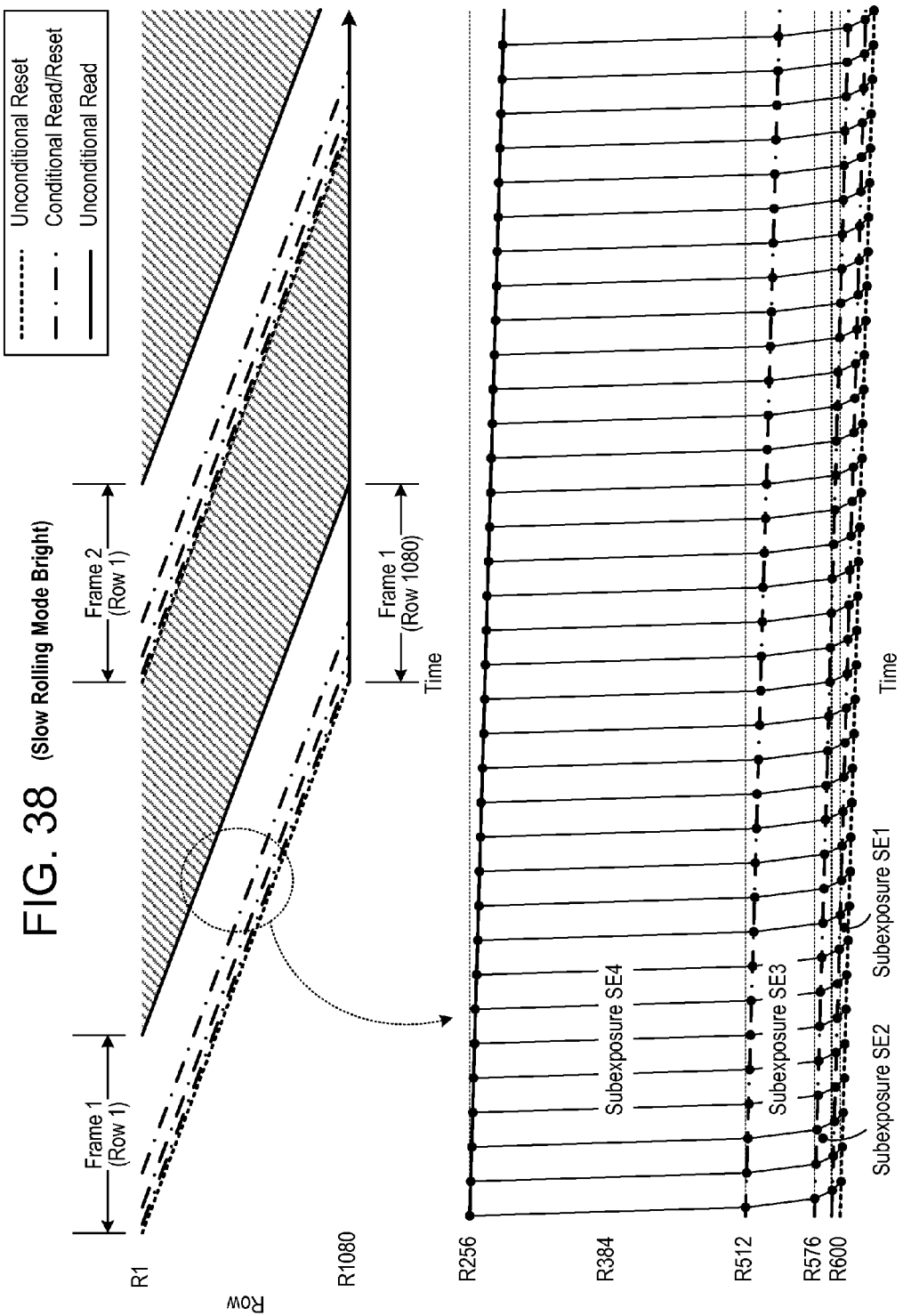
FIG. 38 (Slow Rolling Mode Bright)

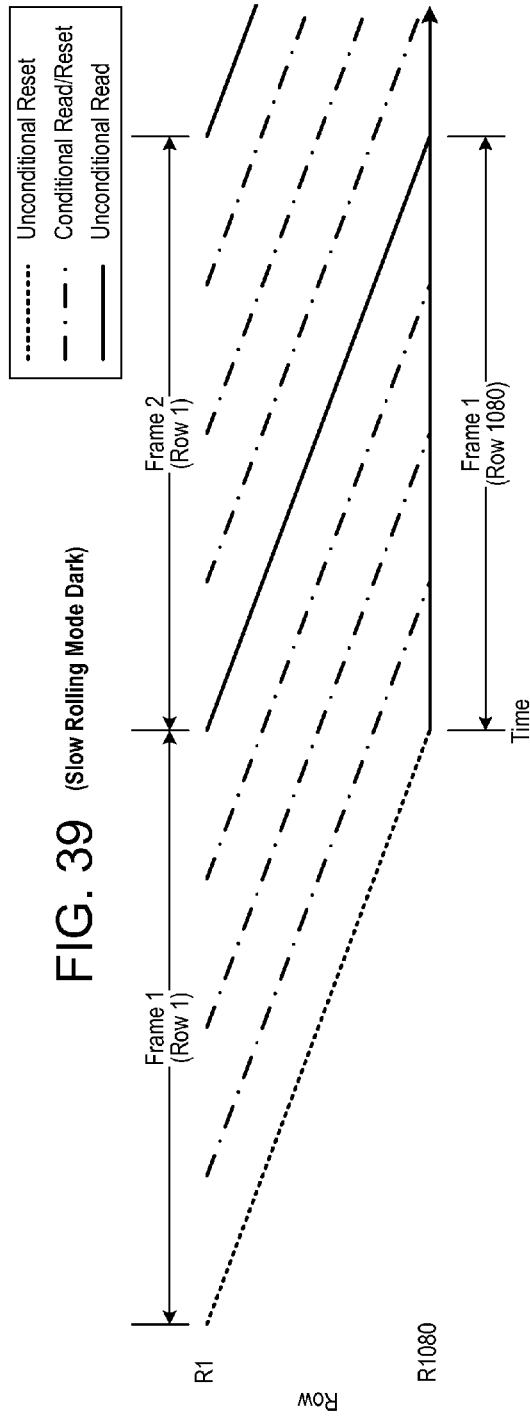
FIG. 39 (Slow Rolling Mode Dark)
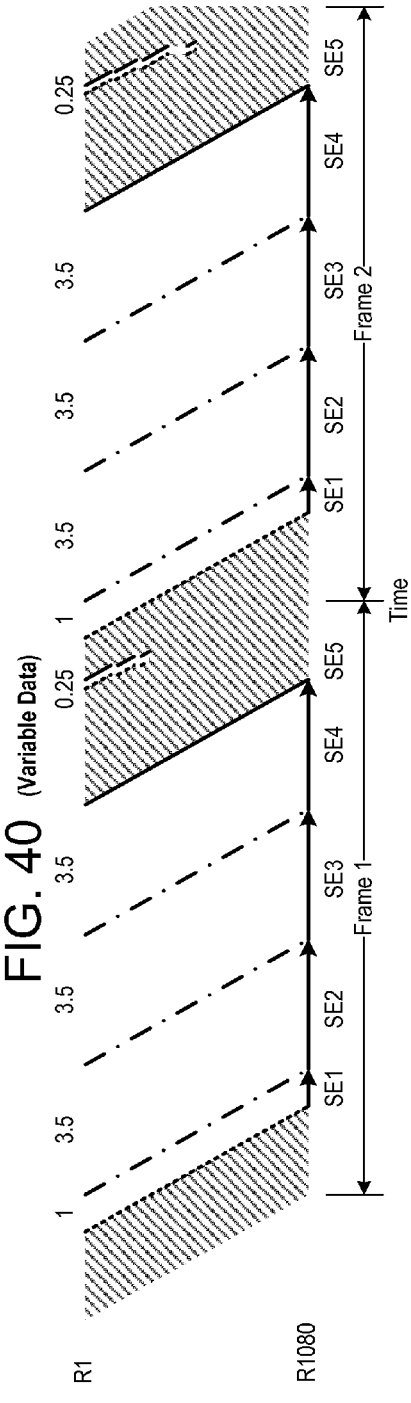
FIG. 40 (Variable Data)

(Skip Logic)

(Row Format)

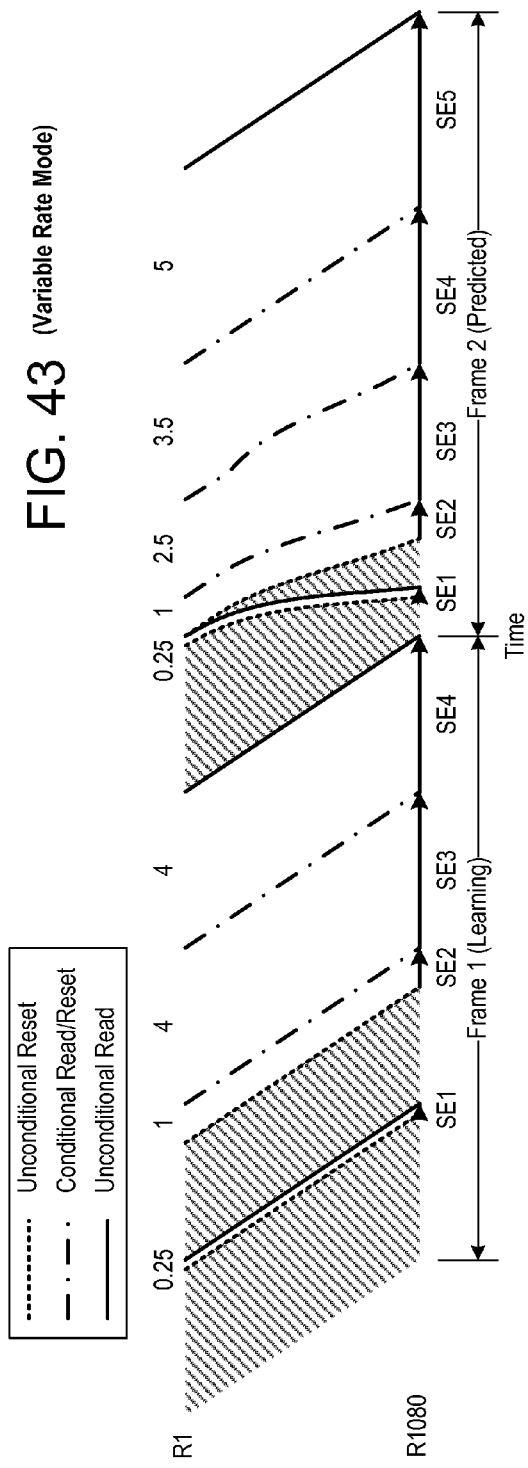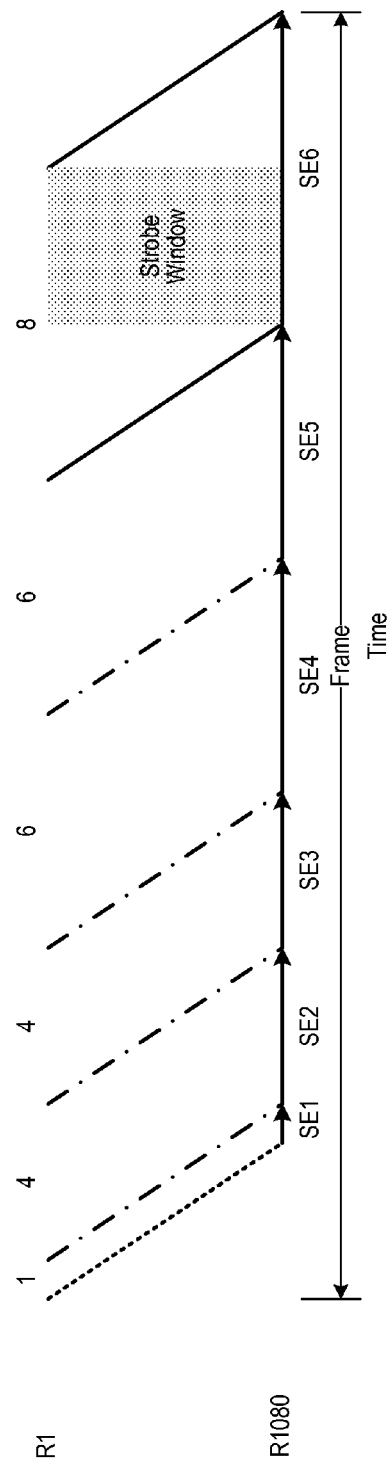

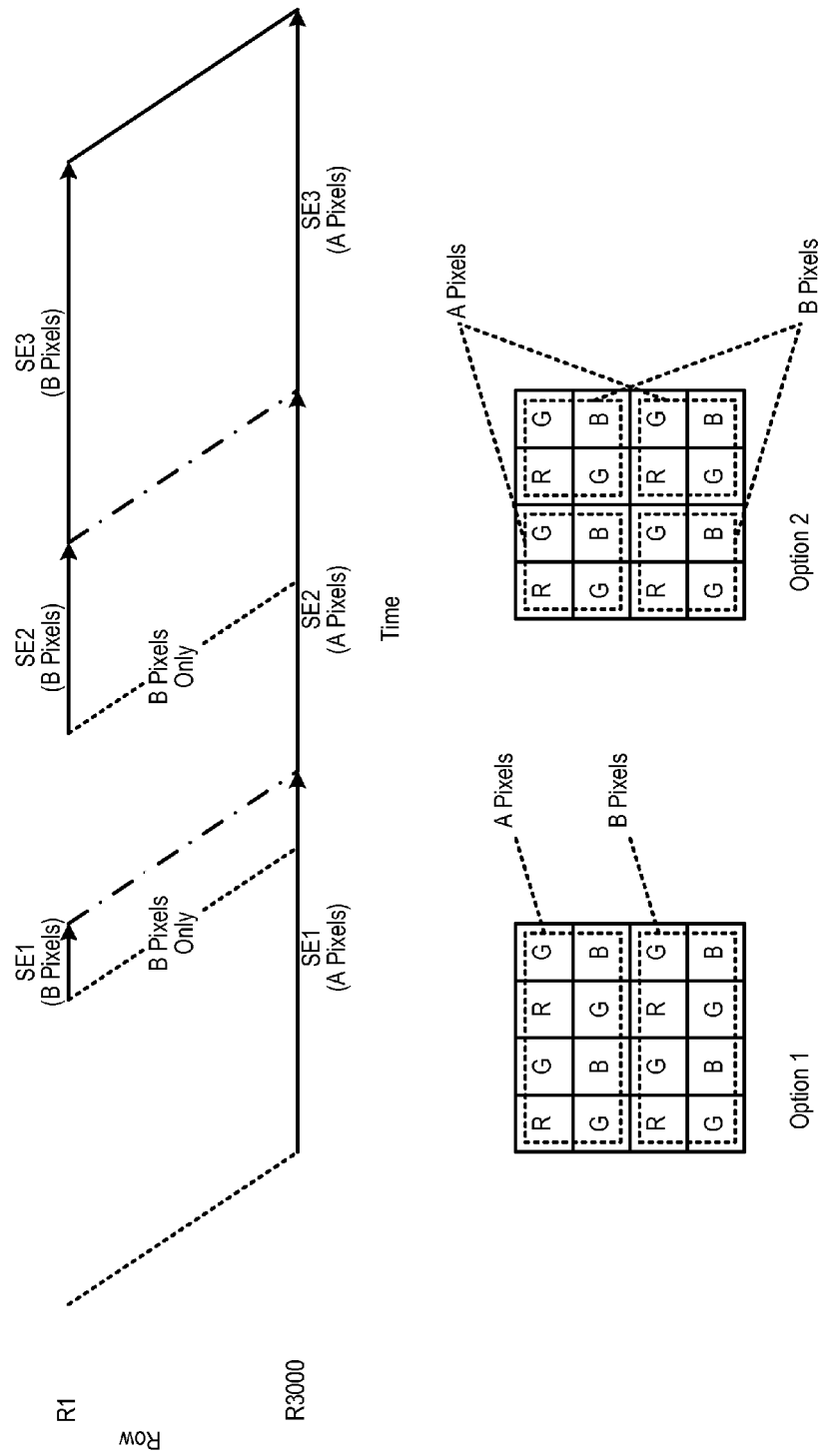
FIG. 45 (HDR4 Mode)

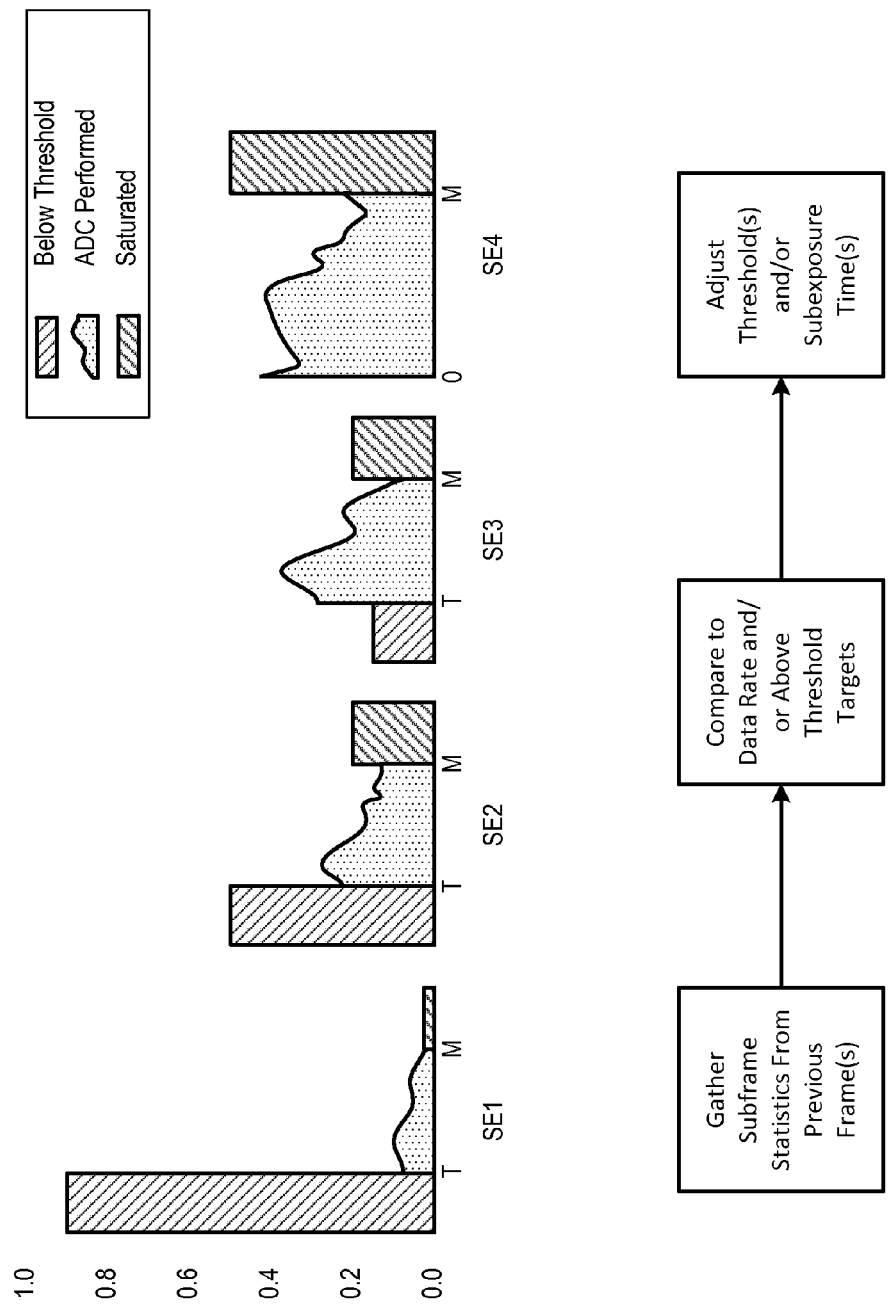
FIG. 46 (Histogram Equalization)

THRESHOLD-MONITORING, CONDITIONAL-RESET IMAGE SENSOR

TECHNICAL FIELD

The present disclosure relates to the field of electronic image sensors, and more specifically to a sampling architecture for use in such image sensors.

BACKGROUND

Digital image sensors, such as CMOS or CCD sensors, include a plurality of photosensitive elements ("photosensors") each configured to convert photons incident upon the photosensors ("captured light") into electric charge. The electric charge can then be converted into image data representing the light captured by each photosensor. The image data includes a digital representation of the captured light, and may be manipulated or processed to produce a digital image capable of display on a viewing device. Image sensors are implemented in integrated circuits ("ICs") with a physical surface that may be divided into a plurality of pixel regions (for instance, one or more photosensors and attendant control circuitry) configured to convert light into an electrical signal (charge, voltage, current, etc.). For convenience, pixel regions within an image sensor may also be referred to as image pixels ("IPs") and the aggregate of the pixel regions or image pixels will be referred to as the image sensor region. An image sensor IC typically will also include areas outside of the image sensor region, for example certain types of control, sampling, or interface circuitry. Most CMOS image sensors contain A/D (analog-to-digital) circuitry to convert pixel electrical signals into digital image data. The A/D circuitry can be one or more ADCs (analog-to-digital converters) located within or at the periphery of the image sensor region.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 1 illustrates a cross-section of a portion of an image sensor, according to one embodiment;

FIG. 2 illustrates partial array circuitry of an analog pixel image sensor with multiple pixel signal thresholds, according to one embodiment useful, e.g., in the layout of FIG. 1;

FIG. 5 illustrates another example circuit block diagram of an image sensor system architecture with read circuit arrays located peripherally to an IP array, according to one embodiment using, e.g., the cross-section of FIG. 1 and the circuitry of FIGS. 2 and 3;

FIGS. 15A-15C illustrate alternative column read-out circuit embodiments that may be employed in connection with the progressive read-out pixels described in reference to FIGS. 10-14;

FIG. 16 illustrates a quad-pixel, shared floating diffusion image sensor architecture in which the row and column transfer-gate control lines disclosed in the embodiments of FIGS. 10-14 may be applied in a manner that enables multiple decimation modes without requiring additional array-traversing control lines;

FIG. 17 illustrates an exemplary physical layout of the quad-pixel architecture shown in FIG. 16;

FIGS. 18A and 18B illustrate color filter array (CFA) patterns that may be employed with respect to the quad-pixel architecture of FIGS. 16 and 17;

FIGS. 19 and 20 present timing diagrams illustrating exemplary phases of full-resolution (non-binning) and binned-mode pixel read-out operations, respectively, within an image sensor containing the 2×2 quad-pixel arrangement shown in FIG. 16;

FIG. 29 illustrates an embodiment of an imaging system having a conditional-reset image sensor together with an image processor, memory and display;

FIG. 30 illustrates an exemplary sequence of operations that may be executed within the imaging system of FIG. 29 in connection with an image processing operation;

FIG. 31 illustrates an exemplary log-log plot of exposure value (EV) vs. light intensity in lux for a sum-and-lookup image reconstruction technique and a weighted averaging image reconstruction technique;

FIG. 32 depicts an example of a first HDR operating mode in the context of 1080 P video imaging at a 60 Hz frame rate;

FIG. 33 depicts an example of a second HDR operating mode in the context of 1080 P video imaging at a 60 Hz frame rate;

FIG. 34 illustrates an exemplary operating mode with still further extension of dynamic range without disturbing the integration-time ratio referenced in FIG. 33;

FIG. 35 demonstrates an exemplary "preview mode" that can be appropriate, e.g., when the sensor is operating in a reduced power/data rate mode to allow a user to compose an image, set zoom, etc.;

FIG. 36 illustrates an exemplary 30 Hz capture mode that allows (for the same imager example as FIGS. 32-35) for up to eight subexposure captures per frame interval and additional flexibility in exposure policies;

FIG. 37 illustrates examples of two different 120 Hz timing possibilities including (i) a 4 ms, 4 ms sequence with equal subexposure times and one conditional read/reset per frame and (ii) a 0.75 ms, 4 ms sequence with one conditional read/reset per frame;

FIG. 38 is an exemplary timing diagram illustrating an interleaved capture mode that may be suitable for tightly grouped subexposures;

FIG. 39 is an exemplary timing diagram for a mode that is analogous to the mode shown in FIG. 32 (i.e., in that all subexposure intervals are 4 ms long), but in which four subexposure intervals proceed concurrently;

FIG. 40 is an exemplary timing diagram for operation of the sensor in a data rate mode in which the maximum row rate is fast enough to support roughly 4.5 array scans per frame;

FIG. 43 depicts an exemplary scheduling diagram for an image sensor that has a higher ADC bandwidth than channel rate, such that when data can be successfully compressed, a scan can be sped up and more than the exemplary four scans can be completed in one frame;

FIG. 44 illustrates an exemplary strobe window bracketed by two unconditional read passes, such that strobe light dominates and ambient light integration time is uniform (or equal) for all pixels;

FIG. 45 illustrates an exemplary exposure timing diagram for a spatial blending exposure mode; and FIG. 46 illustrates an exemplary subexposure histogram sequence and exposure optimization algorithm.

DETAILED DESCRIPTION

Figure 3:
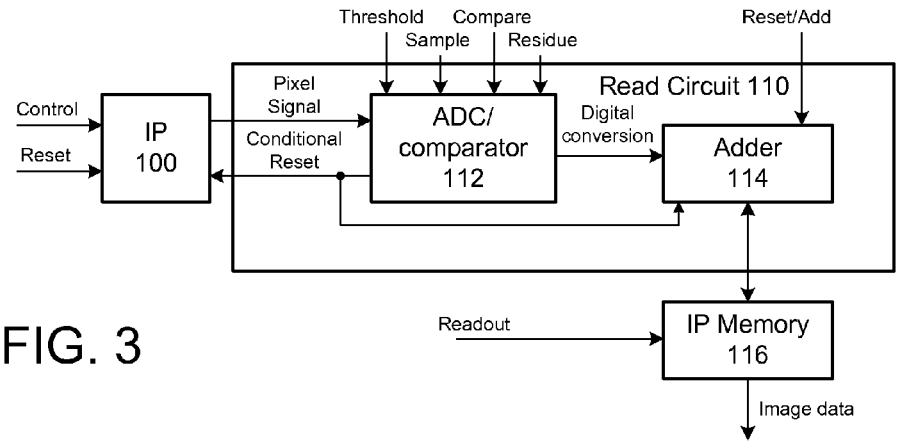
FIG. 3 illustrates an example image sensor read circuit configured to convert a pixel signal into a multi-bit digital conversion, according to one embodiment useful, e.g., with the embodiments of FIGS. 1 and 2.

In some image sensors, electrical information representing a photon response and resulting from light incident upon a pixel region (referred to herein as a "pixel signal") is converted to a digital image data value by read circuitry. The read circuitry can reside within the image sensor, or can be located external to the image sensor. In some approaches, a read circuit can be located within the image sensor for use by one or more pixel regions adjacent or near the read circuit. For read circuits located external to the image sensor, the pixel signals of one or more pixel regions associated with the read circuits can be transferred from the pixel regions to the read circuits.

Each read circuit samples a pixel region, receives a pixel signal from the sampled pixel region, and converts the pixel signal to a multi-bit digital value representative of the pixel signal. In the event that a pixel signal or a digital value representative of the pixel signal exceeds a sampling threshold, the pixel signal stored at the pixel region associated with the pixel signal is reset (for instance, by resetting a photosensitive element associated with the pixel region). If the pixel signal or the digital value do not exceed the sampling threshold, the pixel signal stored at the pixel region is not reset. The sampling of a pixel region and the resetting of a pixel signal at the pixel region only when the pixel signal exceeds a sampling threshold is referred to herein as "non-destructive sampling with conditional reset."

Image Sensor Overview

FIG. 1 illustrates a partial cross-section of an image sensor 25 useful in an embodiment. In image sensor 25, light passing through a microlens array 10 and a color filter array 12 (useful for color imaging) is incident upon a silicon section 20 of the image sensor. The use of microlenses (or other concentrating optics) and color filters is optional and is shown here for illustrative purposes only. Silicon 20 contains photodiodes (not shown) to collect charge generated by photons absorbed by the silicon, and access transistors (also not shown) to operate the photodiodes. Pixel array IC wiring 14 provides connections used to route signals and supply voltages within the array. As shown, image sensor 25 is a BackSide Illuminated (BSI) sensor because light enters the silicon from the side of the integrated circuit opposite the wiring layers and primary active circuit formation. Optionally, pixel array IC wiring 14 can be arranged between the color filter array 12 and silicon 20 (with primary active circuit formation within the "top" of the silicon as oriented in FIG. 1) for FrontSide Illumination (FSI).

The image sensor 25 includes a plurality of IPs ("image pixels"), IP1-IP3 shown, upon which light collected by the lenses of the microlens array 10 is respectively incident. Each IP includes one or more photodiodes embedded within the silicon 20. At least some photons entering silicon 20 are converted to electron-hole pairs in the silicon and the resulting electrons (or holes in alternate embodiments) are collected by the IPs. The description herein will refer to this process as the capture and conversion of light by the IPs into image data for the purposes of simplicity. Each IP of the image sensor represents a portion of the surface area of the image sensor, and the IPs of the image sensor may be organized into various arrays of columns and rows. In a CMOS or CCD image pixel technology, each IP (for instance, each photosensor) converts light incident upon the IP into a charge and includes readout circuitry configured to convert the charge into a voltage or current. In one embodiment, the light captured by each IP of the image sensor represents one pixel of image data for an associated digital image, though in other embodiments image data from multiple IPs is combined to represent a fewer number (one or more) of pixels (downscaling).

The image sensor 25 may include components outside the IP array. Similarly, portions of the IP array may include components that do not convert light into charge. The region defined by the IPs in the aggregate will be referred to as the image sensor region. As described herein, the image sensor may include amplifiers, analog-to-digital converters ("ADCs"), comparators, controllers, counters, accumulators, registers, transistors, photodiodes, and the like. In different architectures, some of these components may be located within the image sensor region or external to the image sensor region, and some components may be located on a companion integrated circuit. In these embodiments, a lens (such as those of the microlens array 10) may be configured to direct light toward the actual light-sensing elements within the IP rather than, for example, on the amplifiers, comparators, controllers, and other components.

As noted above, an image sensor may include an array of multiple IPs. Each IP, in response to light (for instance, one or more photons), captures and stores a corresponding charge. In one embodiment, upon sampling an IP, if a pixel signal representative of the charge stored at the IP exceeds a sampling threshold, the pixel signal is converted to a digital value representing the pixel signal and the charge stored by the IP is reset. Alternatively, upon sampling an IP, a pixel signal representative of the charge stored at the IP is converted to a digital value representative of the pixel signal, and if the digital value exceeds a sampling threshold, the charge stored by the IP is reset. In other embodiments, an analog-to-digital conversion is begun, and when enough of the conversion has been completed to determine whether the threshold is exceeded, a determination is made as to whether to continue the conversion. For instance, in a successive approximation register ("SAR") ADC, if the threshold is equal to a most-significant-bit(s) pattern, as soon as the pattern is resolved a determination can be made as to whether to continue the conversion and perform a reset of the pixel, or stop the conversion. A determination of whether a pixel signal or a digital value representative of a pixel signal exceeds a sampling threshold can be made through the use of a comparator configured to compare the pixel signal or the digital value to a sampling threshold.

FIG. 2 illustrates an analog pixel image sensor with multiple pixel signal thresholds, according to one embodiment. The image sensor of FIG. 2 is a CMOS sensor, and includes an IP array 40. The IP array can include any number of columns and rows, with any number of IPs per column and per row. IP column 50, a column representative of full or partial IP columns in the IP array, is highlighted in FIG. 2. The IP column 50 includes a plurality of IPs communicatively coupled via the column line 55. IP 60, an IP representative of IPs in the IP array, is highlighted in FIG. 2.

The IP 60 includes a photo diode 65 together with control elements that enable the photo diode to be precharged in preparation for exposure and then sampled after exposure. In operation, a transistor 70 is switched on to couple the cathode of the photo diode to a voltage source and thus "precharge" the cathode of the photo diode to a precharge voltage. The transistor 70 is switched off at or before the start of an exposure interval. With the transistor 70 off, the cathode voltage incrementally discharges in response to photon strikes, lowering the photo diode potential, $V_{DET}$, in proportion to the amount of light detected. At the conclusion of the exposure interval, an access transistor 72 is switched on to enable a signal representative of the photo diode potential to be amplified/driven onto the column line 55 via follower-transistor 74 as pixel signal 80.

An ADC 85 is communicatively coupled to the IP column 50 via the column line 55. In the embodiment of FIG. 2, the ADC is located at the edge of the pixel array 40, and may be located within or external to the image sensor on which the IP array is located. The ADC receives the pixel signal 80 (the representation of the analog photo diode potential) from the IP 60. The ADC digitizes the pixel signal to generate a 3-bit digital value ("Pix[2:0]") representative of the pixel signal. The ADC includes 7 pixel thresholds, Threshold 1 to Threshold 7 (referred to herein as "$V_{T1}$ to $V_{T7}$"). If the magnitude of the pixel signal is less than $V_{pre}$ but greater than $V_{T1}$, the ADC converts the pixel signal to the digital value "000". Pixel signals less than $V_{T1}$ but greater than $V_{T2}$ are converted to the digital value "001", pixel signals between $V_{T2}$ and $V_{T3}$ are converted to "010", and so forth, up to pixel signals less than $V_{T7}$, which are converted to "111".

In the embodiment of FIG. 2, the potential difference between successive pixel thresholds is approximately the same (e.g., $V_{T3}-V_{T4} \approx V_{T5}-V_{T6}$). In other words, the pixel thresholds are linearly distributed between $V_{T1}$ and $V_{T7}$. In addition, in the embodiment of FIG. 2, the potential difference between $V_{pre}$ and $V_{T1}$ is greater than the potential difference between successive pixel thresholds (e.g., $V_{pre}-V_{T1}>V_{T3}-V_{T4}$), although in other embodiments all steps are equal. The selection of $V_{T1}$ such that $V_{pre}-V_{T1}>V_{T3}-V_{T4}$ reduces the effect of, e.g., dark noise when sampling an IP. The potential difference between $V_{T7}$ and $V_{floor}$ in the embodiment of FIG. 2 also can be greater than the potential difference between successive pixel thresholds (e.g., $V_{T7}-V_{floor}>V_{T3}-V_{T4}$). Finally, instead of linear threshold spacing, a given embodiment can space the thresholds exponentially, e.g., with each threshold spacing doubling from the one below. For systems that accumulate multiple ADC samples to form an image, exponential spacing is converted to a linear value prior to accumulation.

$V_{floor}$ represents the pixel saturation threshold at which the cathode voltage of the photo diode 65 no longer linearly discharges in response to photon strikes. For pixel signals within the linear sensitivity region 90, the conversion of pixel signals to digital values is shown in graph 95. It should be noted that the maximum number of detectable photon strikes (i.e., the pixel saturation point) is proportional to the capacitance of the photo diode and thus its physical size. Consequently, in a traditional sensor design the photo diode footprint is dictated by the dynamic range required in a given application and does not scale appreciably with shrinking process geometries.

During the capture of an image, in one embodiment the IPs of a given row or rows in the IP column 50 and each other column in the IP array 40 are successively sampled and the pixel signals associated with each are converted into digital values using the ADC or ADCs associated with each column. The digital values output by the ADCs are accumulated (conditionally in some embodiments, as explained below) and stored during the image capture period. Other types and configurations of IPs than that illustrated in FIG. 2 can be used in the image sensor system. For instance, a different arrangement of transistors can be used than the transistors 70, 72, and 74. In addition, although one ADC 85 is shown in FIG. 2 in conjunction with the IP column 50, in other embodiments, more than one ADC can be used per IP column, with different ADC groups serving different sections of the array rows of the ADC column. Additional combinations of ADCs (in the form of read circuits) and IPs are described below in greater detail. Finally, the output of the ADC (e.g. Pix[2:0] in the embodiment of FIG. 2) can be any multi-bit length, and can be associated with any number of thresholds distributed in any manner between $V_{pre}$ and $V_{floor}$.

Image Sensor System with Multi-Bit Sampling and Conditional Reset

FIG. 3 illustrates an example image sensor read circuit configured to convert a pixel signal into a multi-bit digital conversion, according to one embodiment. The embodiment of FIG. 3 illustrates an IP 100, an IP memory 116, and a read circuit 110, the read circuit including an ADC/comparator circuit 112 (hereinafter "ADC/comparator") and an adder 114. It should be noted that in other embodiments, the modules of FIG. 3 can include additional, fewer, and/or different components. For example, the ADC/comparator can be implemented as separate components, and the adder can be located external to the read circuit.

The IP 100 represents an IP in an image sensor, and can be, for instance, the IP 60 of FIG. 2. The IP 100 receives one or more control signals, for instance from external control logic. A control signal can enable the IP to begin an image capture, for instance by resetting the IP to Vpre and enabling the exposure of the IP's photosensitive element to light to result in the storing of charge relative to Vpre. Similarly, a control signal can enable the IP to end an image capture, for instance by disabling the exposure of the IP's photosensitive element to light after the passing of an image capture period. A control signal can also enable the outputting of a pixel signal by an IP and the subsequent conversion of the pixel signal to a digital value representative of the pixel signal by a read circuit (referred to herein as "sampling the IP" or "sampling the pixel signals"). As described above, a pixel signal can be a representation of the integrated charge (e.g., a source follower voltage, an amplified voltage, or a current having a component proportional to the integrated charge).

The IP 100 receives a reset signal, for instance from external control logic. The reset signal resets the charge stored by the IP to Vpre, for instance at the beginning of an image capture period. The IP also receives a conditional reset signal from the ADC/comparator 112 (in some circuits, the conditional reset and initial reset are supplied using common circuitry). The conditional reset signal resets the charge stored by the IP, for instance during an image capture period in response to a pixel signal exceeding a sampling threshold when the IP is sampled. It should be noted that in other embodiments, the conditional reset signal is received from a different entity. In one implementation, the ADC/comparator may determine that the pixel signal exceeds a sampling threshold, and may enable external control logic to output a conditional reset signal to the IP; in such an embodiment, the reset signal (a row-wise signal) and the conditional reset signal (a column-wise signal) may be ANDed by the IP to initiate all resets. For simplicity, the remainder of the description will be limited to embodiments in which the ADC/comparator provides conditional reset signals to the IP.

The read circuit 110 receives a threshold signal, a sample signal (or "sample enable signal"), a compare signal (or "compare enable signal"), a residue signal (or "residue enable signal"), and a reset signal, for instance from external control logic, and receives pixel signals from the IP 100. The IP memory element 116 corresponding to IP 100 receives a readout signal that selects it for readout/write by adder 114 and for external readout. The ADC/comparator 112 samples the IP 100 in response to receiving one or more sample signals. During an image capture, the ADC/comparator receives a sample signal at various sampling intervals, for instance periodically or according to a pre-defined sampling interval pattern (referred to herein as a "sampling policy"). Alternatively, the sample signal received by the ADC/comparator can include a sampling policy, and the ADC/comparator can be configured to sample the IP based on the sampling policy. In other embodiments, the IP receives one or more sample signals and outputs pixel signals based on the received sample signals. In yet other embodiments, the IP outputs pixel signals periodically or according to a sampling policy, or the ADC/comparator samples pixel signals periodically or according to a sampling policy, independent of received sample signals. The ADC/comparator can request a pixel signal from the IP prior to sampling the pixel signal from the IP.

During a sampling of the IP, the ADC/comparator 112 receives a pixel signal from the IP and converts (optionally in some embodiments based on the pixel signal exceeding the sampling threshold) the pixel signal to a multiple-bit digital value representative of the pixel signal. If the pixel signal exceeds a sampling threshold, the ADC/comparator outputs a conditional reset signal to reset the charge stored at the IP. If the pixel signal does not exceed a sampling threshold, the ADC/comparator does not output a conditional reset signal to reset the charge stored at the IP. The sampling threshold can be varied during the image capture and received via the threshold signal, or can be pre-determined or preset for a given image capture. One sampling threshold can be used during multiple image captures, different sampling thresholds can be used for different image captures, and multiple sampling thresholds can be used during a single image capture. In one embodiment, the sampling threshold varies in response to detected changing light conditions (for instance, the sampling threshold can decrease in response to low light conditions, and can increase in response to high light conditions).

In one embodiment, the sampling threshold is an analog signal threshold. In this embodiment, the ADC/comparator 112 includes an analog comparator and compares the pixel signal to the sampling threshold to determine if the pixel signal exceeds the sampling threshold. If the pixel signal includes a voltage representative of the charge stored by the IP 100, the sampling threshold is exceeded if the pixel signal is lower than the sampling threshold. Using the embodiment of FIG. 2 as an example, if the sampling threshold of the ADC/comparator is Threshold 4, then the pixel signal will exceed the sampling threshold only if the pixel signal includes a voltage lower than the voltage associated with Threshold 4.

In one embodiment, the sampling threshold is a digital signal threshold. In this embodiment, the ADC/comparator 112 includes a digital comparator, and first converts the pixel signal to a digital value representative of the pixel signal. The ADC/comparator then compares the digital value to the sampling threshold to determine if the pixel signal exceeds the sampling threshold. Using the embodiment of FIG. 2 as an example, for a sampling threshold of "101", if the ADC/comparator converts a pixel signal to a digital value of "001" (indicating that the pixel signal is between Threshold 1 and Threshold 2), then the pixel signal does not exceed the sampling threshold and a conditional reset signal is not outputted. However, if the ADC/comparator converts a pixel signal to a digital value of "110" (indicating that the pixel signal is between Threshold 6 and Threshold 7), then the pixel signal does exceed the sampling threshold and a conditional reset signal is outputted.

In another embodiment, the sampling threshold is a digital signal threshold that can be evaluated prior to the complete digital conversion of the pixel signal. This can be advantageous in some embodiments or use cases to allow faster conditional reset of a pixel, and/or power savings by avoiding unneeded ADC operations. For instance, with a successive approximation register ADC, multiple clock cycles are used to resolve the digital representation of the pixel signal. The first clock cycle resolves the most significant bit, the second clock cycle the next most significant bit, etc., until all bit positions have been resolved. Using the embodiment of FIG. 2 as an example, for a sampling threshold of "100," a determination of whether the threshold is met or not can be resolved after the first SAR ADC clock cycle. For a sampling threshold of "110," a determination of whether the threshold is met or not can be resolved after the second SAR ADC clock cycle. For embodiments with a bit depth of, e.g., 6 or 8 bits, making a reset determination after one or two conversion cycles can result in significant time/power savings, which can be realized by selecting a sampling threshold with one or more LSBs that are 0.

In one embodiment, a row-wise compare signal is supplied to each ADC/comparator "compare" signal input, and signals the ADC/comparator as to the appropriate clock cycle to perform the comparison. When the compare signal is asserted, the comparison is performed based on the current state of the analog-to-digital conversion. If the threshold is met by the compare for ADC/comparator 112, the conditional reset signal is asserted to IP 100 and to adder 114, and the SAR ADC continues converting the pixel signal. If the threshold is not met, the conditional reset signal is not asserted, and can be used in conjunction with the compare signal to gate the clock signal of SAR ADC to terminate the conversion.

The ADC/comparator 112 outputs a digital value representative of a pixel signal received by the ADC/comparator (referred to herein as a "digital conversion") to the adder 114. The ADC/comparator 112 can output a digital conversion in response to the pixel signal associated with the digital conversion exceeding a sampling threshold. The conditional reset signal can be used as an enable to signal to the adder 114 to load the digital conversion and add it to the IP memory 116 location corresponding to IP 100 (which in this embodiment is selected from a plurality of such locations by address selection of the readout line). In other embodiments, the ADC/comparator outputs a digital conversion during each sampling of the IP 100, regardless of whether the pixel signal associated with the digital conversion exceeds a sampling threshold. In these embodiments, the adder can be configured to accumulate digital conversions associated with pixel signals that exceed a sampling threshold and to disregard digital conversions associated with pixel signals that do not exceed a sampling threshold. Alternately, if the threshold is set to "001" in FIG. 2, for example, the adder can unconditionally add the digital conversion to IP memory 116 each time IP 100 is read, while still producing correct results.

In one embodiment, the ADC/comparator 112 also outputs a digital conversion in response to receiving a residue signal assertion (without the compare signal being asserted). The residue signal assertion is associated with the end of an image capture, and enables the ADC/comparator to output a full digital conversion to the adder 114 regardless of whether the pixel signal associated with the digital conversion exceeds a sampling threshold, and asserts the conditional reset. The residue signal can prevent the loss of image information associated with light received by the IP 100 but not surpassing the threshold at the end of a capture period. If the pixel signal representative of such received light does not exceed the sampling threshold, the ADC/comparator otherwise may not output the digital conversion associated with the pixel signal, and the charge stored by the IP would not be reset by the conditional reset signal (which is also triggered by assertion of the residue signal). In embodiments where the ADC/comparator outputs digital conversions to the adder regardless of whether the pixel signals associated with the digital conversions exceed a sampling threshold, the adder can receive the residue signal, and can be configured to accumulate a digital conversion associated with a pixel signal received at the end of a capture period in response to receiving the signal.

The adder 114 is configured to accumulate digital conversions received during a capture period. As discussed above, in embodiments in which the ADC/comparator 112 outputs digital conversions only if the pixel signals associated with the digital conversions exceed a sampling threshold, the adder accumulates all received digital conversions (including the additional digital conversion output by the ADC/comparator in response to receiving a residue signal) into IP memory 116. In embodiments in which the ADC/comparator outputs digital conversions associated with each received pixel signal, the adder accumulates only the digital conversions associated with pixel signals that exceed the sampling threshold, plus the digital conversion output by the ADC/comparator in response to receive a residue signal, into IP memory 116; such embodiments require the adder to be aware of when pixel signals exceed a sampling threshold and when a residue signal is received, and are not discussed further herein for the purpose of simplicity.

The adder 114 receives reset/add control signaling, for instance from external control logic. In response to receiving a reset signal (for instance at the beginning of an image capture period), the accumulator stores all zeros to the selected IP memory location 116 the accumulation of received digital conversions as image data. The adder also receives a reset signal and resets the accumulation of received digital conversions.

In alternative embodiments, the adder is located external to the read circuit 110. For instance, the ADC/comparator can output a stream of conversions to a digital channel (e.g., multiplexed with other conversions from other ADCs) to a separate circuit that supplies the accumulation function. In such a case, the ADC/comparator must also output a symbol for "no conversion," which can be 0. One possibility is for a circuit in the digital channel interface (e.g., PHY 134 in FIG. 4) to code digital conversions to reduce bandwidth. A "no conversion" in one embodiment is output as a "00," a upper threshold exceeded ADC conversion is output as a "01," and all other ADC conversions are output as "1xxxxxx," where an x represents one of the resolved bits of the ADC conversion and the number of x positions is equal to the bit depth of the ADC.

In one embodiment, the IP is configured to output a pixel signal and receive a conditional reset on the same line. In this embodiment, the IP and the ADC/comparator 112 alternately drive the pixel signal and the conditional reset on the shared line. For example, the IP can output a pixel signal on the shared line during a first portion of a sample period, and can receive conditional resets on the shared line during a second portion of a sample period. Finally, the ADC/comparator can receive a threshold signal, a sample signal, and a residue signal on a shared line. For example, the ADC/comparator can receive a threshold signal at the beginning of an image capture, can receive sample signals throughout the image capture period, and can receive a residue signal at the end of the image capture period. It should also be noted that the reset signal received by the IP can be the same reset signal received by the accumulator 114, and can be received on a shared line.

Figure 4:
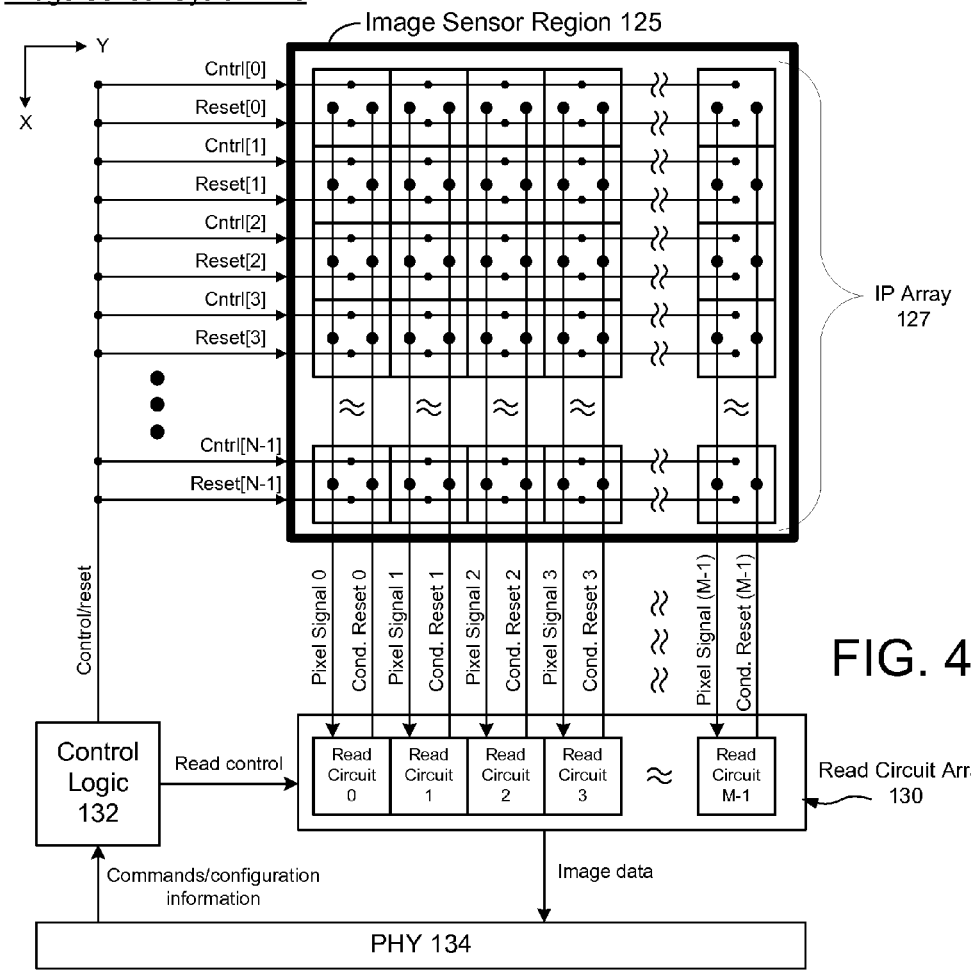
FIG. 4 illustrates an example circuit block diagram embodiment of an image sensor system with a multi-bit architecture, according to one embodiment using, e.g., the cross-section of FIG. 1 and the circuitry of FIGS. 2 and 3.

FIG. 4 illustrates an example embodiment of an image sensor system with a multi-bit architecture, according to one embodiment. The image sensor system 120 of FIG. 4 includes an image sensor region 125, a read circuit array 130, control logic 132, and a physical signaling interface 134. In other embodiments, the image sensor system may include fewer, additional, or different components than illustrated in the embodiment of FIG. 4 (for instance, the circuit may have memory 116 integrated therewith). The image sensor system shown in FIG. 4 can be implemented as a single IC, or can be implemented as multiple ICs (for instance, the image sensor region and the read circuit array can be located on separate ICs). Further, various components (such as the read circuit array, the control logic, and the physical signaling interface) can be integrated within the image sensor region 125.

For purposes of example, the image sensor system 120 and a host IC (not shown in FIG. 4) communicatively coupled to the image sensor system are assumed to form the primary image acquisition components within a camera (e.g., a still-image or video camera within a mobile device, compact camera, digital SLR camera, stand-alone or platform-integrated webcam, high-definition video camera, security camera, automotive camera, etc.). The image sensor IC and host IC can be more generally deployed alone or together with like or different imaging components within virtually any imaging system or device including without limitation metrology instruments, medical instruments, gaming systems or other consumer electronics devices, military and industrial imaging systems, transportation-related systems, space-based imaging systems and so forth. Operation of the image sensor system generally involves the capture of an image or frame through the exposure of IPs to light, the conversion of stored charge as a result of the exposure into image data, and the outputting of the image data to a storage medium.

The image sensor region 125 includes an IP array 127 including N-rows (indexed from 0 to N−1) and M-columns (indexed from 0 to M−1). The physical signaling interface 134 is configured to receive commands and configuration information from a host IC (e.g., a general-purpose or special-purpose processor, application-specific integrated circuit (ASIC) or any other control component configured to control the image sensor IC), and is configured to provide the received commands and configuration information to the control logic 132. The physical signaling interface is also configured to receive image data from the read circuit array 130 and to output received image data to the host IC.

The control logic 132 is configured to receive commands and configuration information from the physical signaling interface 134, and is configured to transmit signals configured to manipulate the operations and functionality of the image sensor system 120. For example, in response to receiving a command to capture an image or frame, the control logic may output a series of exposure signals (configured to cause IPs to reset) and sample signals (configured to cause the read circuits in the read circuit array 130 to sample the pixel signals from the IPs in the IP array 127), enabling the capture of the image or frame by the image sensor system. Similarly, in response to receiving a command to initialize or reset the image sensor system, the control logic may output reset signals configured to reset each IP in the IP array, causing each IP to disregard any accumulated charge. The control signals produced by the control logic identify particular IPs within the IP array for sampling, may control the functionality of read circuits associated with IPs, or may control any other functionality associated with the image sensor system. The control logic is shown in FIG. 4 as external to the image sensor region 125, but as noted above, all or portions of the control logic may be implemented locally within the image sensor region.

The control logic 132 outputs control and reset signals for each IP in the image sensor region 125. As illustrated in the embodiment of FIG. 4, each IP in an image pixel IP[X] [Y] receives a row-parallel Cntrl[X] signal (corresponding to a "row" select control signal for each IP) and a row-parallel Reset[X] signal from the control logic to reset the IPs, wherein "X" and "Y" refer to the coordinates of the IP within the image sensor region. Although the control signal and reset signals received at any given IP are each only 1 bit as indexed in the embodiment of FIG. 4, it is to be appreciated that such an indexing is done for the purposes of simplicity only, and that these signals may in practice be any width or dimension.

The read circuit array 130 includes M read circuits, each configured to receive pixel signals from a column of IPs in the IP array 127. It should be noted that in other embodiments, the read circuit array can include multiple read circuits configured to receive pixel signals from each IP column, as is discussed in FIGS. 5a, 5b, and 5c. A pixel signal bus couples the IPs in each IP column in the IP array to the read circuit associated with the IP column within the read circuit array. Each IP is configured to output a pixel signal produced by the IP to the pixel signal bus, and each read circuit is configured to sample the pixel signals from the IPs in the IP column associated with the read circuit. For example, read circuit 0 is configured to sample pixel signals from pixel signal bus 0, and so forth. Each read circuit in the read circuit array can sample pixel signals iteratively from IPs in the IP column associated with the read circuit (for instance, by sampling pixel signals from successive IPs in order over multiple passes), or can sample pixel signals according to a pre-determined non-sequential order. In one embodiment, read circuits can sample multiple pixel signals simultaneously. Although not illustrated in the embodiments of FIG. 3 and FIG. 4, the read circuits can additionally include memories configured to store accumulated digital values prior to outputting the accumulated values as image data.

A conditional reset bus couples the IPs in each IP column in the IP array 127 to the read circuit associated with each IP column. After sampling a pixel signal from an IP in an IP column, the read circuit associated with the IP column produces a conditional reset signal if the sampled pixel signal exceeds a sampling threshold. For example, if an IP in an IP column outputs a pixel signal to a read circuit associated with the IP column via the pixel signal bus coupling the IP to the read circuit, and if the read circuit determines that the pixel signal exceeds a sampling threshold, the read circuit outputs a conditional reset signal to the IP via the conditional reset bus coupling the read circuit to the IP and the IP resets the charge stored at the IP. As described above, the pixel signal bus and the conditional reset bus can be implemented in a shared bus with Cntrl[X] enabling pixel signals to be output from row X to the shared bus and Reset[X] enabling conditional reset for pixels in row X from the shared bus, though such embodiments are not described further herein for the purposes of simplicity.

The control logic 132 produces read control signals for the read circuits in the read circuit array 130. The read control signals can control the sampling of pixel signals from the IPs in the IP array 127 by the read circuits, the conversion of sampled pixel signals into digital values, the accumulation of the digital values, the outputting of the accumulated digital values, and the resetting of the adders. The read control signals can include a threshold signal, a sample signal, a compare signal, a residue signal, a readout signal, and a reset/add signal for each read circuit in the read circuit array as described in FIG. 3.

The control logic 132 is configured to produce read control signals for the read circuit array 130 to enable the capture of an image over an image capture period. Prior to the image capture period or at the first use of a particular IP memory location for an image capture period, the control logic can produce a reset to cause the accumulator of each read circuit 110 to reset the IP memory location. At the beginning of the image capture period, the control logic can produce a threshold signal for each of the read circuits; as discussed above, the threshold signal is used by each read circuit to determine a threshold to which pixel signals are compared for the purposes of conditionally resetting IPs associated with the pixel signals and accumulating digital values associated with the pixel signals. During the image capture period, the control logic can produce a series of sample signals configured to enable the read circuits to sample pixel signals from IPs associated with the read circuits. In one embodiment, the control logic produces sample signals according to one or more sampling policies. Sampling policies are described in greater detail below. At the end of the image capture period, the controlled logic produces a residue signal configured to enable each read circuit to accumulate a digital value representative of a pixel signal regardless of whether the pixel signal exceeds a sampling threshold. After the image capture period, the control logic produces a readout signal configured to enable each read circuit to output the accumulated digital values representative of sampled pixel signals that exceed an associated sampling threshold as image data. The control logic may also produce a reset signal after each image capture period to reset the accumulated digital values within each read circuit.

The control logic may also be configured to produce pause and resume signals configured to cause the IPs and the read circuits to pause and resume an image capture, and to produce any other signal necessary to control the functionality of the IPs and read circuits in the read circuit array. For each read circuit, the image data output by the read circuit is a digital representation of the light captured by each IP in an IP column associated with the read circuit. The image data is received by the physical signaling interface for subsequent output to a host IC.

FIG. 5 illustrates an example image sensor system architecture with read circuit arrays located peripherally to an IP array, according to one embodiment. In the architecture of FIG. 5, six read circuit arrays (140a, 140b, 140c, 140d, 140e, and 140f) are located around an image sensor region 145 including an IP array. Unlike the embodiment of FIG. 4, in which one read circuit array 130 is located to one side of the image sensor region 125, the read circuit arrays 140 of FIG. 5 are located on all sides of the image sensor region 145. The read circuit arrays can be located within an IC also containing the image sensor region, or can be located on one or more separate ICs. For example, each read circuit array could be located on the periphery of an image sensor IC, or could be located in dedicated read circuit array ICs located adjacent to the image sensor IC.

In the previous embodiment of FIG. 4, each read circuit in the read circuit array 130 is coupled to an IP column in the IP array 127. In the embodiment of FIG. 5, each read circuit array 140x is coupled to a set of six IPs from partial rows and partial columns of the image sensor region 145. For example, read circuit array 140a is coupled to IP1, IP2, IP3, IP7, IP8, and IP9. Each read circuit array 140x includes one or more read circuits. In one embodiment, each read circuit array includes 6 read circuits, with each read circuit in a read circuit array coupled to one IP. In such an embodiment, each read circuit samples only the IP to which it is coupled. More typically, each read circuit will be shared by a block of IPs comprising a large number of rows and one or more columns. Although control logic is not illustrated in the embodiment of FIG. 5, each read circuit array can be coupled to universal control logic, or each may be coupled to dedicated control logic. Further, although a physical signaling interface is not illustrated in the embodiment of FIG. 5, each read circuit array may output image data via a common bus to a common physical signaling interface, or may output image data via a dedicated bus to a dedicated physical signaling interface coupled to each read circuit array.

Figure 6A:
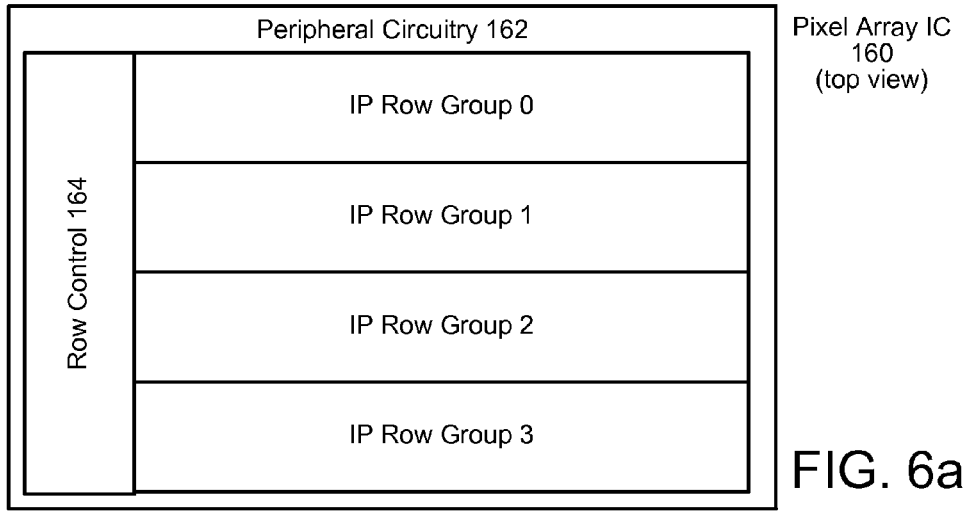
FIG. 6a illustrates a top view of a pixel array IC in an example two-layer image sensor system architecture alternative to FIGS. 4 and 5, according to one embodiment using, e.g., the array circuitry of FIG. 2.

FIG. 6a illustrates a top view of a pixel array IC in an example two-layer image sensor system architecture, according to one embodiment. The pixel array IC of FIG. 6a includes peripheral circuitry 162 surrounding an IP array. The IP array includes row control circuitry 164 and four row groups of IPs (IP Row Groups 0 through 3). Each IP row group is the width of the array and includes one-fourth of the rows in the array, and the row control circuitry provides control and reset signals needed for operation of the IPs (for instance, signals configured to cause the IPs to be enabled for reset and selected for readout, and any other signals discussed herein).

Figure 6B:
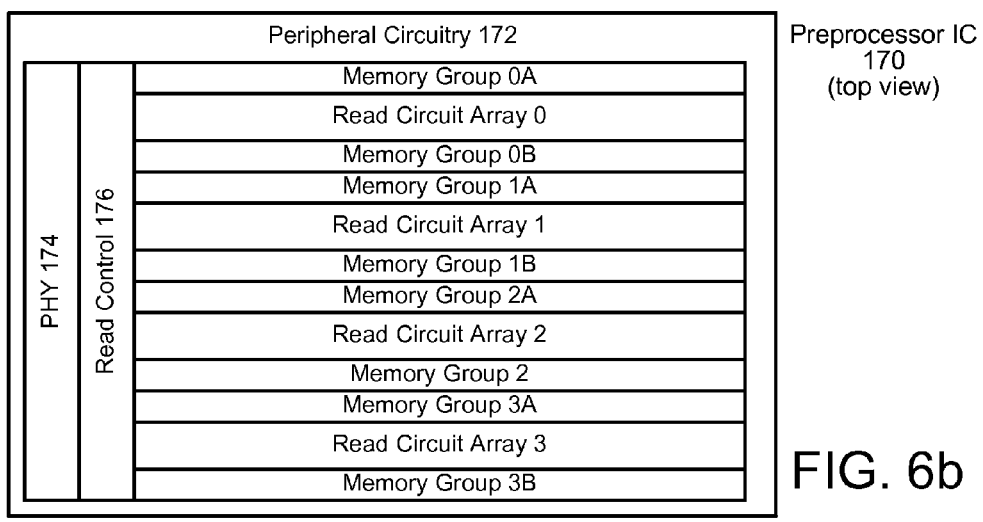
FIG. 6b illustrates a top view of a preprocessor IC in an example two-layer image sensor system architecture alternative to FIGS. 4 and 5, according to one embodiment using, e.g., the read circuitry of FIG. 3.

FIG. 6b illustrates a top view of a preprocessor IC in an example two-layer image sensor system architecture, according to one embodiment. The preprocessor IC of FIG. 6b includes peripheral circuitry 172 surrounding a read circuit array. The read circuit array includes a physical signaling interface 175 (which may alternately be on pixel array IC 160), read control circuitry 176, four read circuit arrays (read circuit array 0 through 3), and accompanying memory groups 0A/B, 1A/B, 2A/B, and 3A/B. Each read circuit array includes one or more read circuits (including an ADC, adder, and reset logic for each IP column) connected to corresponding rows in an associated memory group. When a particular IP row is selected in an IP row group of the pixel array IC, a corresponding row in the corresponding memory group is selected on the preprocessor IC.

Figure 6C:
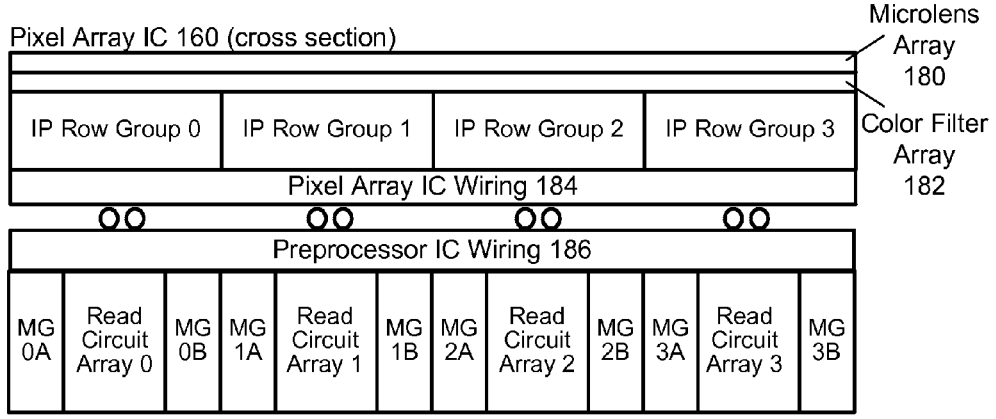
FIG. 6c illustrates a partial cross section of the pixel array IC of FIG. 6a and the preprocessor IC of FIG. 6b in an example two-layer image sensor system architecture, according to one embodiment.

FIG. 6c illustrates a cross section of the pixel array IC of FIG. 6a and the preprocessor IC of FIG. 6b in an example two-layer image sensor system architecture, according to one embodiment. In the embodiment of FIG. 6c, the pixel array IC 160 is located above the preprocessor IC 170 such that the bottom surface of the pixel array IC is coupled to the top surface of the preprocessor IC. A microlens array 180 and a color filter array 182 are located above the pixel array IC. The pixel array IC and the processor IC are coupled via pixel array IC wiring 184 and preprocessor IC wiring 186. By locating the pixel array IC above the preprocessor IC, the die size and percentage of surface area in the image sensor system capable of capturing light is increased. For instance, in a single-layer IC architecture including an IP array and one or more read circuit arrays, the portion of the single-layer IC including the one or more read circuit arrays are incapable of capturing light; such an embodiment reduces the percentage of silicon die used to capture light incident upon the single-layer IC. This requires the camera module footprint to be larger than the lens and the imaging array, and increases the cost and size of the camera module. The top-layer of the embodiment of FIG. 6c, in contrast, does not include read circuit arrays, so the die size of the top single layer IC is reduced to approximately the size of the IP array. Light incident upon the top-layer passes through the microlens array and the color filter array, is captured by the IPs in the IP array, and signals representative of the captured light are sampled by the read circuit arrays via the pixel array IC wiring and the preprocessor IC wiring.

Figures 7, 8, 9:
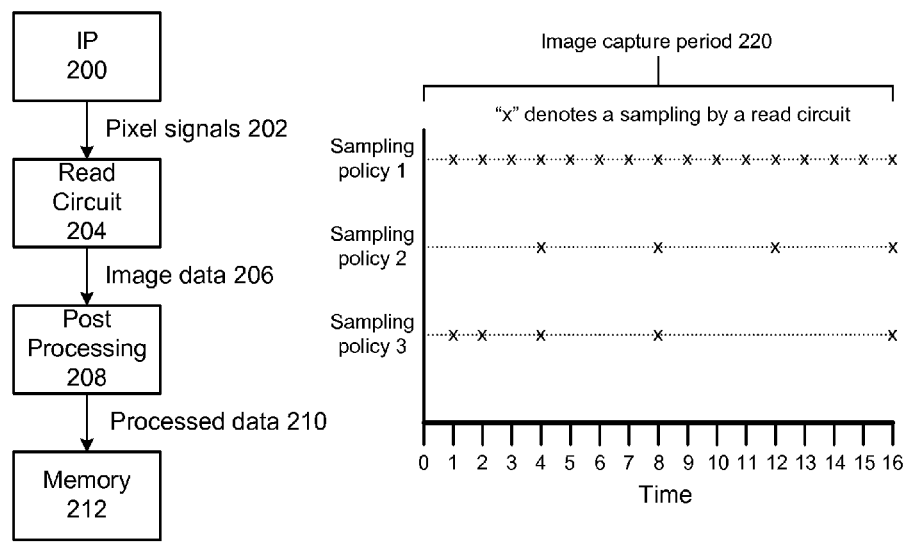
FIG. 7 illustrates the operation of an image sensor read circuit, such as the read circuit of FIG. 3, according to one embodiment.
FIG. 8 illustrates data flow in an image capture system, according to one embodiment useful with the systems described herein.
FIG. 9 illustrates various temporal sampling policies for use by an image sensor read circuit, such as the read circuit of FIG. 3, according to one embodiment.

FIG. 7 illustrates the operation of an image sensor read circuit, such as the read circuit of FIG. 3, according to one embodiment. In the example embodiment of FIG. 7, an image is captured over the course of 16 sampling intervals. The ADC of the example embodiment of FIG. 7 converts pixel signals to 5-bit digital values, and the accumulator accumulates 5-bit digital values into a 9-bit digital value during the image capture period. Further, in the embodiment of FIG. 7, the ADC converts received pixel signals into digital values representing the pixel signals such that each additional photon detected by an IP results in an increase in the digital value by one. For example, if an IP detects 5 photons after being reset, the pixel signal produced by the IP will be converted by the ADC into the value "00101". It should be emphasized that in other embodiments, the ADC converts received pixel signals into digital values representing the pixel signals such that multiple additional photons detected by an IP results in an increase in the digital value by one. In the embodiment of FIG. 7, pixel signals are analog voltages, and thus aren't shown in FIG. 7 for the purposes of simplicity.

At the beginning of the image capture period (sampling interval 0), a control signal is received configured to configure an IP of the read circuit to be reset and begin exposure. In the embodiment of FIG. 7, the "begin exposure" control signal also resets the value stored at the memory element corresponding to the IP to zero. In addition, a threshold signal is received to set the sampling threshold for the read circuit at a pixel signal equivalent to 20 photons.

During the first sampling interval, 4 photons are detected by the IP. The IP then produces a pixel signal representing the charge collected by a photosensitive element within the IP equivalent in response to detecting the 4 photons, and the ADC converts this pixel signal to the digital value "00100". Since the 4 detected photons do not trigger the sampling interval of 20 photons ("10100"), the accumulator does not accumulate the digital value "00100", and the charge stored by the IP is not dissipated (the IP is not reset). Note that the column "Photons (det.–accum.)" indicates first the number of photons detected by the IP during a particular sampling interval and second the number of accumulated photons since the last conditional reset of the IP.

During sampling interval 2, 7 additional photons are detected by the IP. The charge stored by the IP increases from the charge produced in response to detecting 4 photons during sampling interval 1 to a charge produced in response to detecting 11 accumulated photons (4 photons during sampling interval 1 and 7 photons during sampling interval 2). The pixel signal produced by the IP in response to the stored charge is converted to the digital value "01011". Since the total 11 photons do not trigger the sampling threshold of 20 photons, the accumulator does not accumulate the digital value "01011", and the IP is not reset. Similarly, during sampling interval 3, 2 additional photons are detected by the IP, and the charge stored by the IP increases to a charge produced in response to detecting 13 accumulated photons (4 photons during sampling interval 1, 7 during sampling interval 2, and 2 during sampling interval 3). The pixel signal produced by the IP in response to this increased stored charge is converted to the digital value "01101". Since the accumulated 13 photons do not trigger the sampling threshold of 20 photons, the accumulator does not accumulate the digital value "01101", and the IP is not reset.

During sampling interval 4, 11 additional photons are detected by the IP. The charge stored by the IP increases to a charge equivalent to detecting 24 accumulated photons (4 during sampling interval 1, 7 during sampling interval 2, 2 during sampling interval 3, and 11 during sampling interval 4). The pixel signal produced by the IP in response to the stored charge is converted to the digital value "11000". Since the accumulated 24 photons exceeds the sampling threshold of 20 photons, the adder accumulates the digital value "11000" into the memory element for the IP, and the IP is reset.

The 14 photons detected during sampling interval 5 do not exceed the sampling interval of 20, the digital value produced by the ADC, "01110" is not accumulated and the IP is not reset. The 8 photons detected during sampling interval 6 results in an accumulated detection of 22 photons by the IP (14 photons during sampling interval 5, and 8 during sampling interval 6), and the adder accumulates the digital value "10110" (resulting in a total accumulated value of "000101110" into the memory element), and the IP is reset.

This process is repeated for each of the 16 sampling intervals. The digital values produced by the ADC during sampling intervals 10, 14, and 15 are all accumulated in response to the sampling threshold of 20 photons being exceeded by the number of accumulated photons detected by the IP. Accordingly, the IPs are reset for the sampling intervals following these intervals (sampling interval 11, 15, and 16). During sampling interval 16, 19 photons are detected by the IP, which does not exceed the sampling threshold of 20 photons. In addition, during sampling interval 16, a residue signal is received configured to instruct the accumulator to accumulate the digital value produced by the ADC (the residue value 190, "10011"). Accordingly, the adder accumulates the value "10011" to the maintained accumulation value "001111011" in the memory element to produce the image data 195, "010001110". Finally, a reset signal is received during sampling interval 16, which enables the read circuit to output the image data and which resets the values output by the ADC and stored at the accumulator to zero subsequent to outputting the image data.

FIG. 8 illustrates pixel information flow in an image capture system, according to one embodiment. During the course of an image capture period, an IP 200 detects photons and outputs pixel signals 202 to the read circuit. In response, the read circuit 204 converts the received pixel signals to digital values representative of the receive pixel signals, and for each digital value associated with a pixel signal that exceeds a sampling threshold, accumulates the digital value and resets the IP. After the image capture period, the accumulated digital values are output as image data 206.

A post processing module 208 receives the image data 206 and performs one or more processing operations on the image data to produce the processed data 210. In one embodiment, a response function can be used to transform the image data 206 according to a desired response. For example, the image data can be transformed with a linear function or a logarithmic function based on the intensity of the light detected by the IP. The processed data is then stored in memory 212 for subsequent retrieval and processing. The IP 200, the read circuit 204, the post processing module, and the memory can be located within an IC, or can be located within separate coupled ICs.

FIG. 9 illustrates various temporal sampling policies for use by an image sensor read circuit, such as the read circuit of FIG. 3, according to one embodiment. In the embodiment of FIG. 9, an image is captured over an image capture period 220 equivalent to 16 time units. For each of the three illustrated sampling policies, an "x" indicates the sampling of a given IP by a read circuit.

In sampling policy 1, the read circuit samples the IP after each of the 16 time units. In sampling policy 2, the read circuit samples the IP after every 4 time units. As the read circuit in sampling policy 2 samples the IP less frequently than the read circuit in sampling policy 1, the IP in sampling policy 2 is more likely to saturate than the IP in sampling policy 1. However, the resources (processing, bandwidth, and power) required to implement sampling policy 2 (4 total samples) may be lower than the resources required to implement sampling policy 1 (16 total samples), since the read circuit in sampling policy 2 samples the IP only 25% as often as the read circuit in sampling policy 1.

In sampling policy 3, the read circuit samples the IP after time units 1, 2, 4, 8, and 16. The exponential spacing of the samplings of sampling policy 3 provide short sample intervals (for instance, the sample interval between time unit 0 and time unit 1) and long sample intervals (for instance, the sample interval between time unit 8 and time unit 16). Allowing for both short and long sampling intervals preserves the dynamic range of sampling policy 1 with nearly as few samplings as sampling policy 2 (5 samplings for sampling policy 3 vs. 4 samplings for sampling policy 2). Other sampling policies not illustrated in FIG. 9 may also be implemented by read circuits in the image sensor systems described herein. Depending on the overall length of an exposure interval or other scene- or user-dependent factors, different sampling policies can be selected to meet desired power, SNR, dynamic range, or other performance parameters.

High-SNR Image Sensor with Non-Destructive Threshold Monitoring

While the three-transistor (3T) pixel architecture shown in FIG. 2 is suitable for many applications, four-transistor (4T) designs having a "transfer gate" disposed between the photodiode and source follower (i.e., between node "$V_{DET}$" of photosensitive element 65 and element 74 in FIG. 2) provide a number of advantages. First, the now-isolated floating diffusion at the gate of the source follower may be reset (e.g., coupled to $V_{DD}$) without disturbing the charge state of the photodiode, thereby enabling a correlated double-sampling (CDS) operation in which the noise floor of the floating diffusion is sampled prior to charge integration and then subtracted from the subsequent sampling of the photodiode potential, canceling the noise and significantly improving the SNR. Another advantage is, counterintuitively, a more compact pixel design as the switched connection between the photodiode and source follower (i.e., via the transfer gate) enables the source follower, reset and access transistors to be shared among multiple photodiodes. For example, only seven transistors are required to implement a set of four "4T" pixels having a shared source follower, reset transistor and access transistor (i.e., four transfer-gates plus the three shared transistors), thus effecting an average of 1.75 transistors per pixel (1.75T).

In terms of pixel read-out, the direct connection between photodiode and source follower in a 3T pixel permits the charge state of the photodiode to be read-out without disturbing ongoing photocharge integration. This "non-destructive read" capability is particularly advantageous in the context of the conditional reset operation described above as the 3T pixel may be sampled following an integration interval and then conditionally permitted to continue integrating charge (i.e., not be reset) if the sampling operation indicates that the charge level remains below a predetermined threshold. By contrast, the charge transfer between photodiode and floating diffusion as part of a 4T pixel readout disrupts the state of the photodiode, presenting a challenge for conditional-reset operation.

In a number of embodiments described below in connection with FIGS. 10-14, a modified 4T pixel architecture is operated in a manner that dissociates the reset threshold from pixel sample generation to enable a non-destructive (and yet CDS) over-threshold determination. That is, instead of reading out the net level of charge accumulated within the photodiode (i.e., a pixel sampling operation) and conditionally resetting the photodiode based on that read-out (i.e., as in a 3T pixel sampling operation), a preliminary over-threshold sampling operation is executed to enable detection of an over-threshold state within the photodiode, with the full photodiode read-out (i.e., pixel sample generation) being conditionally executed according to the preliminary over-threshold detection result. In effect, instead of conditionally resetting the photodiode according to the pixel value obtained from full photodiode readout, full photodiode readout is conditioned on the result of a preliminary, non-destructive determination of whether the threshold has been exceeded; an approach enabled, in at least one embodiment, by dissociating the conditional-reset threshold from the pixel value generation.

Figure 10:
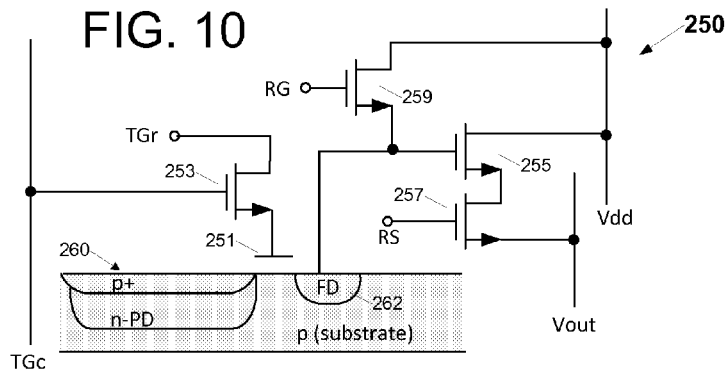
FIG. 10 illustrates an embodiment of a modified 4-transistor pixel in which a non-destructive over-threshold detection operation is executed to enable conditional-reset operation in conjunction with correlated double sampling.

FIG. 10 illustrates an embodiment of a modified 4T pixel 250, referred to herein as a "progressive read-out pixel," in which a non-destructive over-threshold detection operation is executed to enable conditional-reset operation in conjunction with correlated double sampling. As explained more fully below, the over-threshold detection involves a limited read-out of the photodiode state which, when determined to indicate an over-threshold condition, will trigger a more complete read-out of the photodiode state. That is, pixel 250 is read-out in a progression from a limited over-threshold detection read-out to a complete read-out (the latter being conditional according to the over-threshold detection result).

Still referring to FIG. 10, progressive read-out pixel 250 includes a transfer gate 251 disposed between a photodiode 260 (or any other practicable photosensitive element) and floating diffusion node 262, and a transfer-enable transistor 253 coupled between a transfer-gate row line (TGr) and transfer gate 251. The gate of transfer-enable transistor 253 is coupled to a transfer-gate column line (TGc) so that, when TGc is activated, the potential on TGr is applied (minus any transistor threshold) via transfer-enable transistor 253 to the gate of transfer-gate 251, thus enabling charge accumulated within photodiode 260 to be transferred to floating diffusion 262 and sensed by the pixel readout circuitry. More specifically, floating diffusion 262 is coupled to the gate of source follower 255 (an amplification and/or charge-to-voltage conversion element), which is itself coupled between a supply rail ($V_{DD}$ in this example) and a read-out line, Vout, to enable a signal representative of the floating diffusion potential to be output to read-out logic outside the pixel.

As shown, a row-select transistor 257 is coupled between the source follower and the read-out line to enable multiplexed access to the read-out line by respective rows of pixels. That is, row-select lines ("RS") are coupled to the control inputs of row-select transistors 257 within respective rows of pixels and operated on a one-hot basis to select one row of pixels for sense/read-out operations at a time. A reset transistor 259 is also provided within the progressive read-out pixel to enable the floating diffusion to be switchably coupled to the supply rail (i.e., when a reset-gate line (RG) is activated) and thus reset. The photodiode itself may be reset along with the floating diffusion by fully switching on transfer gate 251 (e.g., by asserting TGc while TGr is high) and reset transistor 259 concurrently, or by merely connecting the photodiode to a reset-state floating diffusion.

Figure 11:
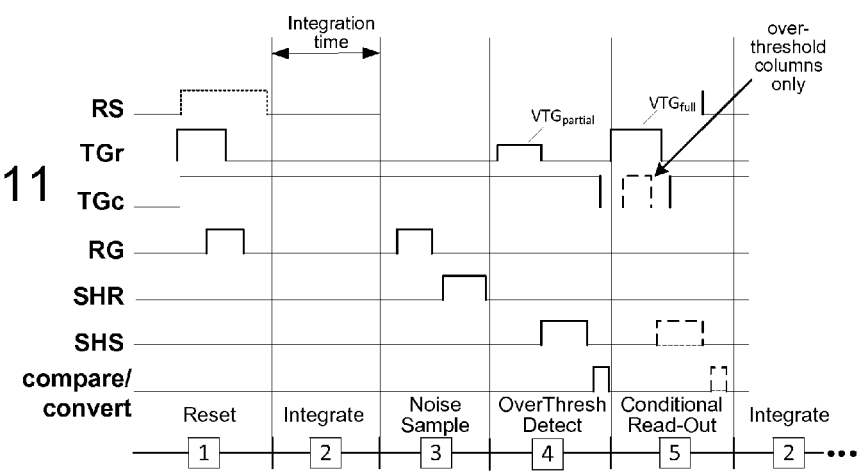
FIG. 11 is a timing diagram illustrating an exemplary pixel cycle within the progressive read-out pixel of FIG. 10.

FIG. 11 is a timing diagram illustrating an exemplary pixel cycle within the progressive read-out pixel of FIG. 10. As shown, the pixel cycle is split into five intervals or phases corresponding to distinct operations carried out to yield an eventual progressive read-out in the final two phases. In the first phase (phase 1), a reset operation is executed within the photodiode and floating diffusion by concurrently asserting logic high signals on the TGr, TGc and RG lines to switch on transfer-enable transistor 253, transfer gate 251 and reset transistor 259, thereby switchably coupling photodiode 260 to the supply rail via transfer gate 251, floating diffusion 262 and reset transistor 259 (the illustrated sequence can begin with an unconditional reset (e.g., at the start of a frame), and can also begin from a preceding conditional read-out/reset operation). To conclude the reset operation, the TGr and RG signals (i.e., signals applied on like-named signal lines) are lowered, thereby switching off transfer gate 251 (and reset transistor 259) so that the photodiode is enabled to accumulate (or integrate) charge in response to incident light in the ensuing integration phase (phase 2). Lastly, although the row-select signal goes high during the reset operation shown in FIG. 11, this is merely a consequence of an implementation-specific row decoder that raises the row-select signal whenever a given row address is decoded in connection with a row-specific operation (e.g., raising the TGr and RG signals during reset directed to a given row). In an alternative embodiment, the row decoder may include logic to suppress assertion of the row-select signal during reset as indicated by the dashed RS pulse in FIG. 11.

At the conclusion of the integration phase, the floating diffusion is reset (i.e., by pulsing the RG signal to couple the floating diffusion to the supply rail) and then sampled by a sample-and-hold element within the column read-out circuit. The reset and sample operation (shown as phase 3 in FIG. 11), in effect, samples the noise level of the floating diffusion and is executed in the embodiment shown by asserting the row-select signal for the pixel row of interest (i.e., the "$i^{th}$" pixel row, selected by RSi) while pulsing a reset-state sample-and-hold signal (SHR) to convey the state of the floating diffusion to the sample-and-hold element (e.g., a switch-accessed capacitive element) within the column read-out circuit via read-out line, Vout.

Figure 12:
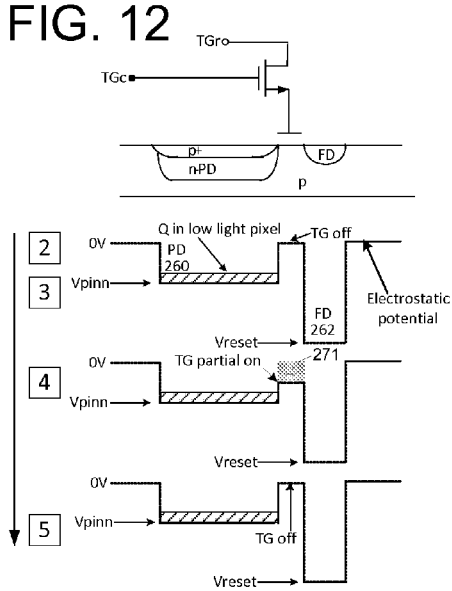
FIGS. 12 and 13 illustrate exemplary electrostatic potential diagrams for the photodiode, transfer gate and floating diffusion of FIG. 10 below their corresponding schematic cross-section diagrams.
Figure 13:
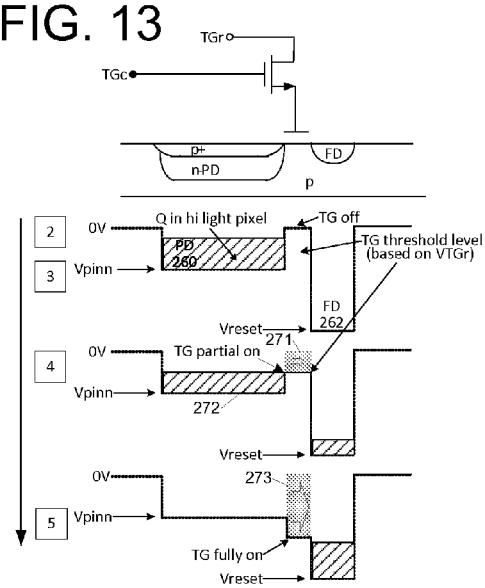

After acquiring the noise sample in phase 3, an over-threshold detection operation is executed in phase 4 by raising the TGr line to a partially-on, "over-threshold-detection" potential, $VTG_{partial}$, concurrently with switching on transfer-enable transistor 253 (i.e., by asserting a logic high TGc signal, although in this embodiment TGc is already on). By this operation, illustrated graphically in FIGS. 12 and 13, $VTG_{partial}$ is applied to transfer gate 251 to switch the transfer gate to a "partial on" state ("TG partial on"). Referring to FIGS. 12 and 13, electrostatic potential diagrams for photodiode 260 (a pinned photodiode in this example), transfer gate 251 and floating diffusion 262 are shown below their corresponding schematic cross-section diagrams. Note that the depicted levels of electrostatic potential are not intended to be an accurate representation of the levels produced in an actual or simulated device, but rather a general (or conceptual) representation to illustrate the operation of the pixel read-out phases. Upon application of $VTG_{partial}$ to transfer gate 251, a relatively shallow channel potential 271 is formed between photodiode 260 and floating diffusion 262. In the example of FIG. 12, the level of charge accumulated within the photodiode at the time of the over-threshold detection operation (phase 4) does not rise to the threshold level required for charge to spill over (i.e., be transferred) to the floating diffusion via the shallow channel potential of the partially-on transfer gate. Accordingly, because the accumulated charge level does not exceed the spillover threshold established by application of $VTG_{partial}$ to the control node of transfer gate 251, there is no spillover from the photodiode to the floating diffusion and the accumulated charge instead remains undisturbed within the photodiode. By contrast, in the example of FIG. 13, the higher level of accumulated charge does exceed the spillover threshold so that a portion of the accumulated charge (i.e., that subset of charge carriers that are above the transfer gate partially-on electrostatic potential) spills over into floating diffusion node 262, with the residual accumulated charge remaining within the photodiode as shown at 272.

Still referring to FIGS. 11, 12 and 13, prior to conclusion of over-threshold detection phase 4, the charge level of the floating diffusion is sampled and held within a signal-state sample-and-hold element (i.e., in response to assertion of signal SHS) to yield a threshold-test sample—the difference between the signal-state sample and the previously obtained reset-state sample—to be evaluated with respect to a conditional-reset threshold. In one embodiment, the conditional-reset threshold is an analog threshold (e.g., to be compared with the threshold-test sample in a sense amplifier in response to assertion of a compare/convert strobe signal) set or programmed to a setting above the sampling noise floor, but low enough to enable detection of minute charge spillover via the shallow transfer gate channel. Alternatively, the threshold-test sample may be digitized in response to assertion of the compare/convert signal (e.g., within an analog-to-digital converter that is also used to generate the finalized pixel sample value) and then compared with a digital conditional-reset threshold, again, set (or programmed to a setting) above the noise floor, but low enough to enable detection of trace charge spillover. In either case, if the threshold-test sample indicates that no detectable spillover occurred (i.e., threshold-test sample value is less than conditional-reset spillover threshold), then the photodiode is deemed to be in the under-threshold state shown in FIG. 12 and the TGc line is held low in the ensuing conditional read-out phase (phase 5, the final phase) to disable transfer gate 251 for the remainder of the progressive read-out operation—in effect, disabling further read-out from the photodiode and thus enabling the photodiode to continue integrating charge without disruption for at least another sampling interval. By contrast, if the threshold-test sample indicates a spillover event (i.e., threshold-test sample greater than conditional-reset/spillover threshold), then the TGc line is pulsed during the conditional read-out phase concurrently with application of a fully-on, "remainder-transfer" potential, $VTG_{full}$, to the TGr line, thereby enabling the remainder of the charge (i.e., charge 272 as shown in FIG. 13) within photodiode 260 to be transferred to floating diffusion 262 via the full-depth transfer-gate channel (273) so that, between the over-threshold transfer in phase 4 and the remainder transfer in phase 5, the charge accumulated within the photodiode since the hard reset in phase 1 is fully transferred to the floating diffusion where it may be sensed in a pixel read-out operation. In the embodiment shown, the pixel-readout operation is effected by pulsing the SHS signal and compare/convert strobe in sequence during conditional read-out phase 5, though either or both of those pulses may optionally be suppressed in absence of an over-threshold detection. Note that conditional read-out of the photodiode (i.e., effected by pulsing TGc in conjunction with application of $VTG_{full}$ on TGr) effectively resets the photodiode (i.e., drawing off all charge to the floating diffusion), while suppression of the conditional read-out leaves the integration state of the photodiode undisturbed. Accordingly, execution of the conditional read-out operation in phase 5 conditionally resets the photodiode in preparation for integration anew in the succeeding sampling interval (subframe) or refrains from resetting the photodiode to enable cumulative integration in the subsequent sampling interval. Thus, in either case, a new integration phase follows phase 5, with phases 2-5 being repeated for each subframe of the overall frame (or exposure) interval, before repeating the hard reset in a new frame. In other embodiments, where cumulative integration is permitted across frame boundaries, the hard reset operation may be executed to initialize the image sensor and omitted for an indeterminate period of time thereafter.

Figure 14:
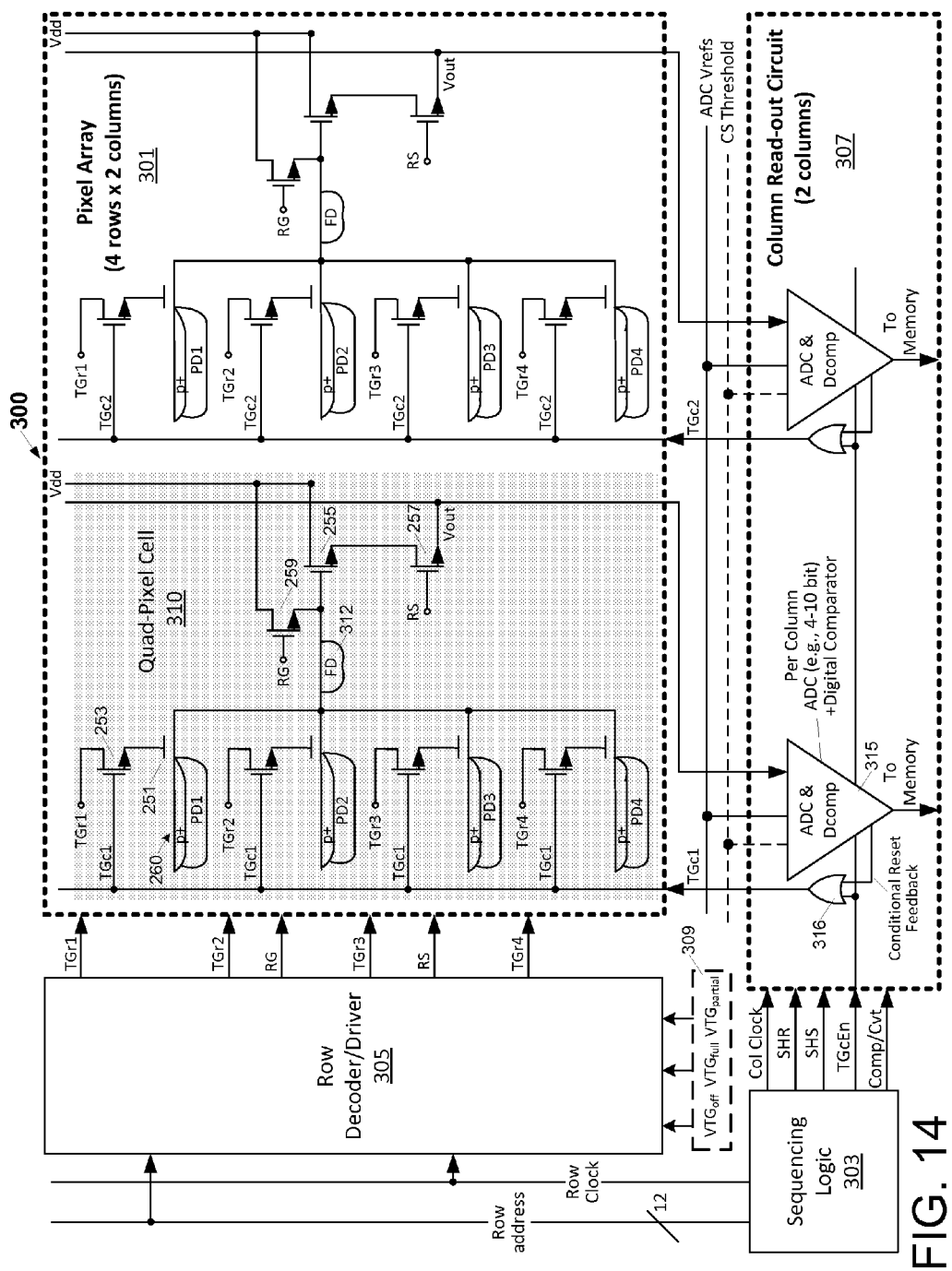
FIG. 14 illustrates an embodiment of an image sensor 300 having a progressive-readout pixel array.

FIG. 14 illustrates an embodiment of an image sensor 300 having a progressive-readout pixel array 301, sequencing logic 303, row decoder/driver 305 and column read-out circuit 307. While pixel array 301 is shown to include four rows and two columns of shared-element pixels, other embodiments may include many more pixel rows and columns to implement, for example, a multi-megapixel or gigapixel image sensor. The column read-out circuit 307 (for which two columns of read-out circuitry are depicted) and row decoder/driver 305 may likewise be scaled to meet the number of pixels in the pixel array.

In the embodiment shown, each column of the pixel array is populated by shared-element pixels in which every four pixels form a quad pixel cell 310 and contain respective photodiodes 260 (PD1-PD4), transfer gates 251, and transfer-enable transistors 253, but share a floating diffusion node 312, reset transistor 259, source follower 255 and row-select transistor 257. By this arrangement, the average transistor count per pixel is 2.75 (i.e., 11 transistors/4 pixels), thus effecting a relatively efficient, 2.75T-pixel image sensor.

As shown, row decoder/driver 305 outputs a shared row-select signal (RS) and reset-gate signal (RG) to each row of quad-pixel cells 310, and outputs independent row transfer-gate control signals (TGr1-TGr4) to drain terminals of respective transfer-enable transistors 253. In an embodiment in which row decoder/driver 305 sequences incrementally through the rows of the array (e.g., pipelining reset, integration and progressive read-out operations with respect to the rows of pixel array 301 such that one row is read-out after another), the row decoder/driver may include logic to assert the RG, RS and TGr signals at the appropriate time for each row (e.g., synthesizing those signals with respect to a row clock from sequencing logic 303). Alternatively, row decoder/driver 305 may receive individual timing signals corresponding to each or any of the RG, RS and TGr signals, multiplexing any individual enable pulse onto the corresponding RG, RS, or TGr lines of a selected row at the appropriate time. In one embodiment, the row decoder/driver receives transfer-gate control voltages corresponding to the off, partially-on and fully-on states shown in FIGS. 11, 12 and 13 (i.e., $VTG_{off}$, $VTG_{partial}$, $VTG_{full}$) from an on-chip or off-chip programmable voltage source 309, switchably coupling each of the different control voltages to a given transfer-gate row line at a deterministic time, for example, as shown in FIG. 11. In alternative embodiments, more than one voltage source 309 may be provided within image sensor 300 to enable transfer-gate control voltages to be locally calibrated and thus compensate for control-voltage and/or performance variations (i.e., non-uniformity) across the pixel array.

Still referring to the embodiment of FIG. 14, column read-out circuit 307 includes a bank of read-out circuits 315, each implementing a digital threshold comparator and a relatively low bit-depth analog-to-digital converter (e.g., a 4-10 bit ADC, though lower or higher bit depth ADCs may be employed) to execute the over-threshold detection and conditional sampling operations, respectively, discussed in connection with FIGS. 11-13. In one implementation, the threshold comparator and ADC are implemented by separate circuits so that the pixel sample value may be generated without regard to the conditional-reset threshold applied in the over-threshold determination. Through this approach, the conditional-reset threshold is dissociated from the reference signals ("ADC Vrefs") used in the ADC conversion, freeing the conditional-reset threshold and ADC reference voltages to be independently adjusted (e.g., through reprogramming a threshold-reference generator) dynamically during or prior to sensor operation to achieve calibration and/or compensate for changing operating conditions or sub-optimal imaging results. In an alternative embodiment, the threshold comparator may be implemented as part of the ADC (e.g., using a reference applied in connection with resolving the digital sample value as the conditional-reset threshold), potentially reducing the footprint of the column read-out logic through more compact circuit design.

In the embodiment shown, the sequencing logic delivers a column clock, sample-and-hold strobes (SHR, SHS, which are applied to enable signal storage within sample-and-hold elements at the front-end of the ADC/threshold comparator), and compare/convert strobe to the column read-out logic to enable the operational timing shown, for example, in FIG. 11. That is, during the over-threshold detection phase (i.e., phase 3), the read-out circuit for a given pixel column asserts (or maintains assertion of) the TGc line (e.g., in response to assertion of a TGcEn signal from sequencing logic 303 and logic OR gate 316) so that, when the row decoder/driver switches the TGr line for a given pixel row to the partially-on potential (e.g., $VTG_{partial}$, which is applied to the transfer gates of the pixel row), execution of the over-threshold detection operation described above is enabled. Accordingly, the threshold comparator within each read-out circuit evaluates the state of the threshold-test sample (which is generated according to the state of shared floating diffusion 312 following application of $VTG_{partial}$ to the transfer gate of a given photodiode) with respect to the conditional-reset threshold to yield a binary over-threshold result. If an over-threshold condition is detected, the read-out circuit raises the TGc signal again a short time later (i.e., in conjunction with the fully-on TGr potential ($VTG_{full}$) to effect a conditional read-out operation, enabling a full read-out of the photodiode state onto Vout and resetting the photodiode) and executes an analog-to-digital conversion operation in response to assertion of the compare/convert strobe to yield a digitized pixel sample.

Read-Out Circuitry

FIGS. 15A-15C illustrate alternative column read-out circuit embodiments that may be employed in connection with the exemplary progressive read-out pixels described above. FIG. 15A, for example, illustrates a column read-out circuit 350 formed by sample-and-hold bank 351, analog-to-digital converter (ADC) 353, sense amplifier 355 and ADC-enable gate 357. Sample-and-hold (S/H) bank 351 includes switch elements and analog storage elements (e.g., capacitive elements) to enable the reset-state and signal-state of a selected pixel (delivered via column "Vout" line) to be sampled and held in response to assertion of reset-state and signal-state control signals. In one embodiment, the pixel reset-state and signal-state signals are output differentially (e.g., signal-state−reset-state) from S/H bank 351, thus enabling sense amplifier 355 and ADC 353 to receive measurement signals that reflect the state of the floating diffusion less a variable (i.e., noisy) reset level. In the embodiment shown, sense amplifier 355 and ADC 353 receive separate reference signals ("SA Ref" and "ADC Refs") for application in over-threshold detection and ADC operations, respectively. More specifically, when a compare-strobe signal ("Compare") is pulsed, a threshold comparison is triggered within sense amplifier 353, yielding a logic high or low comparison result according to whether the S/H signal output (and thus the noise-corrected pixel signal-state) exceeds the sense-amp reference signal (i.e., a spill-over threshold or conditional-reset threshold as described above). The comparison result is fed back to the pixel column as the conditional-reset signal discussed above, and is also supplied to logic gate 357 to selectively enable an analog-to-digital conversion operation within ADC 353. That is, if sense amplifier 355 signals an over-threshold condition (a logic '1' comparison result in this example), then an ensuing convert-strobe pulse ("Convert") is enabled to pass through logic AND gate 357 (i.e., by virtue of the high sense-amp output) to a convert-enable input of ADC 353, thereby triggering the ADC operation. In one embodiment, a buffer 359 is provided to store the resulting N-bit ADC value (e.g., an 8-bit to 12-bit value in a number of embodiments, though higher or lower resolutions may apply in all cases), as well as the comparison result from sense amplifier 355, the latter forming a validity bit "V" that qualifies ADC content within buffer 359 as containing valid or non-valid data. Accordingly, if no detectable spillover has occurred within the pixel being read-out, the logic-low comparison result will not only suppress the ADC operation (saving power), but also qualify the content of the read-out buffer, thereby permitting compression of the outgoing data stream. This result is indicated in the timing waveform at 360 by the dashed ADC data transmission—showing generation and transmission of ADC data only if the pixel measurement exceeds the spillover threshold (V=1).

FIG. 15B illustrates an alternative read-out circuit embodiment 365 that lacks a sense amplifier and instead applies ADC circuit 353 to perform both the threshold comparison and, if necessary, generation of ADC data corresponding to full pixel read-out. As before, S/H bank 351 outputs a measurement signal that reflects the difference between the signal-state and reset state during spillover (partial read-out) and full read-out operations. A compare-strobe ("Compare"), when asserted, is applied via logic OR gate 368 to an enable-convert input of the ADC to enable an ADC operation with respect to the measurement signal acquired during a partial-read operation (i.e., application of $VTG_{Partial}$ to the transfer gate of a selected pixel as discussed above). If the ADC output exceeds a digital threshold value (i.e., a multi-bit digital value or digital number), comparator 367 asserts a conditional-reset/over-threshold signal (e.g., to a logic '1' state in the example shown), thereby enabling an ensuing convert-strobe pulse ("Convert") to pass through logic AND gate 369 (and logic OR gate 368) to trigger another ADC operation, this time with respect to a measurement signal acquired during a full read-out operation. As in the embodiment of FIG. 15A, the conditional-reset signal is driven back to the pixel column to enable the full-read (and pixel reset) operation within the subject pixel, and is also output to read-out buffer 359 to be stored as a validity bit, qualifying the corresponding ADC data content of that buffer. Although the compare-strobe, convert-strobe and transmit-data waveforms in the embodiment of FIG. 15B (i.e., shown at 370) are illustrated as matching those in FIG. 15A, a somewhat larger delay may be imposed between the compare-strobe and convert-strobe pulses to account for the additional time required within ADC to digitize the S/H partial-read measurement. In both cases, the interval between the compare-strobe and convert-strobe pulses may be different from the intervals shown, for example, to align the read-out timing operations with the pixel operations described above (e.g., as shown in FIG. 11).

FIG. 15C illustrates a variation (375) of the read-out circuit embodiment of FIG. 15B. In general, the sequence of read-out operations is as discussed in reference to FIG. 15B except that the partial-read ADC output is latched within read-out buffer 377 and, if under-threshold (i.e., no conditional reset and thus no subsequent full-read ADC output), the digitized partial-read measurement is transmitted off chip together with an over-threshold bit (OT) that indicates whether the over-threshold condition has been detected. If the partial-read ADC output exceeds the spillover threshold, then the full-read measurement is digitized in a second ADC operation and stored within the read-out buffer, overwriting the partial-read ADC value. By this operation, a valid pixel read-out value, reflecting either a partial read-out (OT=0) or a full read-out (OT=1) is transmitted to an external destination regardless of whether the spillover threshold is exceeded, thus permitting a sequence of partial-readout values to be accumulated (integrated) within the final pixel value. Note that storage and transmission of the OT bit may be omitted, particularly in embodiments in which ADC measurements are aggregated or otherwise combined without regard to whether their acquisition occurred in a full or a partial read-out operation.

Image Decimation and Pixel Binning

A number of conditional-reset image sensor embodiments described herein are operable in decimation modes that yield less than maximum image resolution. For example, in one embodiment an image sensor capable of generating an 8 MP (8 megapixel) output in a still-image mode, yields a 2 MP output in a decimated, high-definition (HD) video mode; a 4:1 decimation ratio (higher or lower resolutions may apply in each mode, and other decimation modes and ratios may be achieved in alternative embodiments; also, if the still and video frame aspect ratios differ, some areas of the sensor may not be used at all in one or the other modes).

While post-digitization logic may be provided to decimate full-resolution data (e.g., on-chip logic at the output of the ADC bank or off-chip processing logic), pixel charge aggregation or "binning" within the pixel array and/or voltage binning within sample-and-hold storage elements is applied in a number of embodiments to effect pre-digitization (i.e., pre-ADC and thus analog) decimation, obviating die-consuming and power-consuming digital binning logic and, in many cases, yielding improved signal-to-noise ratio in the decimated output.

FIG. 16 illustrates a quad-pixel, shared floating diffusion image sensor architecture in which the row and column transfer-gate control lines (TGr and TGc) disclosed in the embodiments above are applied in a manner that enables multiple decimation modes without requiring additional array-traversing control lines. More specifically, by centralizing a shared floating diffusion 401 between four pixels (each including a respective photodiode, PD1-PD4, and transfer-enable transistor, 403.1-403.4, and transfer gate, 404.1-404.4) and splitting the column transfer-gate control line TGc into separate odd and even column-enable lines (TGc1 and TGc2, each coupled to a respective logic OR column-line driver 421, 423), it becomes possible to charge-bin all or any subset of the pixels in a decimation mode and also to operate and read-out each pixel individually a non-decimated (full-resolution) mode.

In the particular embodiment shown, the shared floating diffusion 401 (illustrated in two interconnected parts for drawing simplicity) is switchably coupled to photodiodes PD1-PD4 of the four pixels through respective transfer gates 404.1-404.4, with each transfer gate controlled by a different pair of TGr and TGc signals within the control signal matrix. That is, transfer gate 404.1 is controlled by transfer-enable transistor 403.1 via control signals TGr1/TGc1, transfer gate 404.2 is controlled by transfer-enable transistor 403.2 via control signals TGr2/TGc1, transfer gate 404.3 is controlled by transfer-enable transistor 403.3 via control signals TGr1/TGc2 and transfer gate 404.4 is controlled by transfer-enable transistor 403.4 via control signals TGr2/TGc2. As in the shared-element pixel arrangements described above, the shared floating diffusion 401 is coupled to a shared source follower 405, row-select transistor 407 and reset transistor 409, thus enabling a more compact quad-pixel layout. Moreover, as shown in the exemplary physical-layout diagram of FIG. 17, the four transfer gates ("TG") may be physically disposed at the corners of a centralized floating diffusion (FD) with transfer-enable transistors, reset gate, source follower and row-select transistors formed at the periphery of the quad-pixel layout, thus effecting a highly compact quad-pixel footprint that may be repeated in row and column dimensions across a multi-megapixel array.

FIGS. 18A and 18B illustrate color filter array (CFA) patterns that may be employed with respect to the quad-pixel architecture of FIGS. 16 and 17 and that may dictate practical decimation modes. In the CFA pattern of FIG. 18A, for example, the green corner pixels (G) that include photodiodes PD1 and PD4 (i.e., PD1 and PD4 are disposed beneath green color filter elements) may be binned in a 4:3 charge-binning decimation mode, while in the CFA pattern of FIG. 18B, which includes, white, green, red and blue color filters, both pairs of corner pixels in each quad-pixel (i.e., the pixels that photodiodes PD1 and PD4, and the pixels that include photodiodes PD2 and PD3) may be charge-binned in a 4:2 decimation mode. Other charge-binning arrangements may be employed with respect to other CFA patterns and/or black & white (or grayscale) imaging.

FIGS. 19 and 20 present timing diagrams illustrating exemplary phases of full-resolution (non-binning) and binned-mode pixel read-out operations, respectively, within an image sensor containing the 2×2 quad-pixel arrangement shown in FIG. 16. For purposes of example, different read-out gain configurations are assumed during partial read-out (threshold testing) and full-read out operations within each of the timing diagrams, with separate sets of sample and hold elements being applied to capture reset-state and signal-state samples during those read-out operations. Examples of different gain configuration circuits and their benefits are described below in reference to FIGS. 25A-25C, 26 and 27.

Turning first to the full-resolution read-out of FIG. 19, a reset operation is performed in phase 1 (delineated at the bottom of the timing diagram) by fully asserting the transfer-gate row signal as shown at 420 for the row being read-out (TGri), together with the odd and even transfer-gate column signals (TGc1, TGc2), thereby applying the full read-out potential to the transfer gates for the even and odd columns within the selected row to enable charge transfer from the corresponding photodiodes to the shared floating diffusion (i.e., resetting the photodiodes to an initial state in preparation for charge integration). After lowering the TGri signal, the reset-enable signal (RG) is pulsed at 422 to switch on the reset transistor and thus reset the floating diffusion. During integration phase 2 (duration not shown to scale), charge is integrated/accumulated within the photodiodes according to the intensity of the incoming light. During odd-column threshold-testing phase 3a, the RG signal is pulsed a second time at 424 to reset the floating diffusion, and reset-state sample-and-hold signals SHRsa and SHRadc are pulsed at 426 and 428 while row-select line RSi is high to enable the reset-state of the floating diffusion to be sampled within the sample-and-hold elements for the sense amplifier and ADC, respectively. After the reset-state of the floating diffusion is sampled, the even column transfer-gate signal (TGc2) is lowered (while TGc1 is held high) and TGri is raised to the $VTG_{partial}$ potential to enable a threshold-test read-out with respect to the odd-column pixel. At 430, a signal-state sample-and-hold signal, SHSsa, is raised to enable a sample of the floating diffusion state (i.e., any spillover charge therein) to be captured within a sample-and-hold element for the sense-amplifier, and, at 432, the compare-strobe signal ("Compare") is pulsed to enable the sense amplifier component of the read-out circuit to generate a comparison result between the floating diffusion signal state (less the reset state) and the conditional-reset (spillover) threshold.

The odd-column transfer-gate signal (TGc1) is lowered following capture of the floating diffusion signal-state at 432 and prior to raising the row transfer-gate signal to the fully-on ($VTG_{full}$) potential in odd-pixel, conditional read-out phase 4a. More specifically, if the comparison result indicates an under-threshold condition, the TGc1 line is held low while TGri is raised to the $VTG_{full}$ potential, thereby suppressing the full pixel read-out and allowing the charge integrated within the photodiode during integration phase 2 to remain undisturbed and serve as the initial state during a subsequent integration interval (i.e., continued integration). By contrast, if the sense-amp comparison result indicates an over-threshold condition (i.e., the charge accumulated during integration phase 2 exceeds the conditional-reset threshold), then the TGc1 line is raised as shown by the dashed pulse at 434 concurrently with application of the $VTG_{full}$ potential on TGri, thereby applying $VTG_{full}$ to the odd-pixel transfer gate to enable a full pixel read-out operation. Shortly thereafter, just prior to the conclusion of the odd-pixel conditional read-out, signal-state sample-and-hold signal SHSadc is pulsed (as shown at 436) to capture a sample of the odd-pixel read-out signal within the signal-state sample-and-hold element for the ADC. At 438, after capturing the odd-pixel read-out signal in the ADC sample-and-hold element, the convert-strobe is pulsed to trigger an ADC operation with respect to the differential between the reset-state and signal-state samples captured within the ADC sample-and-hold elements.

At the conclusion of the odd-pixel conditional read-out (i.e., phase 4a), the row transfer-gate signal is lowered so that, in the ensuing even-pixel threshold testing phase 3b, assertion of the odd-pixel column transfer-gate signal TGc1 at 440 drives the odd-pixel transfer gate low (ensuring isolation between the photodiode and floating diffusion), thus enabling the floating diffusion to be reset by the RG pulse at 442 without disturbing the odd-column pixel state. Still in phase 3b, the even-column transfer gate signal is raised at 446 concurrently with assertion of the SHRsa pulse at 448 to acquire a reset-state sample of the floating diffusion. As in the odd-pixel threshold test, the row transfer-gate signal TGri is raised to the partially-on potential (VTGpartial) at 450 (while TGc2 remains high), thereby enabling charge spillover from the even-pixel photodiode to the floating diffusion if an over-threshold condition exists within the photodiode. At 452, SHSsa is pulsed to sample the even-pixel signal-state and the compare-strobe is pulsed at 454 to enable an even-pixel over-threshold determination (even-pixel signal-state less floating diffusion reset-state) within the read-out sense-amplifier. As with the odd-pixel, if the comparison result from the sense amplifier indicates an over-threshold condition, the even-pixel column transfer gate signal is asserted at 456 concurrently with elevation of the TGri potential to the fully-on level (VTG$_{full}$), thus enabling a full read-out of the even-pixel signal state followed by assertion of the SHSadc and convert-strobe signals (at 458 and 460, respectively) to yield an even-pixel ADC result. If the comparison result from the sense amplifier indicates an under-threshold condition, the TGc2 pulse at 456 is suppressed to avoid disturbing the state of the even-pixel photodiode, thus leaving the charge on the photodiode intact for continued integration.

Still referring to FIG. 19, in data-transfer phase 5, the row-i ADC values for the even and odd pixels are transmitted (e.g., to an off-chip image processing destination) one after another to an on-chip or off-chip image processing destination. As discussed above, in the case of an under-threshold condition with respect to a given pixel, analog-to-digital conversion with respect to that pixel may be suppressed and/or the ADC output omitted from the outgoing data stream. In any case, data transmission with respect to a selected pixel row may be pipelined with pixel read-out operations within subsequent rows as shown, for example, by the transmission of row i−1 data concurrently with phases of the read-out operation with respect to row i pixels.

In the binned-mode read-out timing diagram of FIG. 20, hard-reset and integration operations (phases 1 and 2) are executed as described above in reference to FIG. 19, as is the floating diffusion reset (i.e., asserting RG while TGc1 and TGc2 are high, and sampling the reset-state in response to assertion of the SHRsa and SHRadc signals) at the start of threshold-testing phase 3. Thereafter, partial read-out operations are executed one after another with respect to corner pixels (i.e., containing photodiodes PD1 and PD4, in the example shown), by driving TGr1 to the partially-on state at 476 concurrently with assertion of TGc1 and deassertion of TGc2, and then driving TGr2 to the partially-on state at 478 concurrently with assertion of TGc2 and deassertion of TGc1. By this operation, any spillover charge from photodiodes PD1 and PD4 is aggregated in the floating diffusion and thus captured within the sense amp sample-and-hold element when SHSsa is asserted at 480. Accordingly, assertion of the compare-strobe signal at 482 enables a comparison of the aggregated the spillover charge from PD1 and PD4 (less the reset-state of the floating diffusion) and the conditional reset/conditional read-out threshold. If the comparison result indicates an over-threshold condition, TGc1 and TGc2 are pulsed one after another at 484 and 486 (and each concurrently with assertion of the VTG$_{full}$ potential on corresponding row lines TGr1 and TGr2, respectively) to enable the remainder of the charge accumulated within the corner photodiodes (PD1 and PD4) to be transferred to the floating diffusion, charge binning the pixel integration results and resetting each pixel in preparation for the next charge integration interval. Accordingly, when the SHSadc signal is pulsed at 488, the photodiode charge binned (or aggregated) within the floating diffusion is captured within the signal-state sample and hold element for the ADC, thus enabling an ADC operation with respect to the combined charge from the corner pixels (less the floating diffusion reset state) when the convert-strobe is pulsed at 490. The resulting digitized pixel value (i.e. ADC output) for row i may be transmitted to off-chip or on-chip processing logic during read-out of the following pair of pixel rows.

Still referring to FIG. 20, if the comparison result output by the read-out sense amplifier indicates an under-threshold condition, the TGc1 and TGc2 signal assertions shown at 484 and 486 are suppressed to avoid disturbing the contents of the subject photodiodes, thereby permitting continued integration during a subsequent subframe interval. While the timing sequence shown yields the output of binned results from the corner pixels containing photodiodes PD1 and PD4 (i.e., northwest and southeast corners in the layout shown in FIGS. 16 and 18), the waveforms output onto signal lines TGc1 and TGc2 may be swapped to yield binned results from corner pixels containing photodiodes PD2 and PD3. Further, read-out of the aggregated (binned) charge within all four photodiodes may be effected by performing additional partial-read operations in phase 3 (i.e., repeating the TGr1, TGr2 partial-on pulses, but reversing the assertion sequence of column transfer gate signals TGc1 and TGc2 to effect partial-reads of photodiodes PD2 and PD3), and then, if an over-threshold result is detected, performing additional full read-out operations in phase 4 (i.e., repeating the TGr1 and TGr2 fully-on pulses, but reversing the assertion sequence of column transfer gate signals TGc1 and TGc2).

Figure 21:
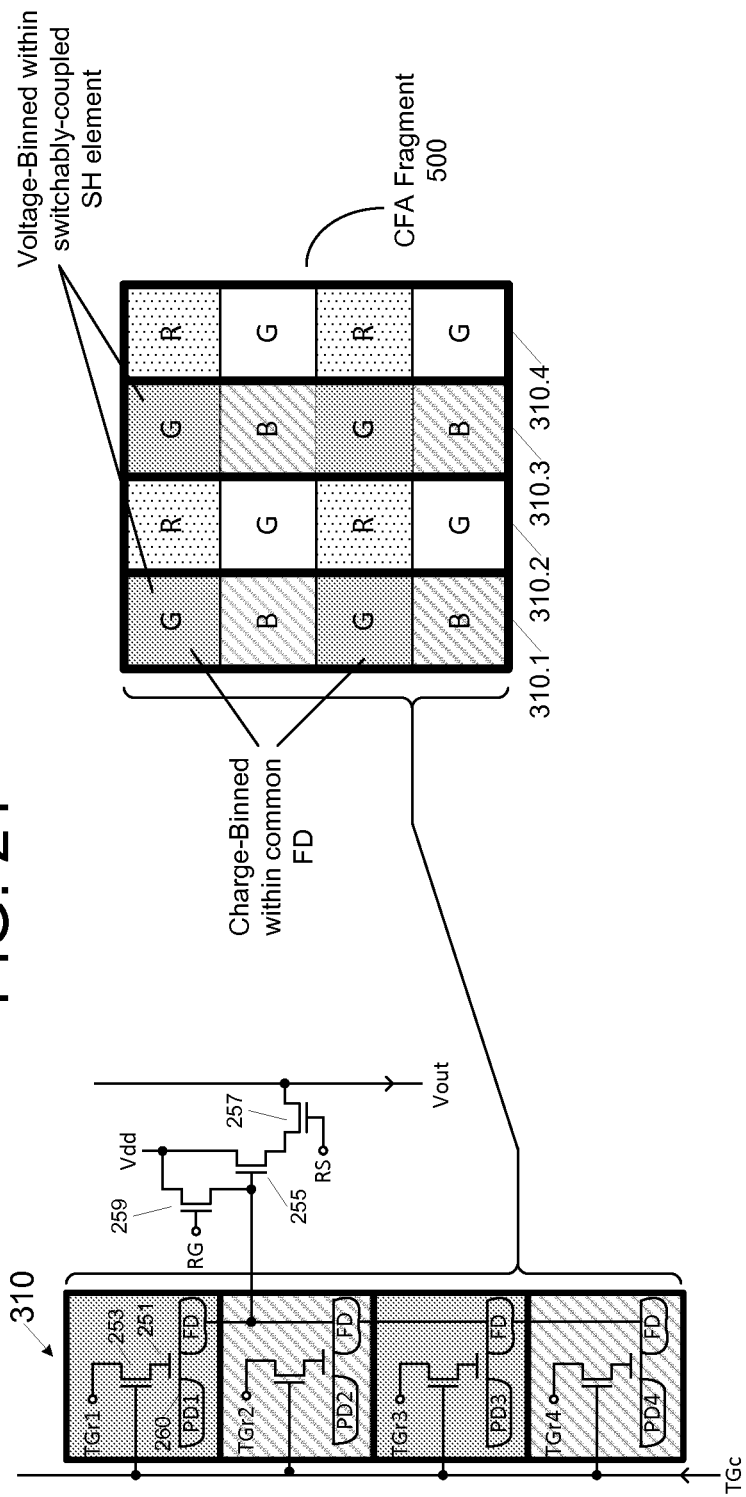
FIG. 21 illustrates an alternative binning strategy that may be executed with respect a collection of 4×1 quad-pixel blocks in conjunction with a color filter array.

FIG. 21 illustrates an alternative binning strategy that may be executed with respect to a collection of 4×1 quad-pixel blocks 310 and the color filter array (CFA) fragment shown at 500. In the embodiment shown, each quad pixel block 310 (shown at 310.1-310.4 with respect to the CFA fragment) is implemented generally as described in reference to FIG. 14 and may be read-out according to any of the read-out techniques described in reference to FIGS. 14 and 15A-15C. As shown, CFA fragment 500 (i.e., a sufficient portion of a sensor-wide CFA to demonstrate the CFA pattern) includes collections of like colored filter elements at the corner pixels of each 3×3 pixel group. Thus, green filter elements are disposed over shaded pixels 'G', blue filter elements are disposed over striped pixels 'B' and red filter elements are disposed over hashed pixels 'R'. In this arrangement, each pair of like-filtered pixels (i.e., subject to light filtered by same-color filter elements, R, G or B) disposed in the same quad-pixel block thus permit charge binning within their shared floating diffusion as detailed below. Further, referring to FIG. 22, by fixing column offset between the pixel pair within each column and the like-filtered pair of pixels coupled to the same row lines (i.e., fixed at a spacing of two columns in the example shown) and by providing switching elements at the column read-out points of pixel array 551

(i.e., switching elements 561 and 562 within sample-and-hold circuitry 553), it becomes possible to "voltage-bin" the results of the two charge-binned pixel pairs within sample-and-hold circuitry 553, thus combining (i.e., aggregating, binning) the four corner pixels in each 3×3 pixel group prior to digitization within the ADC elements of SA/ADC block 555.

Figure 22:
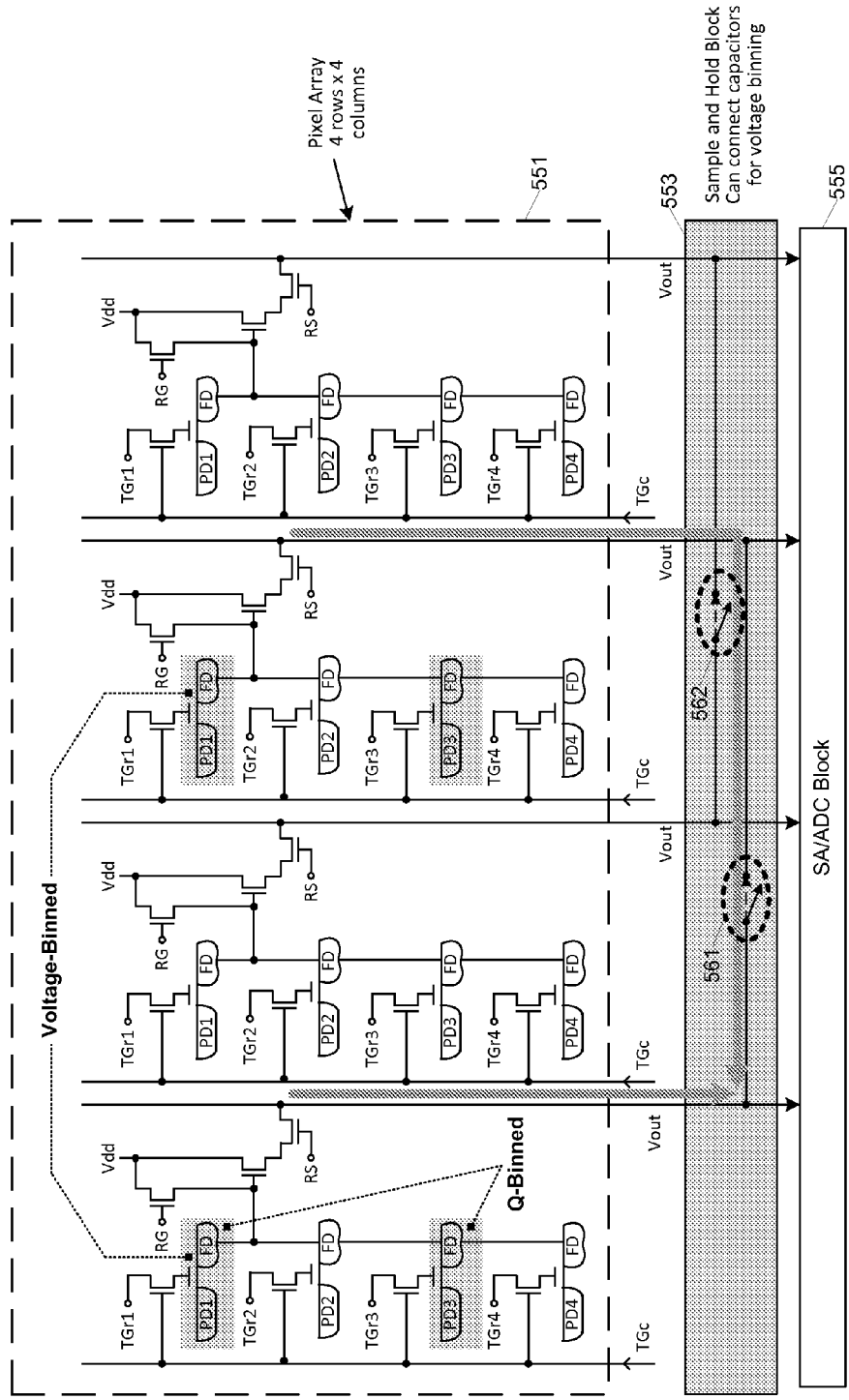
FIG. 22 illustrates a column-interconnect architecture that may be applied to enable voltage-binning of analog signals read-out from selected columns of 4×1 quad-pixel blocks.
Figure 23:
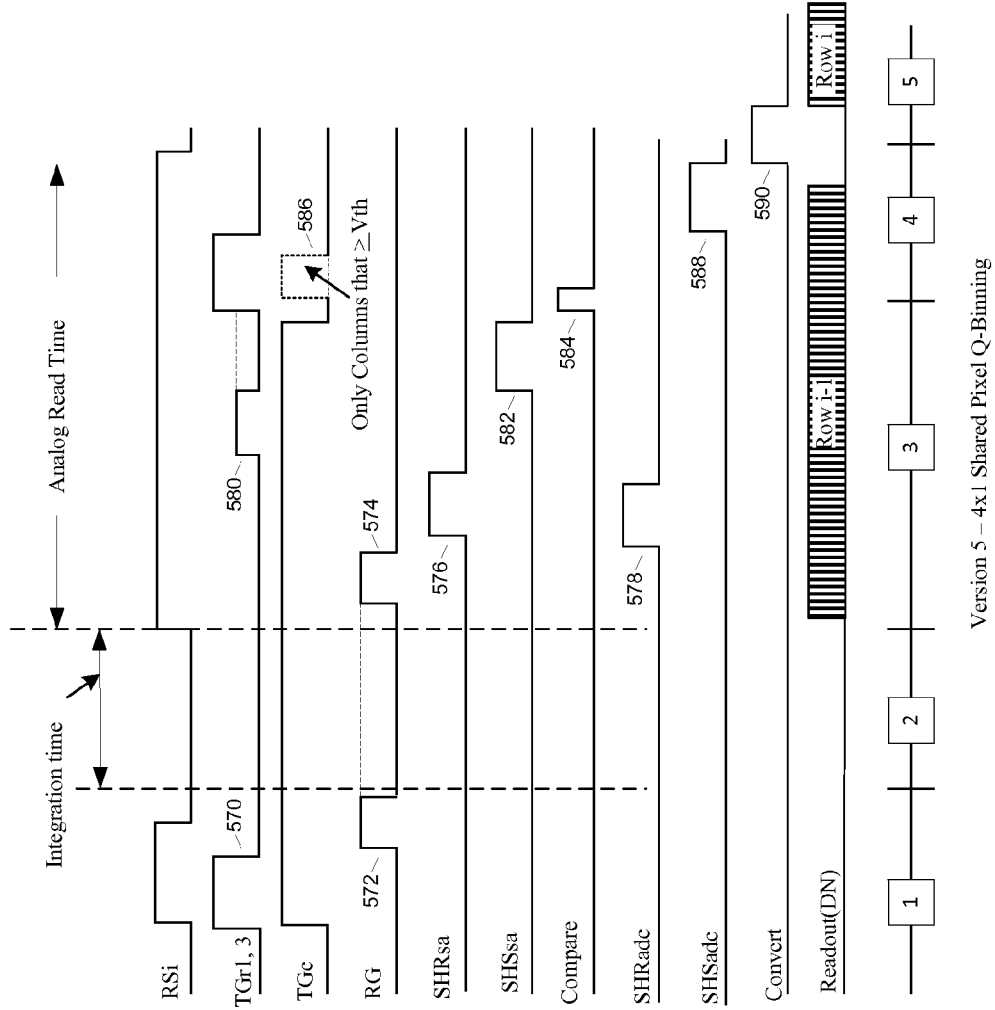
FIG. 23 illustrates an exemplary timing diagram of binned-mode read-out operations within the 4×1 quad-pixel architecture of FIGS. 21 and 22.

FIG. 23 illustrates an exemplary timing diagram of binned-mode read-out operations within the 4×1 quad-pixel architecture of FIGS. 21 and 22. In the example shown, row lines for pixel rows i and i+2 are operated in lock step to achieve 2:1 charge binning within the shared floating diffusion of a given quad-pixel block. More specifically, row signals for pixel rows 1 and 3 of a 4×1 quad pixel block (or row of such quad pixel blocks) are asserted in unison, followed by locked-step assertion of row signals for pixel rows 2 and 4, before advancing to assert row signals for the next row of 4×1 quad pixel blocks. Transverse connections are established within sample-and-hold switch elements (e.g., at 561 and 562 of sample-and-hold block 553 as shown in FIG. 22) to achieve 2:1 voltage binning and thus an overall 4:1 analog signal summing and concomitant image decimation.

Referring more specifically to FIG. 23, the row-select signals (RS), reset-gate signals (RG) and row transfer-gate signals (TGr1, TGr3 or "TGr1,3") are operated in lock step to reset the photodiodes and shared floating diffusion of the selected pixel rows during hard-reset phase 1, permit charge integration during integration phase 2, determine whether the charge-binned and voltage-binned charge-accumulation results within each column-interleaved collection of four pixels (i.e., the 3×3 corner pixels as described in reference to FIGS. 21 and 22) exceed the conditional-reset threshold in threshold-test phase 3, and, if an over-threshold condition is detected, conditionally read-out and digitize the full charge-binned and voltage-binned accumulated charge within the subject pixel collections in conditional read-out phase 4 before transmitting the digitized pixel value to downstream (on-chip or off-chip) processing logic in output phase 5. Considering the phases one by one, during hard-reset phase 1, the row-transfer gate signals TGr1 and TGr3 are pulsed to $VTG_{full}$ (as shown at 570) while simultaneously raising column transfer-gate signal TGc, thus transferring accumulated charge from photodiodes PD1 and PD3 to their shared floating diffusion node. After the photodiode-to-floating-diffusion charge transfer, reset signal RG is pulsed at 572 to clear charge from the floating diffusion in preparation for the ensuing charge integration in phase 2. At the start of threshold-test phase 3, the reset signal is pulsed again (574) to reset the floating diffusion and then signals SHRsa and SHRadc are pulsed at 576 and 578 (while RSi is asserted) to capture samples of the reset-state of the floating diffusion within the sample-and-hold elements for the sense amplifier and ADC. At 580, TGr1 and TGr3 are raised to the partial-on transfer potential, $VTG_{partial}$, to enable charge spillover to the shared floating diffusion if an over-threshold condition exists in the photodiodes of the subject pixels. The SHSsa signal is then pulsed at 582 while the transverse-interconnect switch elements (e.g., transistors) are switched to a conducting state within the sample and hold bank to capture the signal-state of the floating diffusion nodes within related columns (i.e., column j and column j+2 in the embodiment shown) within a shared sample-and-hold element, thus voltage binning the two charge-binned spillover samples. The threshold-test phase is concluded by lowering the TGc signal and asserting the compare-strobe (584) to trigger a threshold comparison within the sense amplifier, comparing the aggregated spillover charge from the four charge/voltage binned pixels against a conditional-reset threshold. If the comparison result indicates an over-threshold condition, the TGc signal is pulsed at 586 during application of $VTG_{full}$ on the TGr1 and TGr3 lines, (thus enabling a full read-out of photodiodes PD1 and PD3 to the shared floating diffusion within corresponding quad pixel block), and then the SHSadc signal is raised at 588 to capture the signal-state of the floating diffusion nodes of switch-interconnected pixel columns within a signal-state sample-and-hold element for the ADC (i.e., voltage-binning the charge-binned floating diffusion contents). Thereafter, the convert-strobe is pulsed at 590 to trigger an ADC operation with respect to the voltage/charge-binned signal state captured within the sample-and-hold circuit (if any), followed by transmission of the ADC output in phase 5. As discussed above, the ADC operation and data transmission operations may be suppressed to save power and reduce signaling bandwidth if an over-threshold condition is not detected in threshold-test phase 4.

Figure 24:
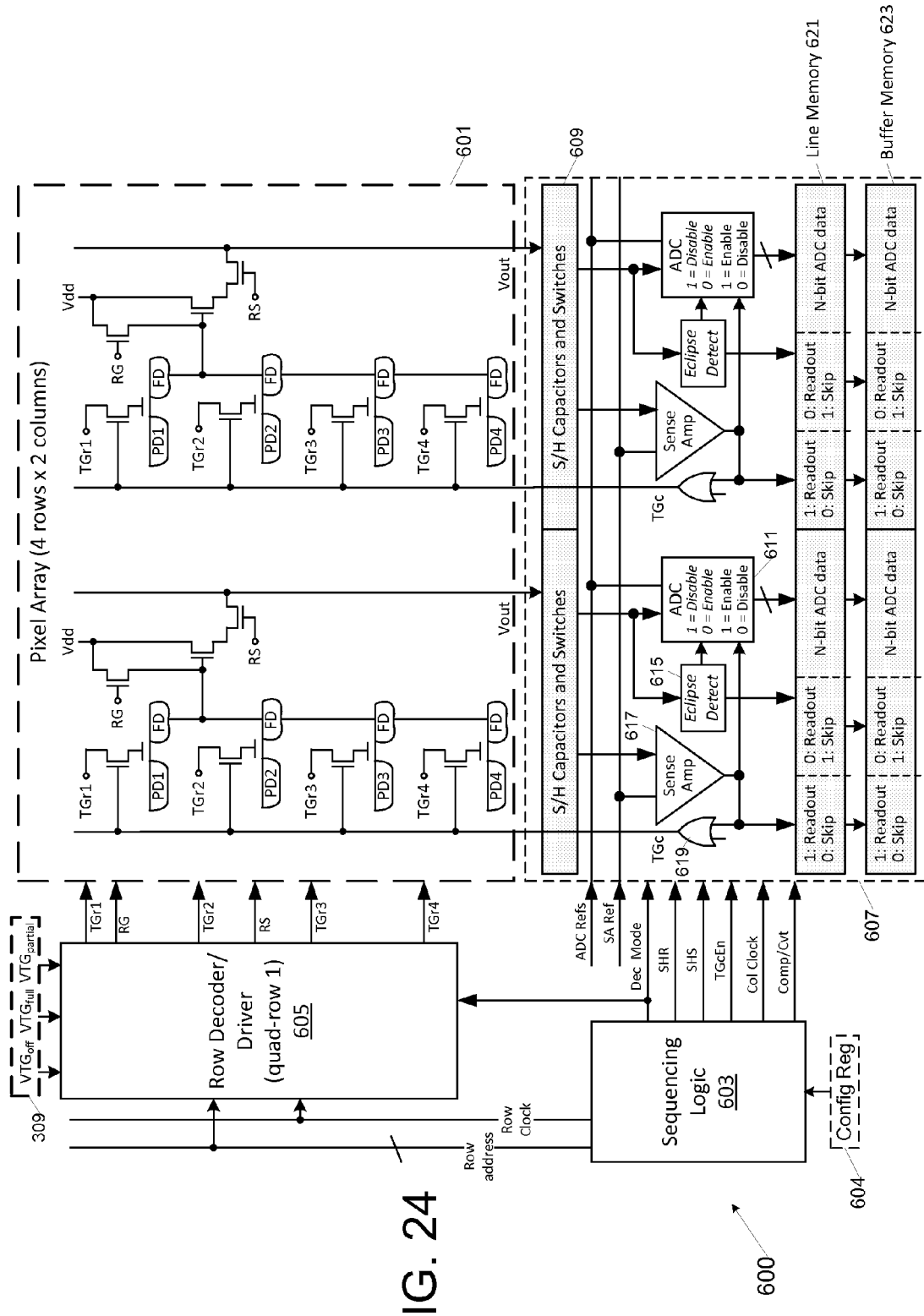
FIG. 24 illustrates a more detailed embodiment of an image sensor having an array of 4×1 quad pixel blocks operable in the decimation (binning) mode described in reference to FIGS. 21-23.

FIG. 24 illustrates a more detailed embodiment of an image sensor 600 having an array of 4×1 quad pixel blocks 601 operable in the decimation (binning) mode described in reference to FIGS. 21-23. As in the embodiment of FIG. 14, a row decoder/driver 605 receives transfer gate voltages (e.g., $VTG_{partial}$, $VTG_{full}$ and $VTG_{off}$) from an on-chip or off-chip voltage source 309 and a row address value and row clock (used to control row signal timing) from sequencing logic 603, outputting row control signals, RG, RS and TGr1-TGr4 in response. Sequencing logic additionally outputs a set of read-out control signals to column read-out circuitry 607, including a column clock signal (which may be composed of multiple timing/control signals for timing operations within the sense amplifiers, ADCs, memory buffers, etc. with column read-out circuitry 607), compare-strobe and convert-strobe signals as described above, the column transfer-gate enable signal (TGcEn), SHR and SHS signals (which may include separate signals for sense amp and ADC sample-and-hold elements). Sequencing logic also outputs a decimation-mode signal ("Dec Mode") to both column read-out circuitry 607 and row decoder/driver 605 to enable/disable the above-described charge and voltage binning operations. For example, in one embodiment, the decimation mode signal is configurable in one of at least two possible states (e.g., according to a decimation mode setting within a programmable configuration register 604), including a binning-disabled state in which pixel rows and columns are operated individually to enable full-resolution image read-out, and a bin-enable state in which the row decoder/driver asserts row signal pairs (e.g., TGr1/TGr3 and then TGr2/TGr4) in locked-step to achieve charge binning within the shared floating diffusion, and in which column read-out lines (Vout) for even and odd column pairs are transversely coupled (e.g., as shown in FIG. 22) to enable voltage binning within sample-and-hold elements.

Still referring to the embodiment of FIG. 24, column read-out circuitry 607 includes, in addition to sense amplifiers 617 and TGc logic gates 619 (which operate generally as described above), a set of column eclipse detect circuits 615, each coupled to receive a pixel reset signal from sample-and-hold block 609, and having circuitry to determine whether the photodiode measurement (whether binned or at full resolution) exceeds a saturation threshold. If a given eclipse-detector 615 (e.g., implemented by a threshold comparator) detects a saturation condition (i.e., saturation threshold exceeded), the eclipse detector raises an eclipse signal at a secondary enable input of ADC circuit 611 to disable ADC operation therein. The eclipse signal is also output to a line memory element 621 to qualify the ADC output, being recorded therein as a logic '1' eclipse bit if a saturation condition was detected (thus indicating that the ADC output is invalid and in fact should be represented by a maximum read-out value) and a logic '0' eclipse bit otherwise. By this operation, the eclipse bit and under-threshold bit recorded for each pixel column serve jointly to qualify the corresponding ADC output as follows (where 'X' indicates a don't care status):

TABLE 1

| Under-Threshold | Eclipse | ADC Value | Interpretation |
|---|---|---|---|
| 0 | 0 | Invalid | Under-Threshold: ADC output assumed to be 0 |
| X | 1 | Invalid | Saturation:, ADC output assumed to be all '1's |
| 1 | 0 | Valid | Over-Threshold without Saturating |

Still referring to FIG. 24, when the binning mode is set to enable voltage binning between column pairs (e.g., even numbered columns voltage binned and odd-numbered columns voltage binned), the sense amplifier and ADC within one column in each binned column pair may be disabled to save power, with the transmitted data stream decimated according to the binning mode.

Dynamic-Gain Pixel Read-Out

As briefly mentioned in connection with FIGS. 19 and 20, different gains may be applied during partial and full read-out operations. That is, because the spillover charge during a partial read-out may be exceedingly small (i.e., where the charge integration level barely exceeds the conditional-reset threshold), it may be beneficial to apply a higher gain during the partial read-out. By contrast, because the full read-out may range between minimum and maximum charge integration levels, a significantly lower gain may be applied to normalize those charge levels to the minimum and maximum ADC output values. Accordingly, in a number of embodiments herein (including those described above in reference to FIGS. 19-24), different gains are applied by the column read-out circuitry during partial read-out and full read-out operations.

Figure 25C:
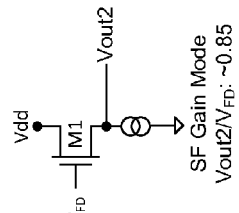
FIGS. 25A-25C illustrate an embodiment of a selectable-gain (or multi-gain) read-out circuit that may be used to effect a high-gain partial read-out and near-unity gain full read-out within a pixel column.
Figure 25B:
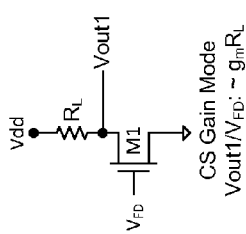
Figure 25A:
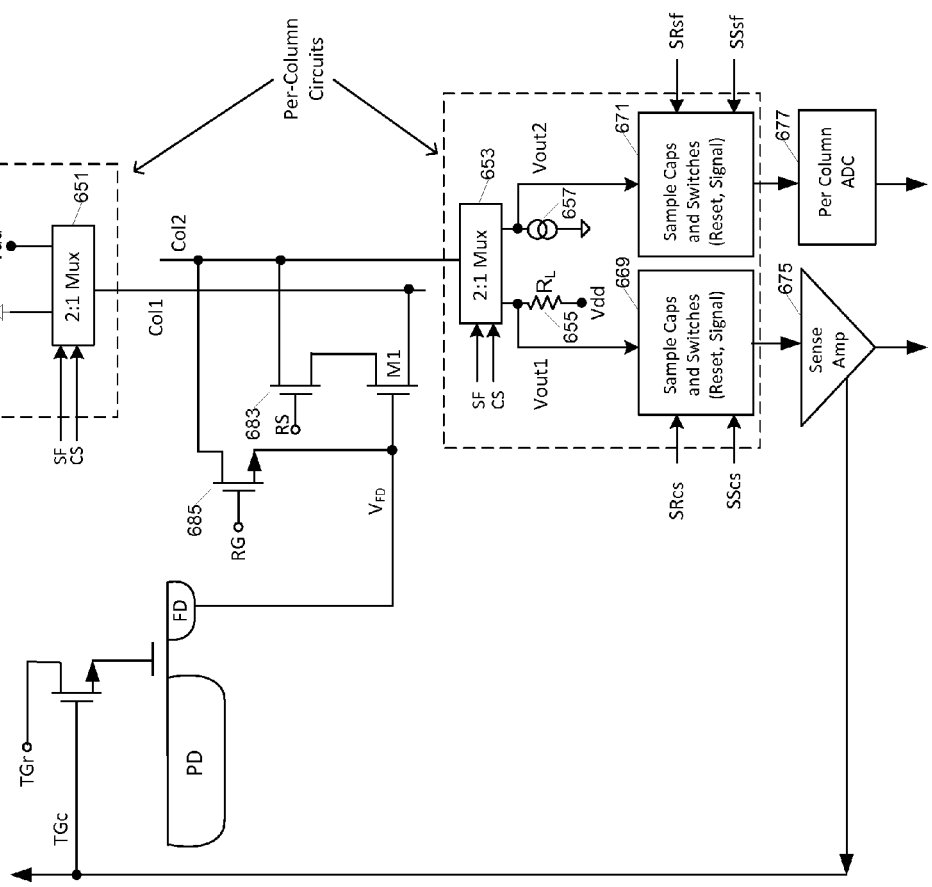

FIG. 25A illustrates an embodiment of a selectable-gain (or multi-gain) read-out circuit that may be used to effect a high-gain partial read-out and near-unity gain full read-out within a pixel column. More specifically, in the implementation shown, multiplexers 651 and 653 are used to establish either a common-source amplifier configuration (gain=transconductance of transistor M1*load resistance $R_L$, where '*' denotes multiplication) or a source-follower configuration (unity gain or near-unity gain) according to the state of multiplexer control signals CS and SF. In the common-source amplifier configuration, (CS=1, SF=0), multiplexer 653 couples column line Col2 to voltage supply rail Vdd via load resistance $R_L$ (655), while multiplexer 651 couples column line Col1 to ground. As shown, Col2 is coupled to the drain terminal of row-select transistor 683 so that Vout1 will vary according to the current flow through transistor M1; a function of the applied gate voltage (floating diffusion charge level) and transconductance of that transistor. More specifically, as can be understood from FIG. 25B (which illustrates the common source gain configuration), Vout1 is given by Vdd–$I_{M1}$*$R_L$ so that Vout1/$V_{FD}$ is approximately $g_m$*RL, where $g_m$ represents the transconductance of transistor M1. Accordingly, by appropriately sizing M1 and/or $R_L$, a common-source gain substantially greater than unity may be achieved, thus improving sensitivity to the relatively small level of charge that may spillover to the floating diffusion during partial read-out operations. Note that reset transistor 685 is also coupled to the Col2 line, thus enabling the floating diffusion to be pulled up to CS mode Vout (i.e., reset) in response to RG signal assertion while in the common-source gain configuration.

In the source-follower configuration (SF=1, CS=0), multiplexer 653 couples a current source 657 to the Col2 line, and multiplexer 651 couples column line Col1 to Vdd, thus establishing M1 as a source-follower amplifier (i.e., output voltage at M1 source and thus Vout2 follows the floating-diffusion voltage applied at the gate of M1) as shown at FIG. 25C. More specifically, in order to maintain a substantially constant current through the Col2 line, the feedback loop that maintains the constant current source raises the potential at Vout2 as necessary to counteract any conductance change in transistor M1. Accordingly, assuming a substantially linear transconductance within M1, the current source raises and lowers Vout2 in a substantially linear correspondence to increase and decrease in the floating diffusion potential, thus effecting substantially constant proportionality between Vout2 and $V_{FD}$. In the embodiment shown, the constant of proportionality is slightly less than unity (e.g., 0.85 in the specific example depicted, though other proportionality constants, including unity, may be achieved in alternative embodiments or other programmed configurations) in the source follower configuration.

Still referring to FIG. 25A, separate sets of sample-and-hold elements (e.g., capacitive elements and switch elements) 669 and 671 are coupled to the Vout1 and Vout2 nodes, respectively, to accommodate the different gain configurations applied during partial read-out and full read-out operations, with correspondingly separate sets of reset-state and signal-state sample-enable signals applied to the two sample-and-hold circuits. In the example shown, the partial read-out sample-and-hold circuit 669 (i.e., controlled by signals SRcs and SScs in the common-source gain configuration) provides a differential output (i.e., signal-state sample less reset-state sample) to a sense amplifier circuit 675, while the full read-out sample-and-hold circuit 671 (controlled by signals SRsf and SSsf in the source-follower gain configuration) provides a differential output to ADC 677. As in all embodiments having both a sense amplifier and ADC, the sense amplifier may be omitted and the ADC applied during both the partial and full read-out operations as discussed in reference to FIGS. 15B and 15C. In such ADC-only implementations, the outputs of sample-and-hold circuits 669 and 671 may be multiplexed to the input of ADC 677 according to the state of the CS and SF signals. In an embodiment in which the CS and SF signals always have complementary states, a single signal may alternatively be used to switch between common-source and source-follower gain configurations.

Figure 26:
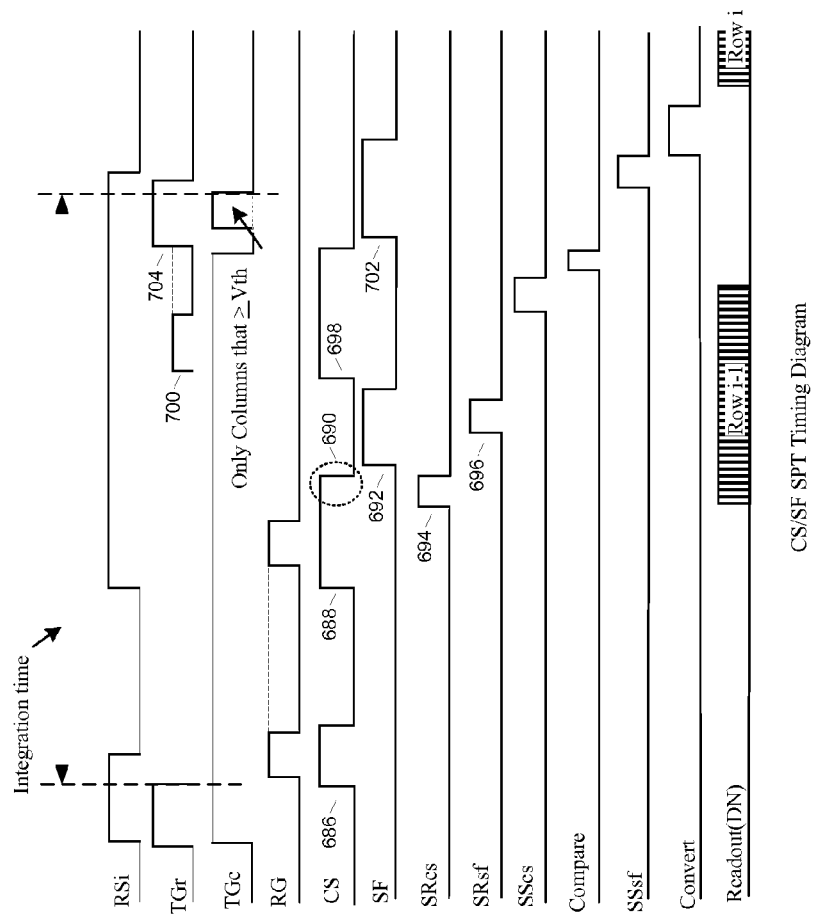
FIG. 26 presents an exemplary timing diagram illustrating the alternating application of common-source and source-follower gain configurations during hard-reset, integration, partial read-out and (conditional) full read-out operations within the multi-gain architecture of FIG. 25A.

FIG. 26 presents an exemplary timing diagram illustrating the alternating application of common-source and source-follower gain configurations during hard-reset, integration, partial read-out and (conditional) full read-out operations within the multi-gain architecture of FIG. 25A. As shown, the common-source enable signal (CS) is asserted at 686 concurrently with the hard-reset RG pulse (i.e., asserted in preparation for charge integration) and at 688 (floating diffusion reset in preparation for reset-state sampling). During at least a portion of the charge integration interval, signal gain may be disabled altogether to save power (i.e., lowering both the SF and CS control signals as shown), though in actuality one or both gain modes may be applied during that interval to enable operations in other pixel rows. During reset-state sampling, the common-source and source-follower gain configurations are enabled one after another as shown at 690 and 692 (i.e., initially holding CS high while SF is low and then reversing that configuration), with reset-state sampling signals SRcs and SRsf being pulsed at 694 and 696 while in the common-source and source-follower gain configurations, respectively, to capture reset-state samples within the different sample-and-hold circuits provided for the two gain configurations. Thereafter, CS is raised at 698 (and SF lowered) to apply the common-source gain configuration during the partial read-out operation (effected by raising TGr to the partially-on state at 700 while TGc is held high and concluding with assertion of the SScs and compare-strobe signals), and then SF is raised at 702 (and CS lowered) to apply the source-follower gain configuration during the ensuing conditional full read-out operation (effected by raising TGr to the full read-out potential at 704 concurrently with conditional pulsing of the TGc signal and concluding with assertion of the SSsf and convert-strobe signals).

Figure 27:
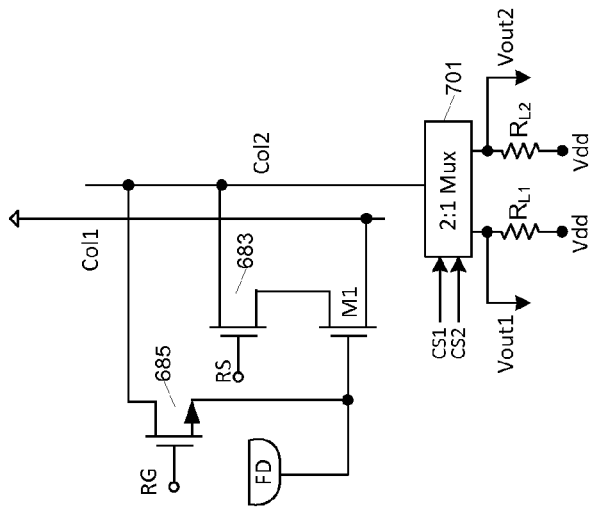
FIG. 27 illustrates an alternative embodiment of a selectable-gain (or multi-gain) read-out circuit that may be used to effect a high-gain partial read-out and near-unity gain full read-out within a pixel column.

Reflecting on the multi-gain architecture described in reference to FIGS. 25A-25C and FIG. 26, it should be noted that other gain configurations or combinations of gain configurations may be used in alternative embodiments. For example, as shown in FIG. 27, two different common-source gain configurations, may be effected by coupling different pull-up resistances (RL1 and RL2) to the col2 line via multiplexer 701, and thereafter selecting one gain or the other (i.e., through appropriate assertion of control signals CS1 and CS2) generally as described in reference to FIG. 26. In another embodiment, a programmable gain amplifier may be coupled to the Col2 and/or Col1 line and switched between programmed settings to effect different partial read-out and full read-out gains. More generally, any practicable configuration or architecture that enables adjustment of the gain applied during partial read-out and full read-out operations may be employed in alternative embodiments.

Image Sensor Architecture, System Architecture

Figure 28:
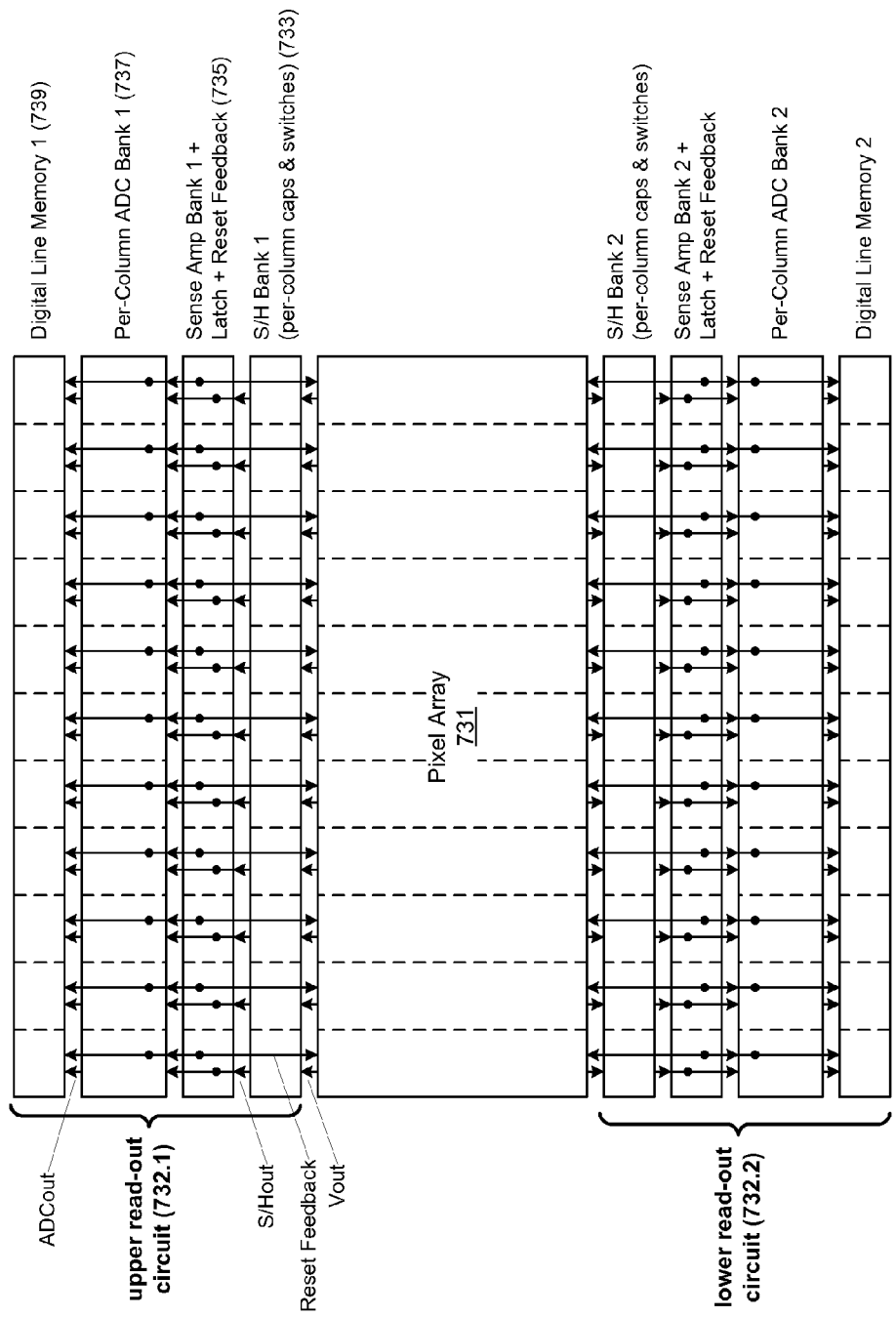
FIG. 28 illustrates an embodiment of an image sensor having a pixel array disposed between upper and lower read-out circuits.

FIG. 28 illustrates an embodiment of an image sensor having a pixel array 731 disposed between upper and lower read-out circuits 732.1 and 732.2. The read-out circuits are coupled to respective halves of the pixel rows in the array and are operable in parallel, thereby halving the time required to scan through the rows of the pixel array. In one embodiment, the pixel rows are allocated between the upper and lower read-out circuits according to the physical half of the pixel array in which the pixel rows reside. For example, all upper pixel rows (i.e., above a physical midpoint) may be coupled to the upper read-out circuit, and all lower pixel rows may be coupled to the lower read-out circuit, thereby reducing the overall column line length (reducing capacitance, noise, required drive power, etc. with respect to each Vout and reset feedback (TGc) line). In other embodiments, the pixel row interconnections to the upper and lower read-out circuits may be interleaved across the rows of pixel arrays, with the connection alternating between upper and lower read-out circuits for each successive row of pixel blocks (e.g., every fourth row in a pixel array populated by the 4×1 quad-pixel block shown in FIG. 21, or every second row in a pixel array populated by the 2×2 quad-pixel block shown in FIGS. 16 and 17, or every other row in a pixel array populated by pixels having dedicated Vout interconnects). In the embodiment shown, each read-out circuit (732.1 and 732.2) includes a sample-and-hold bank 733 (e.g., including per-column capacitive storage elements and switching elements as described above), a sense amplifier bank 735 including per-column sense amplifier circuits (or latches) and reset-feedback logic, a per-column ADC bank 737 and a digital line memory 739. In embodiments that apply the per-column ADCs to digitize partial read-out samples, the sense amplifier bank 735 may be omitted and the per-column ADC bank outfitted with digital comparators to generate reset-feedback signals (i.e., conditional-reset signals, TGc). Also, the sample-and-hold bank may include transverse switching elements as described in reference to FIG. 22 to support voltage binning operations. More generally, the various circuit blocks of the upper and lower read-out circuits may be operated and/or configured as described above to support various decimation modes and read-out options. Though not specifically shown, the upper and lower digital line memories 739 may feed a shared physical output driver (PHY), for example, disposed to the left or right of the pixel array and coupled to receive data in parallel from each of the digital line memories. Alternatively, separate PHYs may be provided with respect to the two digital line memories, with the PHYs being disposed, for example, at an opposite edges of the image sensor IC. Further, while the upper and lower read-out circuits may be implemented on the same physical die as pixel array 731 (e.g., at the periphery of the die (sandwiching the pixel array) or in the center of the die between respective halves of the pixel array, the read-out circuits may alternatively be located on another die (e.g., coupled to the pixel array die in a stacked configuration that may additionally include other imaging-related dies).

FIG. 29 illustrates an embodiment of an imaging system 800 having an image sensor 801, image processor 803, memory 805 and display 807. The image sensor 801 includes a pixel array 811 constituted by temporally-oversampled conditional-reset pixels according to any of the embodiments disclosed herein, and also includes pixel control and read-out circuitry as described above, including row logic 815, column logic 817, line memory 819 and PHY 821. Image processor 803 (which may be implemented as a system-on-chip or the like) includes an image signal processor (ISP) 831 and application processor 833, coupled to one another via one or more interconnect buses or links 836. As shown, ISP 831 is coupled to receive imaging data from the pixel array via PHY 827 (and signaling link(s) 822, which may implemented, for example, by a Mobile Industry Processor Interface ("MIPI" bus) or any other practicable signaling interface), and the ISP and application processor are coupled to a memory control interface 835 and user-interface port 837 via interconnect 836. Further, as explained below, interconnect 836 may also be coupled to the image sensor interface of ISP 831 (i.e., the ISPs interface to PHY 827) via side-channel 838 to enable the application processor to deliver data to the ISP in a manner that emulates an image sensor.

Still referring to FIG. 29, imaging system 800 further includes one or more memory components 805 coupled to the memory control interface 835 of image processor 803. In the example shown, and in the discussion below, the memory components are assumed to include a dynamic random access memory (DRAM) which may serve as a buffer for image sub-frame data and/or as a frame buffer for other functions. The memory components may additionally include one or more non-volatile memories for long-term storage of processed images.

User-interface port 837 is coupled to a user display 807 which may itself include a frame memory (or frame buffer)

to store an image to be displayed for a user (e.g., a still image frame or video frame). Though not shown, user-interface port 837 may also be coupled to a keypad, touchscreen or other user-input circuitry capable of providing information to image processor 803 corresponding to user-input, including operating mode information that may be used to configure decimation modes within the image sensor 801. Although also not shown, image processor 803 may be coupled to image sensor 801 through a sideband channel or other control interface to permit transmission of operating mode, configuration information, operation-triggering instructions (including image capture instructions, configuration-programming instructions, etc.) and the like to the image sensor.

FIG. 30 illustrates an exemplary sequence of operations that may be executed within the imaging system of FIG. 29 in connection with an image processing operation. Starting at 851, the application processor configures ISP 831 for DMA (direct-memory-access) operation with respect to memory control interface 835 and thus memory IC 805. By this arrangement, the ISP is enabled to operate as DMA controller between image sensor 801 and memory IC 805, receiving subframe data from image sensor 801 row by row (as shown at 853) and transferring the subframe data to the memory IC. Thus, the subframe data generated by temporal oversampling within image sensor 801 are, in effect, piped through the ISP directly to memory IC (e.g., a DRAM) where they may be accessed by the application processor. Note that, in the embodiment shown, subframes are loaded into the memory one after another until a final subframe has been received and stored (i.e., the frame-by-frame storage loop and its eventual termination being reflected in decision block 855). This process may be optimized in an alternative embodiment by omitting storage of the final subframe in memory IC 805 and instead delivering the final subframe data directly to application processor 833. That is, as shown at 857, the application processor retrieves and combines (e.g., sums) the stored subframes to produce a consolidated (integrated) image frame so that, instead of storing the final subframe in memory and then reading it right back out, the final subframe may be delivered directly to the application processor to serve as a starting point for subframe data consolidation. In any case, at 859 the application processor configures ISP 831 for operation in image-processing mode and, at 861, outputs the image frame data (i.e., the consolidation of the temporally oversampled image sensor data) to the image-sensor interface of the ISP (i.e., to the front-end of the ISP via channel 838), thereby emulating image sensor delivery of a full image frame to ISP 831. At 863, the ISP processes the image frame delivered by the application processor to produce a finalized image frame, writing the completed (processed) image frame, for example, to DRAM or non-volatile memory (i.e., one or both of memory ICs 805), and/or directly to the frame buffer within display 807 to enable the image to be displayed to the system user.

Image Reconstruction Methodology

Two primary methods are used herein for reconstructing a linear light representation from a conditional exposure sequence. The first method is sum-and-lookup, the second is weighted averaging. FIG. 31 contains a log-log plot of exposure value (EV) vs. light intensity in lux for both approaches after initial calculations. Although both exhibit a similar dynamic range and are near linear for lower light ranges, the sum-and-lookup approach has a shoulder for high intensity and the weighted averaging approach remains linear until reaching the top of its dynamic range.

In the first method, for a given pixel the digital conversion values for all frame subexposures that pass threshold are summed. If a given subexposure resulted in a saturated pixel, the data number used for that subexposure in the summation is one greater than the highest data number for an unsaturated pixel. After summation a lookup operation, based on a pre-calculated lookup table (LUT) mapping the response to the light intensity. This lookup table can be calculated using an analytical model of sensor response, a statistical estimate using Monte Carlo simulation, maximum likelihood estimation, or it can be based on characterization data from the sensor hardware. The primary advantages of this mode are run-time simplicity and the ability to create partial sums of the response, e.g., on-sensor to reduce off-chip bandwidth. Because values for all subexposures are merged, however, the lookup table assumes constant illumination intensity for a pixel over the entire frame; if movement occurs in the frame or camera platform, or illumination varies over the frame duration, the lookup table approach may inaccurately approximate an average linear light value. Also, because a lookup table (LUT) is precalculated, only preset exposure timings that have a matching LUT can be processed on-system, and variations in response, threshold, etc., may also cause errors.

In the second method, average light intensity impinging on a pixel is directly estimated from the pattern of digital values/saturation events and the integration durations that created those values/events over a frame duration $T_{total}$. Each pixel is represented by a set of samples $S_i$, each taken over a respective duration $T_i$. Each sample takes a value $0 \le S_i \le S_{max}$. The value cannot be 0 for a conditional-read subexposure, but only for an unconditional-read subexposure. When the value is $S_{max}$, the pixel saturated over the duration $T_i$. In a first calculation, an intensity estimate is calculated from all unsaturated samples (a sample is not taken if at a subexposure end the pixel did not pass the conditional threshold), if such samples exist:

$$\hat{I}_U = T_{total} \sum_{S_i \ne S_{max}} w_i S_i \bigg/ \sum_{S_i \ne S_{max}} w_i T_i$$

For Poisson-distributed noise, the weights $w_i$ are set to 1. For Gaussian-predominated noise, the weights can be set to $T_i$. Other weights can be selected as desired. In a second calculation, if there are one or more saturated samples, the intensity estimate is updated to include the saturated sample with the shortest duration $T_k$ if the predicted value (based upon samples already included in the $\hat{I}_U$ estimation) at this exposure duration is less than $S_{max}$. The predicted value may be calculated and evaluated in several ways, including:

$$(T_k/T_{total})\hat{I}_U < S_{max}$$

This updating process can be repeated, if there is more than one saturated sample, for the sample of the second shortest duration, etc., until the last such sample is reached or the above equation is no longer satisfied. If there are only saturated samples, the best estimate of intensity is taken from the saturated sample with the shortest duration $T_k$:

$$\hat{I}_U = (T_{total}/T_k)S_{max}$$

Data-Rate-Limited Sensor Operation

In some embodiments, data storage on the sensor is limited to much less than a subframe and the subframe operation rate is limited by at least one of the ADC conversion rate and the channel rate available between the sensor and an attached processing/storage system. FIGS. 32-39 illustrate a collection of different conditional/unconditional readout mode timing diagrams that can be supported in such embodiments. The format of each diagram plots unconditional reset operations, conditional read/reset operations, and unconditional read operations as a function of row number and time.

FIG. 32 depicts a first HDR operating mode in the context of 1080 P video imaging at a 60 Hz frame rate. The assumption underlying this timing is that the ADC conversion rate and/or channel rate allows up to four complete subexposures of the operating pixels to be made every $\frac{1}{60}^{th}$ of a second (for simplicity, each subexposure is illustrated as lasting 4 ms, for a 62.5 Hz frame rate). Starting at row R1 and progressing to row R1080 for a first frame 1, the sensor unconditionally resets the pixels on each row (or binned rows, as disclosed above) in order at a rate that completes a reset pass of all rows in 4 ms. At the conclusion of this 4 ms pass, a first subexposure interval SE1 completes for row R1, and the sensor executes a conditional read/reset operation for row R1 and places the results in a transmit buffer. Progressing from row R2 to row R1080 at the same rate as the unconditional reset pass, the sensor executes a similar conditional read/reset operation for each row in turn and places the results in the transmit buffer, thus completing the first subexposure interval SE1 in row order, again in 4 ms.

The sensor then transitions operation back to row 1 and executes a second conditional read/reset pass through the array during a subexposure interval SE2. During the second pass, pixels that passed the threshold and were reset on the first pass are evaluated after 4 ms of light integration, while those that were not reset on the first pass are evaluated after 8 ms of light integration.

After the second conditional read/reset pass, the sensor makes a third, similar pass during a subexposure interval SE3. During the third pass, three possibilities exist for a pixel light integration interval: 4 ms, for pixels that were reset at the end of SE2; 8 ms, for pixels that were last reset at the end of SE1; and 12 ms, for pixels that have not yet passed the threshold during frame 1.

After the third pass completes, it is time to make a final pass through the array, this time unconditionally reading and transmitting ADC values for each pixel in each row after a subexposure interval SE4. During the fourth pass, four possibilities exist for a pixel light integration interval: 4 ms, for pixels that were reset at the end of SE3; 8 ms, for pixels that were last reset at the end of SE2; 12 ms, for pixels that were last reset at the end of SE1; and 16 ms, for pixels that have not yet passed the threshold during frame 1. Because the ratio of shortest to longest integration time for frame 1 is 1:4, the FIG. 1 HDR operating mode adds 2 photographic stops to the frame dynamic range as compared to a sensor operating with one exposure each 16 ms (the extra dynamic range can be above, below, or both above and below the dynamic range of the one exposure case, depending on the length selected for the one exposure).

The unconditional read at the end of interval SE4 also serves as the unconditional reset that begins subexposure interval SE1 for a following frame 2. Frame 2 is gathered identically to frame 1.

When using the HDR operating mode depicted in FIG. 32 in a low-light scenario, it may be advantageous to operate the sensor at an ISO higher than the base ISO to capture shadow areas with less read noise, and maintain a higher frame rate (for video) or reduce hand-shake-related blur (for still image capture). For instance, if it is desirable to capture the fourth subexposure at ISO 400, the first subexposure can be captured at ISO 100, the second subexposure can be captured at ISO 200, and the third and fourth subexposures can be captured at ISO 400. Since the first subexposure now has one-fourth the sensitivity of the last two subexposures, an additional two stops of dynamic range are available. Three stops would likewise be available in still lower light if the ISO sequence was 100-200-400-800.

To implement a changing-ISO mode, it may be desirable to adjust the thresholds for some or all of the conditional-read subexposures. For example, in a 100-200-400-800 ISO sequence a pixel that integrates during the first subexposure to just under the first subexposure threshold will not be read and will continue to integrate until the end of the second subexposure, where analog gain is then doubled and integration time has doubled. To avoid saturating the subexposure SE2 read of such a pixel, the threshold for the first subexposure should be less than one-fourth of the full ADC range. Likewise, a pixel that is not reset at the end of the first or second subexposures may have a value just under the second subexposure threshold, and will then integrate to the end of the third subexposure. Since analog gain is again doubled, and integration time has increased 50%, the threshold for the second subexposure should be less than one-third of the full ADC range. A similar analysis for the third subexposure threshold yields a recommended value of less than about 37% of the full ADC range.

When ISO is changed during an exposure, this mode must also be known to the reconstructing system. A weighted average reconstruction for non-saturated pixels should be adjusted to:

$$\hat{i}_U = T_{total} ISO_{max} \sum_{S_i \neq S_{max}} w_i S_i / ISO_i \bigg/ \sum_{S_i \neq S_{max}} w_i T_i$$

The equations for considering saturated pixels are adjusted similarly. In addition, the weights may be adjusted to account for changing read noise at the different ISOs. For a sum-and-lookup reconstruction approach, the values should be scaled by ISO prior to summation.

FIG. 33 depicts a second HDR operating mode in the context of 1080 P video imaging at a 60 Hz frame rate. As compared to the first mode, this second mode extends the dynamic range further, while losing less than $\frac{1}{3}^{rd}$ of a photographic stop of sensitivity on the low-light end of the dynamic range as compared to the first mode. In this second HDR mode, the conditional read/reset passes and final unconditional read pass are executed with the same timing as the first HDR mode. What differs from FIG. 32 is the use of an unconditional reset pass timed to reduce the effective length of subexposure interval SE1. For instance, light capture for frame 2 and a given row does not begin with the unconditional read of that row that ends frame 1. Instead, a dedicated unconditional reset of that row is scheduled 1 ms prior to the conditional read/reset pass that ends SE1. This causes light converted by the pixels in that row during the 3 ms since frame 1 ended to be discarded, and shortens SE1 such that a greater intensity can be sensed without saturation. Accordingly, the possible integration intervals that a particular pixel can have during a frame are 1, 4, 5, 8, 9, and 13 ms. The dynamic range, as compared to a sensor operating with one exposure each 16 ms, is extended $3\frac{2}{3}$ photographic stops. Note that with the FIG. 33 operating mode, the duration of the first subexposure interval can be set at virtually any selected duration up to 4 ms in length.

Variable ISO techniques can also be used in this mode, although generally the ISO should stay constant between SE1 and SE2 as the integration interval is already changing by a factor of 5. By doubling ISO between SE2 and SE3, and again between SE3 and SE4, in low-light conditions an additional 2 photographic stops of dynamic range are available.

Another consideration when the length of SE1 is shortened is that the conditional read threshold may need to be adjusted based on the shortening. For instance, if the threshold used in FIG. 32 is 40% of the saturation value, that threshold would need to be lowered during SE1 in FIG. 33 to around 20% of the saturation value or less to ensure that a pixel that does not quite trip the threshold at the end of SE1 will not quite—or barely—saturate at the end of SE2. When the ratio of any possible integration time to that integration time extended by one subexposure becomes greater than about 5, it may become impractical to implement the desired threshold.

For still brighter conditions, FIG. 34 illustrates an operating mode with still further extension of dynamic range without disturbing the aforementioned ratio past 5. FIG. 34 still uses four readout intervals, but terminates the first of the four readout intervals for each frame with an unconditional read. This allows each frame to have two integration intervals (SE1 and SE2) that can each be shorter than 4 ms in length. In the FIG. 34 example, the lengths of these intervals have been set respectively to 0.25 ms and 1 ms. Accordingly, the possible integration intervals that a particular pixel can have during a frame are 0.25, 1, 4, 5, 8, and 9 ms. As compared to a sensor operating with one exposure each 16 ms, the dynamic range is extended more than 5 stops.

FIG. 35 demonstrates a "preview mode" that can be appropriate, e.g., when the sensor is operating in a reduced power/data rate mode to allow a user to compose an image, set zoom, etc. In the preview mode, only one reset and one unconditional read are scheduled per row per frame. Even frames and odd frames, however, use different integration intervals (a ratio of 16:1 is shown), with the integration intervals placed anywhere in the respective frame intervals as long as two unconditional readout passes are separated by at least 4 ms. A "pseudo-HDR" effect is created by merely viewing the frames at full rate. Alternately, each group of two neighboring frames can be merged using traditional HDR frame merging to create previews with simulated HDR capture. Preferably, when the user initiates capture of a recorded still frame or video capture, the capture mode switches to a more capable mode such as the ones shown if FIGS. 32-34. The preview mode can also, for autoexposure operation, aid in selection of an appropriate full HDR mode for a following capture.

For the same imager example as FIGS. 32-35, FIG. 36 illustrates a 30 Hz capture mode that allows for up to eight subexposure captures per frame interval and additional flexibility in exposure policies. In this particular example, six subexposure intervals—three unconditional and three conditional—are used to offer exposure times per frame of 0.125, 0.5, 2, 4, 6, 8, 12, 16, 20, and 22 ms. As compared to an imager that offers only one exposure interval per frame, this mode extends dynamic range by 7.5 photographic stops.

The same imager can also operate in a 120 Hz mode by using two subexposure intervals per frame. FIG. 37 illustrates two different 120 Hz timing possibilities—a 4 ms, 4 ms sequence with equal subexposure times and one conditional read/reset per frame (shown as frames 1 and 3, with a 1 photographic stop improvement per frame) and a 0.75 ms, 4 ms sequence with one conditional read/reset per frame (shown as frames 2 and 4, with a 3 photographic stop improvement per frame). Alternately and as shown in FIG. 37, two such sequences can be alternated if desired for odd and even frames, with frame blending used to smooth the final output.

For some video capture scenarios, it may be desirable to have for each row a group of extremely short subexposures that are tightly grouped in time and not spread throughout a 60 Hz frame. FIG. 38 contains a timing diagram that illustrates an interleaved capture mode suitable for such conditions. In the interleaved capture mode, an entire subexposure pass is not completed before the next begins—instead, the row rate of each pass is slowed such that the maximum row rate of the system is never exceeded, with four passes proceeding concurrently.

In FIG. 38, all subexposure intervals but the last of each frame are conditional read/reset intervals, with spacings of 0.125, 0.25, 1, and 4 ms, respectively. The longest possible integration time is 5.375 ms, and the shortest is 0.125 ms, for a dynamic range extension of about 5½ photographic stops as compared to a single exposure per frame. The interleaving schedule is further illustrated in the FIG. 38 lower expanded partial view of frame 1: row R256, which has completed all of its conditional reads, receives its final, unconditional subexposure read for SE4; next, row R512 receives its SE3 conditional read/reset operation; row R576 next receives its SE2 conditional read/reset operation; then row R592 receives its SE1 conditional read/reset operation; and finally row R600 receives the unconditional reset operation that begins frame 1 for that row. The schedule then shifts down one row, and performs the same sequence, but for rows R257, R513, R577, R593, and R601, and repeats. Note that the frame 2 upper rows begin their capture sequences before the frame 1 lower rows complete their capture sequences.

The interleaved mode can be used with almost any combination of subexposure intervals, from very short to very long. Thus a fully interleaved capture mode can be employed for darker scenes as well. FIG. 39 contains a timing diagram for a mode that is analogous to the FIG. 32 mode in that all subexposure intervals are 4 ms long, but four subexposure intervals proceed concurrently.

Variable Data-Rate Sensor Operation

In some embodiments, excess sensor data rate exists in some modes that can be exploited in one or more ways. FIG. 40 shows a timing diagram for one such example in which the maximum row rate is fast enough to support roughly 4.5 array scans per frame. The sensor selectively picks some rows to receive a fifth subinterval SE5 in each frame, in this case with a total exposure time of 0.25 ms (one-fourth the exposure time of subinterval SE1).

Figure 41:
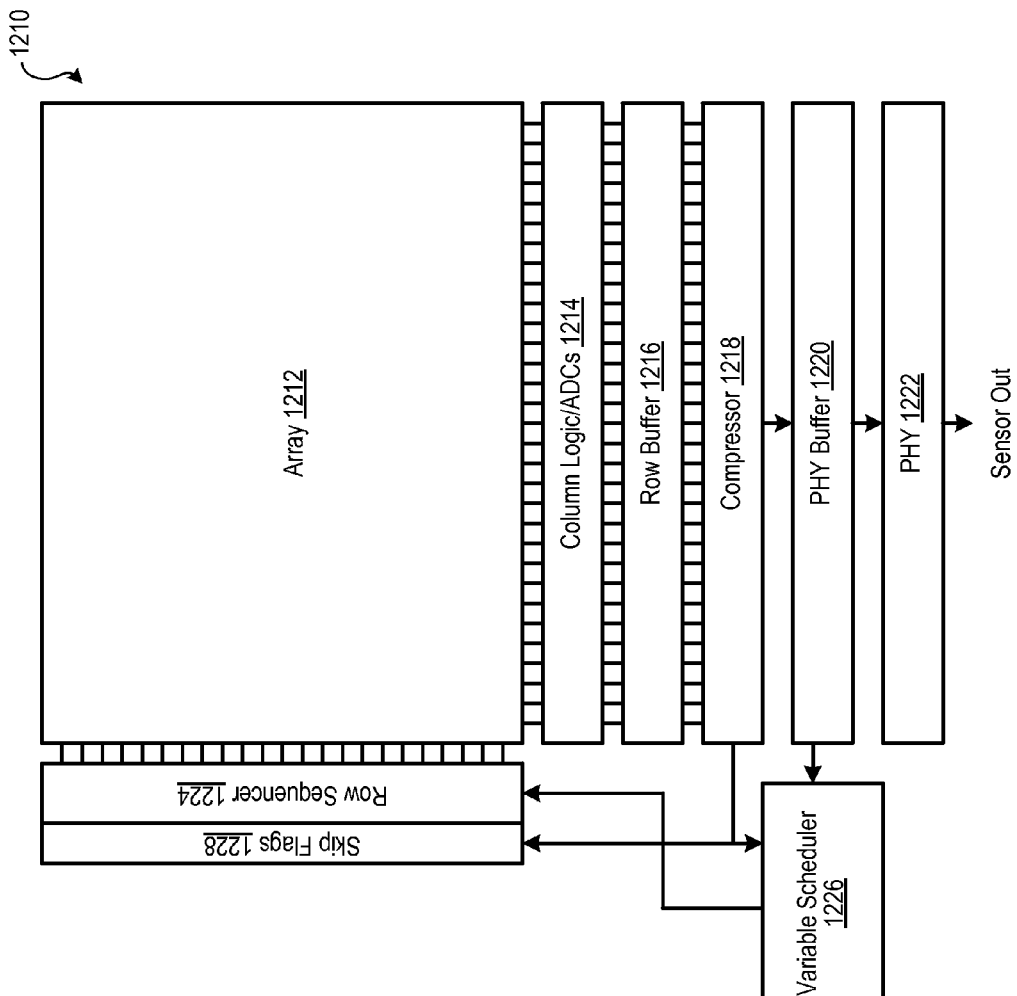
FIG. 41 shows a block diagram for an image sensor capable of operating with a variable exposure schedule and therefore useful for executing in accordance with the variable timing arrangement shown in FIG. 40.

FIG. 41 shows a block diagram for a sensor 1210 capable of operating with a variable exposure schedule and therefore useful for performing the FIG. 40 variable timing. Sensor 1210 contains a conditional reset pixel array 1212 and a readout chain comprising a set of column logic/ADCs 1214, a row buffer 1216, a compressor 1218, a PHY buffer 1220, and a PHY1222 to drive sensor data off chip. A row sequencer 1224 is driven by a variable scheduler 1226 working in conjunction with a set of row skip flags 1228.

In operation, row sequencer 1224 provides the row signals for reset, partial and complete transfer gate voltages, and output select for each row in array 1212, and column logic/ADCs 1214 provide the column transfer select signals for each column, perform threshold comparisons, and perform ADC conversion for each column, as explained previously. Row buffer 1216, in one embodiment, holds data for at least the last row read operation. In one embodiment, this data includes an n-bit word to store an ADC value, a flag bit to indicate whether an ADC operation was performed, and a flag bit to indicate whether the ADC was saturated.

Figure 42:
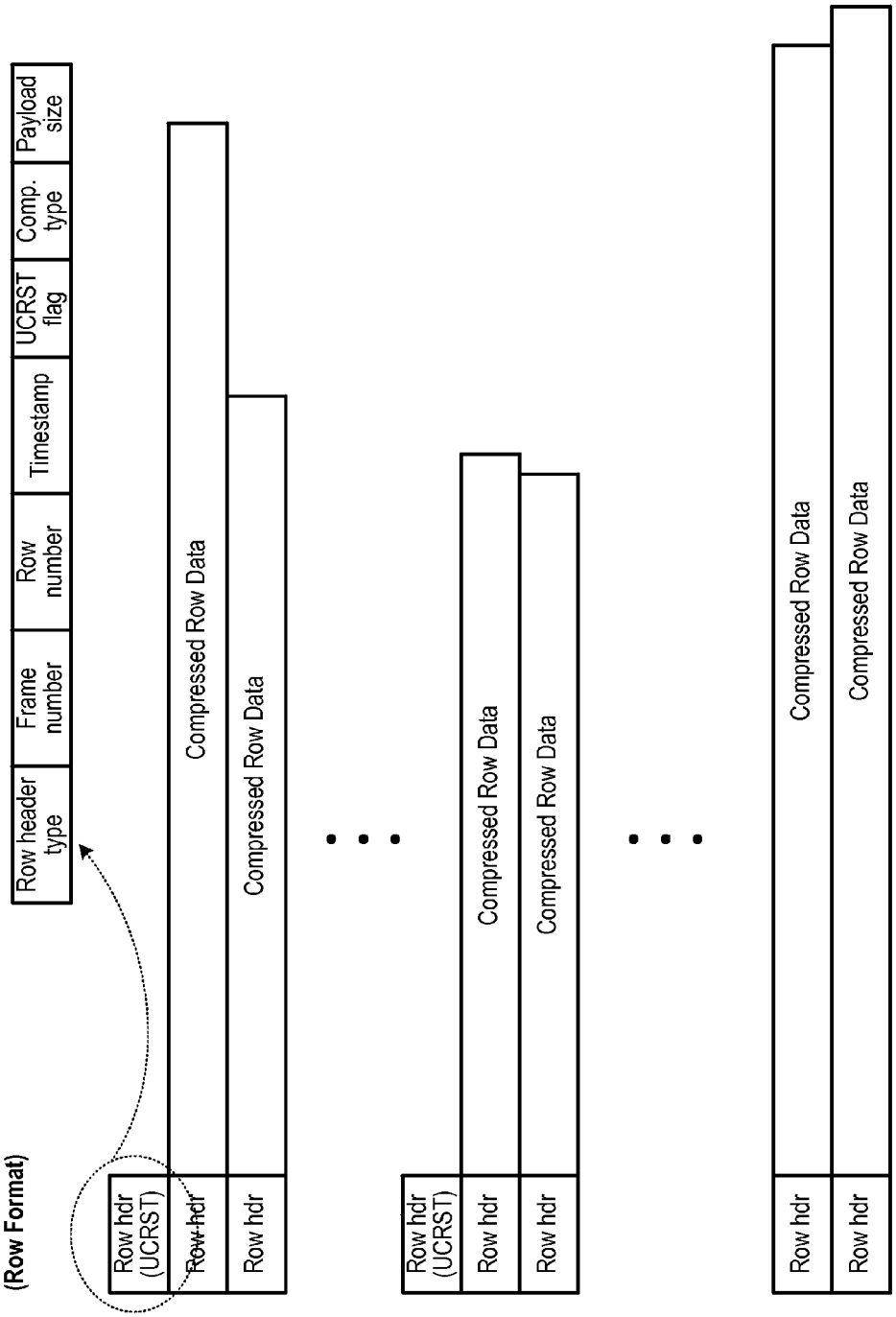
FIG. 42 shows an exemplary row-buffer output format that allows flexibility for various sensor operating modes.

Compressor 1218, in conjunction with variable scheduler 1226, formats the row buffer output for transmission. FIG. 42 shows an exemplary packet format that allows flexibility for many different operating modes. The row header is the primary packet header type used (other informational headers/packet types can also be interspersed in the data flow as needed, but are not described here). The receipt of a row header in the data stream indicates that a new row operation has been performed, and contains fields that indicate the type of operation and the type of compression applied to the row, the frame, the row number, a timestamp that indicates the time of execution, and a payload length (size of the attached row data, if any). A simple row header including an unconditional reset (UCRST) flag and no payload is transmitted whenever a row is reset, to let the reconstructing system know from what point to calculate integration intervals.

The compression type can be varied per row (or per color per row) in some embodiments. For instance, depending on the distribution of below threshold, AD converted, and saturated pixels in a given row, one compression may perform better than others. Some exemplary compression code modes are shown in the following table, where the ADC produces 8-bit data D[0 . . . 7] for a converted pixel:

| Compression Mode | Below Threshold | AD Converted | Saturated |
| --- | --- | --- | --- |
| Uncompressed | 00000000 | D[0 . . . 7] | 11111111 |
| Mode 1 | 0 | 1.0.D[0 . . . 7] | 1.1 |
| Mode 2 | 0.0 | 1.D[0 . . . 7] | 0.1 |
| Mode 3 | 0.0 | 0.1.D[0 . . . 7] | 1 |

Other more complicated compression types can optionally be included and can exploit more complex Huffman codes, code run-length similarities, or code delta values from column to column and/or row to row for slowly-spatially varying scenes.

With full row transaction information, a receiving subsystem can readily reconstruct, for each frame, each pixel of each row from its reset and read time history. This leaves the variable scheduler 1226 free to set the row schedule that best captures the current scene. In one embodiment, as shown in FIGS. 40 and 41, the variable scheduler 1226 receives information from the compressor as to whether, for a given row, subexposure SE1 produced any saturated samples. If the row did not produce any saturated samples, there is no need to schedule a shorter exposure for that row, and the skip flag 1228 corresponding to that row is set. If one or more pixels saturated, however, the skip flag is left unset so that a follow-on shorter exposure can be scheduled for that row.

FIG. 40 shows that as SE4 is ending, some rows begin to have unconditional resets scheduled in preparation for a fifth subexposure. To accomplish this, variable scheduler 1226 triggers scheduling for only the rows that need a shorter exposure. As long as the number of rows needing such an exposure can fit in the available time before the next frame starts, all such rows can be scheduled, and others skipped. If too many rows need a shorter exposure, some may not get serviced when it is time to begin resets for the next frame. Although SE5 is shown in FIG. 40 as ending with an unconditional read, it can alternately end with a conditional read, such that only high-intensity values receive an ADC output.

The skip flags can, in one embodiment, be stored in a linked list where each entry identifies the next row to be serviced. With such a list, individual rows can be removed from the list when the new exposure does not produce any saturated pixels. If the new exposure still produces saturated pixels for a row, the row can be left on the list. If time remains and the list has been traversed once, an additional, even shorter exposure can be scheduled for rows that did not come off the list. The list can pertain to complete rows, or portions of rows divided by color and/or spatially (left half, right half, etc.). Another alternative is that the saturated row list can be applied to a first brief exposure for some rows in the next frame, instead of a last brief exposure in the current frame.

A variable rate scheduler can operate in other, more sophisticated modes. FIG. 43 depicts a scheduling diagram for a sensor that has a higher ADC bandwidth than channel rate, such that when data can be successfully compressed, a scan can be sped up and more than the exemplary four scans can be completed in one frame. In one mode, the variable scheduler keeps rate statistics on the current frame (the first frame can be a constant-scan-rate learning frame, as shown for frame 1 in FIG. 43). The rate statistics are then used to adjust the schedule for the next frame if such adjustment can allow one or more additional scans per frame.

In FIG. 43, the learning frame 1 allows the variable scheduler to observe that the SE1 scan is highly compressible, and the SE2 scan also has good compressibility, particularly toward the bottom of the frame. The variable scheduler adjusts the row rate up for SE1 and SE2 in frame 2, allowing the scans to move closer together and another scan to be inserted in the frame. The last two scans are held to a constant rate to allow a predictable and regular frame end time.

One side effect of the FIG. 43 scan variability is that different rows have differing subexposure interval times. With time-stamped rows and weighted reconstruction, however, each row can be reconstructed exactly despite these variabilities.

Operation with Strobes

Another potential mode for a conditional reset imager is a strobe mode that synchronizes to an integral or external flash. In the strobe mode, one of the subexposures (in this case SE6) is designated as a sync subexposure. The sync exposure includes a strobe window wherein all rows are integrating and no rows are being read or reset. The imager and strobe are synchronized such that the strobe fires during the strobe window.

In the FIG. 44 example, the strobe window is bracketed by two unconditional read passes, such that strobe light dominates and ambient light integration time is equal for all pixels. This allows the imager to potentially separate the flash from the ambient component of the lighting, for advanced rendering. Also, the position of the strobe window subexposure (first, last, or somewhere else in the frame) can be a user-selectable parameter to allow different effects. Particularly when the strobe window subexposure is first, it can be started with an unconditional reset and ended with a conditional read/reset pass that begins a short subexposure interval.

Spatial Dispersion of Temporal Sampling Policies

Still modes generally track the corresponding video mode for a similar light level, although some still modes can be used for much longer exposures and the saved frame may have considerably more rows and columns. For a rate-limited scan, an additional exposure mode treats tiled "A" and "B" blocks with different exposure timings to obtain a greater variety of subexposure times. During demosaicing, the A and B blocks are used together to create a blended dynamic range image.

FIG. 45 contains an exposure timing diagram for a spatial blending exposure mode. An Option 1 grouping alternates between two rows of A block pixels and two rows of B block pixels. An Option 2 grouping creates a checkerboard of A block pixels and B block pixels, with each block subtending a 2×2-pixel block. Other options of spatial groupings are possible. In general the size and location of the spatial grouping should be correlated with the particular CFA kernel used in the system.

During frame exposure, some operations (in this example unconditional resets) are applied selectively to one group type (in this case B pixels) and not to the other group type. The selective application results in a different subexposure sequence for the A and B groups, even though row readout follows the same schedule for both groups.

Exposure Optimization

Exposure optimization attempts to optimize one or more parameters such as signal-to-noise ratio, bandwidth, pixels over threshold per scan, unsaturated pixels per scan, etc. It is recognized herein that each subexposure interval will have different histograms. In the exemplary histogram sequence of FIG. 46, SE1 (a short interval) has 90% of the pixels below threshold, 8% in range, and 2% saturated; SE2 (a longer interval) has 50% of the pixels below threshold, 20% saturated, and 30% in range; SE3 (another longer interval) has 15% of the pixels below threshold, 20% saturated, and 65% in range; SE4 (an unconditional read longer interval) has no pixels below threshold, 50% saturated, and 50% in range.

An exposure optimization algorithm, also shown in FIG. 46, gathers statistics such as the illustrated histograms from one set of subexposures, over one or more frames, and compares these statistics to desired statistics (such as data rate profile and/or above-threshold percentage targets). The statistics for an upcoming frame are then adjusted. One technique for adjusting statistics is to perturb the conditional read threshold for one or more subexposures to obtain more or less in-range values for that subexposure. A second is to adjust the length of one or more subexposures to shift pixels between below threshold and in-range and between in-range and saturated.

Additional Considerations

It should be noted that the various circuits disclosed herein can be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions can be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions can be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

The section headings in the above detailed description have been provided for convenience of reference only and in no way define, limit, construe or describe the scope or extent of the corresponding sections or any of the embodiments presented herein. Also, various modifications and changes can be made to the embodiments presented herein without departing from the broader spirit and scope of the disclosure. For example, features or aspects of any of the embodiments can be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated-circuit image sensor comprising:
   a capacitive floating diffusion node;
   first and second photosensitive elements switchably coupled to the capacitive floating diffusion node via first and second transfer gates, respectively;
   readout circuitry coupled to the floating diffusion node and the first and second transfer gates to:
   determine during a first interval whether a collective level of accumulated photocharge within the first and second photosensitive elements exceeds a read-out threshold, including applying a partial-read voltage to the first and second transfer gates during the first interval; and
   apply a full-read voltage to the first and second transfer gates during a second interval in response to determining during the first interval that the collective level of accumulated photocharge exceeds the read-out threshold, the full-read voltage exceeding the partial-read voltage;
   wherein the readout circuitry to apply the partial-read voltage to the first and second transfer gates during the first interval comprises circuitry to apply a voltage level to the first transfer gate that enables photocharge transfer from the first photosensitive element to the first floating diffusion node only if accumulated photocharge within the first photosensitive element exceeds a first charge level.

2. The integrated-circuit image sensor of claim 1 wherein if the accumulated photocharge exceeds the first charge level, application of the voltage level to the first transfer gate enables a limited portion of the accumulated photocharge within the first photosensitive element to be transferred to the first floating diffusion node such that a residual portion of the accumulated photocharge remains within the first photosensitive element at the conclusion of the first interval.

3. The integrated-circuit image sensor of claim 2 wherein the readout circuitry to apply the full-read voltage to the first and second transfer gates during the second interval comprises circuitry to apply a voltage level to the first transfer gate sufficient to enable the residual portion of the accumulated photocharge within the first photosensitive element to be transferred to the first floating diffusion node.

4. The integrated-circuit image sensor of claim 1 wherein the readout circuitry to apply the partial-read voltage to the first and second transfer gates during the first interval further comprises circuitry to apply a voltage level to the second transfer gates that enables photocharge transfer from the second photosensitive element to the first floating diffusion node only if accumulated photocharge within the second photosensitive element exceeds the first charge level.

5. An integrated-circuit image sensor comprising:
   a capacitive floating diffusion node;
   first and second photosensitive elements switchably coupled to the capacitive floating diffusion node via first and second transfer gates , respectively;
   readout circuitry coupled to the floating diffusion node and the first and secod transfer gates to:
   determine during a first interval whether a collective level of accumulated photocharge within the first and second photosensitive elements exceeds a readout threshold, including applying a partial-read voltage to the first and second transfer gates during the first interval; and
   apply a full-read voltage to the first and second transfer gates during a second interval in response to determining during the first interval that the collective level of accumulated photocharge exceeds the readout threshold, the full-read voltage exceeding the partial-read voltage;
   wherein the readout circuitry comprises control circuitry to enable an output signal representative of a charge level of the first floating diffusion node to be driven continuously onto a shared output line during a readout interval that spans the first and second intervals, and wherein the readout circuitry to determine whether the collective level of photocharge exceeds the readout threshold comprises comparator circuitry to compare the output signal to the readout threshold.

6. The integrated-circuit image sensor of claim 5 further comprising a pixel array having a plurality of photosensitive elements in addition to the first and second photosensitive elements, and wherein the control circuitry to enable the output signal to be driven continuously onto the shared output line during the readout interval comprises read-select circuitry to enable the output signal to be driven onto a column output line that extends column-wise across the pixel array, and wherein the readout circuitry to apply the full-read voltage to the first and second transfer gates during the second interval in response to determining that the collective level of accumulated photocharge exceeds the readout threshold comprises:
   first row control circuitry to assert a first transfer-gate control pulse that propagates row-wise across the pixel array during the second interval; and
   first column control circuitry to assert or deassert a second transfer-gate control pulse that, if asserted, propagates column-wise across the pixel array to effect, in combination with the first transfer-gate control pulse, application of the full-read voltage to the first transfer gate.

7. The integrated-circuit image sensor of claim 6 wherein the readout circuitry to apply the full-read voltage to the first and second transfer gates during the second interval in response to determining that the collective level of accumulated photocharge exceeds the readout threshold further comprises second row control circuitry to assert a third transfer-gate control pulse that propagates row-wise across the pixel array during the second interval and that effects, in combination with the second transfer-gate control pulse, application of the full-read voltage to the second transfer gate.

8. The integrated-circuit image sensor of claim 6 wherein the readout circuitry to apply the full-read voltage to the first and second transfer gates during the second interval in response to determining that the collective level of accumulated photocharge exceeds the readout threshold further comprises second column control circuitry to assert or deassert a third transfer-gate control pulse that, if asserted, propagates column-wise across the pixel array to effect, in combination with the first transfer-gate control pulse, application of the full-read voltage to the second transfer gate.

9. A method of operation within an integrated-circuit image sensor having a first floating diffusion node switchably coupled to first and second photosensitive elements via respective first and second transfer gates, the method comprising:
   determining during a first interval whether a collective level of accumulated photocharge within the first and second photosensitive elements exceeds a readout threshold, including applying a partial-read voltage to the first and second transfer gates during the first interval;

applying a full-read voltage to the first and second transfer gates during a second interval in response to determining during the first interval that the collective level of accumulated photocharge exceeds the readout threshold, the full-read voltage exceeding the partial-read voltage:

wherein applying the partial-read voltage to the first and second transfer gates during the first interval comprises applying a voltage level to the first transfer gate that enables photocharge transfer from the first photosensitive element to the first floating diffusion node only if accumulated photocharge within the first photosensitive element exceeds a first charge level.

10. The method of claim 9 further comprising:

resetting the first photosensitive element during a reset interval that precedes the first interval;

enabling the first photosensitive element to accumulate photocharge between the reset interval and the first interval; and wherein applying the voltage level to the first transfer gate that enables photocharge transfer from the first photosensitive element to the first floating diffusion node only if accumulated photocharge within the first photosensitive element exceeds the first charge level comprises applying a voltage level to the first transfer gate that is insufficient to enable an entirety of the photocharge accumulated within the first photosensitive element between the reset interval and the first interval to be transferred to the first floating diffusion node such that a residual portion of the photocharge remains within the first photosensitive element.

11. The method of claim 10 wherein applying the full-read voltage to the first and second transfer gates during the second interval comprises applying a voltage level to the first transfer gate sufficient to enable the residual portion of the photocharge to be transferred to the first floating diffusion node.

12. The method of claim 9 wherein, if the accumulated photocharge exceeds the first charge level, applying the voltage level to the first transfer gate enables a limited portion of the accumulated photocharge within the first photosensitive element to be transferred to the first floating diffusion node such that a residual portion of the accumulated photocharge remains within the first photosensitive element at the conclusion of the first interval.

13. The method of claim 12 wherein applying the full-read voltage to the first and second transfer gates during the second interval comprises applying a voltage level to the first transfer gate sufficient to enable the residual portion of the accumulated photocharge within the first photosensitive element to be transferred to the first floating diffusion node.

14. The method of claim 9 wherein applying the partial-read voltage to the first and second transfer gates during the first interval further comprises applying a voltage level to the second transfer gate that enables photocharge transfer from the second photosensitive element to the first floating diffusion node only if accumulated photocharge within the second photosensitive element exceeds the first charge level.

15. The method of claim 9 further comprising enabling an output signal representative of a charge level of the first floating diffusion node to be driven continuously onto a shared output line during a readout interval that spans the first and second intervals, and wherein determining whether the collective level of photocharge exceeds the readout threshold comprises comparing the output signal to the readout threshold.

16. The method of claim 15 wherein the first and second photosensitive elements are disposed together with other photosensitive elements within a pixel array, and wherein enabling the output signal to be driven onto the shared output line comprises enabling the output signal to be driven onto a column output line that extends across column-wise across the pixel array, and wherein applying the full-read voltage to the first and second transfer gates during the second interval in response to determining that the collective level of accumulated photocharge exceeds the readout threshold comprises:

asserting a first transfer-gate pulse that propagates row-wise across the pixel array during the second interval; and asserting or deasserting a second transfer-gate pulse during the second interval according to whether the output signal exceeds the threshold, the second transfer-gate control pulse, if asserted, propagating column-wise across the pixel array and effecting, in combination with the first transfer-gate control pulse, application of the full-read voltage to the first transfer gate.

17. The method of claim 16 wherein applying the full-read voltage to the first and second transfer gates during the second interval in response to determining that the collective level of accumulated photocharge exceeds the readout threshold further comprises asserting a third transfer-gate pulse that propagates row-wise across the pixel array during the second interval and that effects, in combination with the second transfer-gate control pulse, application of the full-read voltage to the second transfer gate.

* * * * *